US011869917B2

(12) United States Patent
Webster et al.

(10) Patent No.: US 11,869,917 B2
(45) Date of Patent: Jan. 9, 2024

(54) INTEGRATED SENSOR FOR LIFETIME CHARACTERIZATION

(71) Applicant: Quantum-Si Incorporated, Branford, CT (US)

(72) Inventors: Eric A. G. Webster, Santa Clara, CA (US); Changhoon Choi, Palo Alto, CA (US); Dajiang Yang, San Jose, CA (US); Xin Wang, San Jose, CA (US); Todd Rearick, Cheshire, CT (US); Kyle Preston, Guilford, CT (US); Ali Kabiri, Guilford, CT (US); Gerard Schmid, Guilford, CT (US)

(73) Assignee: Quantum-Si Incorporated, Branford, CT (US)

( * ) Notice: Subject to any disclaimer, the term of this patent is extended or adjusted under 35 U.S.C. 154(b) by 0 days.

(21) Appl. No.: 17/149,574

(22) Filed: Jan. 14, 2021

(65) Prior Publication Data
US 2021/0217800 A1    Jul. 15, 2021

Related U.S. Application Data

(60) Provisional application No. 62/961,133, filed on Jan. 14, 2020.

(51) Int. Cl.
*H01L 27/146*    (2006.01)

(52) U.S. Cl.
CPC .. *H01L 27/14643* (2013.01); *H01L 27/14683* (2013.01)

(58) Field of Classification Search
CPC ......... H01L 27/14683; H01L 27/14616; H01L 27/14603
See application file for complete search history.

(56) References Cited

U.S. PATENT DOCUMENTS

| 5,961,924 A | 10/1999 | Reichert et al. |
| 6,686,582 B1 | 2/2004 | Volcker et al. |

(Continued)

FOREIGN PATENT DOCUMENTS

| EP | 2182523 A1 | 5/2010 |
| EP | 2487897 A1 | 8/2012 |

(Continued)

OTHER PUBLICATIONS

Extended European Search Report for European Application No. 18202357.2 dated Mar. 15, 2019.

(Continued)

*Primary Examiner* — Thanh Luu
(74) *Attorney, Agent, or Firm* — Wolf, Greenfield & Sacks, P.C.

(57) ABSTRACT

Aspects of the technology described herein relate to improved semiconductor-based image sensor designs. In some embodiments, an integrated circuit may comprise a photodetection region and a drain region electrically coupled to the photodetection region, and the photodetection region may be configured to induce an intrinsic electric field in a direction from the photodetection region to the drain region(s). In some embodiments, a charge storage region and the drain region may be positioned on a same side of the photodetection region. In some embodiments, at least one drain layer may be configured to receive incident photons and/or charge carriers via the photodetection region. In some embodiments, an integrated circuit may comprise a plurality of pixels and a control circuit configured to control a transfer of charge carriers in the plurality of pixels.

28 Claims, 34 Drawing Sheets

(56) References Cited

U.S. PATENT DOCUMENTS

| | | | |
|---|---|---|---|
| 6,787,308 B2 | 9/2004 | Balasubramanian et al. | |
| 6,844,585 B1 * | 1/2005 | Hopper | H01L 21/2652 257/317 |
| 6,917,726 B2 | 7/2005 | Levene et al. | |
| 7,175,811 B2 | 2/2007 | Bach et al. | |
| 7,426,322 B2 | 9/2008 | Hyde | |
| 7,738,086 B2 | 6/2010 | Shepard et al. | |
| 7,820,983 B2 | 10/2010 | Lundquist et al. | |
| 7,834,329 B2 | 11/2010 | Lundquist et al. | |
| 7,838,847 B2 | 11/2010 | Lundquist et al. | |
| 8,053,742 B2 | 11/2011 | Lundquist et al. | |
| 8,207,509 B2 | 6/2012 | Lundquist et al. | |
| 8,274,040 B2 | 9/2012 | Zhong et al. | |
| 8,278,728 B2 | 10/2012 | Murshid | |
| 8,465,699 B2 | 6/2013 | Fehr et al. | |
| 8,471,219 B2 | 6/2013 | Lundquist et al. | |
| 8,471,230 B2 | 6/2013 | Zhong et al. | |
| 8,502,169 B2 | 8/2013 | Rigneault et al. | |
| 8,618,507 B1 | 12/2013 | Lundquist et al. | |
| 9,029,802 B2 | 5/2015 | Lundquist et al. | |
| 9,157,864 B2 | 10/2015 | Fehr et al. | |
| 9,222,123 B2 | 12/2015 | Zhong et al. | |
| 9,222,133 B2 | 12/2015 | Lundquist et al. | |
| 9,223,084 B2 | 12/2015 | Grot et al. | |
| 9,372,308 B1 | 6/2016 | Saxena et al. | |
| 9,488,584 B2 | 11/2016 | McCaffrey et al. | |
| 9,587,276 B2 | 3/2017 | Lundquist et al. | |
| 9,606,060 B2 | 3/2017 | Chen et al. | |
| 9,658,161 B2 | 5/2017 | Saxena et al. | |
| 9,666,748 B2 | 5/2017 | Leobandung | |
| 9,719,138 B2 | 8/2017 | Zhong et al. | |
| 9,765,395 B2 | 9/2017 | Goldsmith | |
| 9,946,017 B2 | 4/2018 | Saxena et al. | |
| 10,018,764 B2 | 7/2018 | Grot et al. | |
| 10,090,429 B2 | 10/2018 | Leobandung | |
| 10,138,515 B2 | 11/2018 | Fehr et al. | |
| 10,280,457 B2 | 5/2019 | Zhong et al. | |
| 10,310,178 B2 | 6/2019 | Saxena et al. | |
| 10,487,356 B2 | 11/2019 | Lundquist et al. | |
| 10,578,788 B2 | 3/2020 | Grot et al. | |
| 10,655,172 B2 | 5/2020 | Rank et al. | |
| 10,724,090 B2 | 7/2020 | McCaffrey et al. | |
| 2002/0182716 A1 | 12/2002 | Weisbuch et al. | |
| 2003/0174992 A1 | 9/2003 | Levene et al. | |
| 2004/0169842 A1 | 9/2004 | Dosluoglu et al. | |
| 2010/0065726 A1 | 3/2010 | Zhong et al. | |
| 2011/0187908 A1 * | 8/2011 | Kawahito | H01L 27/14641 250/214 R |
| 2011/0204467 A1 | 8/2011 | Ohchi et al. | |
| 2011/0298079 A1 | 12/2011 | Kawahito | |
| 2012/0273653 A1 | 11/2012 | Hynecek et al. | |
| 2013/0070131 A1 | 3/2013 | Ohkubo et al. | |
| 2013/0116153 A1 | 5/2013 | Bowen et al. | |
| 2014/0077283 A1 | 3/2014 | Lenchenkov | |
| 2014/0252437 A1 * | 9/2014 | Oh | H01L 27/14612 257/292 |
| 2015/0141267 A1 | 5/2015 | Rothberg et al. | |
| 2015/0264287 A1 | 9/2015 | Shimotsusa et al. | |
| 2016/0084761 A1 | 3/2016 | Rothberg et al. | |
| 2016/0133668 A1 | 5/2016 | Rothberg et al. | |
| 2016/0181298 A1 | 6/2016 | Wan et al. | |
| 2016/0344156 A1 | 11/2016 | Rothberg et al. | |
| 2017/0146479 A1 | 5/2017 | Levine et al. | |
| 2017/0261738 A1 | 9/2017 | Shiono | |
| 2017/0276686 A1 | 9/2017 | Marcotte et al. | |
| 2018/0172906 A1 | 6/2018 | Rothberg et al. | |
| 2018/0173000 A1 * | 6/2018 | Rothberg | G02B 27/0944 |
| 2018/0175582 A1 | 6/2018 | Rothberg et al. | |
| 2018/0180546 A1 | 6/2018 | Rothberg et al. | |
| 2019/0025214 A1 | 1/2019 | Rothberg et al. | |
| 2019/0025511 A1 | 1/2019 | Rothberg et al. | |
| 2019/0292590 A1 | 9/2019 | Zhong et al. | |
| 2019/0360042 A1 | 11/2019 | Fehr et al. | |
| 2019/0391010 A1 | 12/2019 | Thurston et al. | |
| 2020/0072752 A1 | 3/2020 | Cipriany | |
| 2020/0408690 A1 | 12/2020 | Yang et al. | |
| 2023/0223419 A1 | 7/2023 | Schmid et al. | |

FOREIGN PATENT DOCUMENTS

| | | |
|---|---|---|
| EP | 3483938 A1 | 5/2019 |
| WO | WO 2010/025331 A1 | 3/2010 |
| WO | WO 2011/103507 A1 | 8/2011 |
| WO | WO 2011/153962 A1 | 12/2011 |
| WO | WO 2016/022998 A2 | 2/2016 |
| WO | WO 2016/128198 A1 | 8/2016 |
| WO | WO 2016/187580 A1 | 11/2016 |
| WO | WO 2017/210413 A1 | 12/2017 |

OTHER PUBLICATIONS

Invitation to Pay Additional Fees for International Application No. PCT/US2015/044360 mailed Nov. 20, 2015.

International Search Report and Written Opinion for International Application No. PCT/US2015/044360 dated Feb. 3, 2016.

International Search Report and Written Opinion for International Application No. PCT/US2017/068089 dated Mar. 27, 2018.

International Search Report and Written Opinion for International Application No. PCT/US2019/038105 dated Nov. 26, 2019.

Invitation to Pay Additional Fees for International Application No. PCT/US2019/048824 mailed Dec. 9, 2019.

International Search Report and Written Opinion for International Application No. PCT/US2019/048824 dated Jan. 31, 2020.

Invitation to Pay Additional Fees for International Application No. PCT/US2019/038105 mailed Sep. 16, 2019.

Invitation to Pay Additional Fees for International Application No. PCT/US2020/039868 mailed Oct. 22, 2020.

International Search Report and Written Opinion for International Application No. PCT/US2020/039868 dated Dec. 15, 2020.

International Search Report and Written Opinion for International Application No. PCT/US2021/013501 dated Apr. 14, 2021.

Hale, Fibre Optic Sensors using Adiabatically Tapered Single Mode Fibres. Dissertation submitted to the University of Cambridge. Feb. 1994. 209 pages.

Mogensen et al., A Microfluidic Device with an Integrated Waveguide Beam Splitter for Velocity Measurements of Flowing Particles by Fourier Transformation. Analytical Chemistry. Sep. 15, 2003;75(18):4931-4936.

Swaminathan et al. A theoretical justification for single molecule peptide sequencing. PLoS Comput Biol. Feb. 25, 2015;11(2):e1004080. 17 pages.

Taitt et al., Evanescent wave fluorescence biosensors. Biosens Bioelectron. Jun. 2005;20(12):2470-87. Epub Dec. 8, 2004.

Yao et al., Single-molecule protein sequencing through fingerprinting: computational assessment. Physical biology. Aug. 11, 2015;12(5):055003. 7 pages.

Invitation to Pay Additional Fees for International Application No. PCT/US2023/010577 dated Apr. 3, 2023.

International Preliminary Report on Patentability for International Application No. PCT/US2021/013501 dated Jul. 28, 2022.

International Search Report and Written Opinion for International Application No. PCT/US2023/010577 dated Jun. 27, 2023.

* cited by examiner

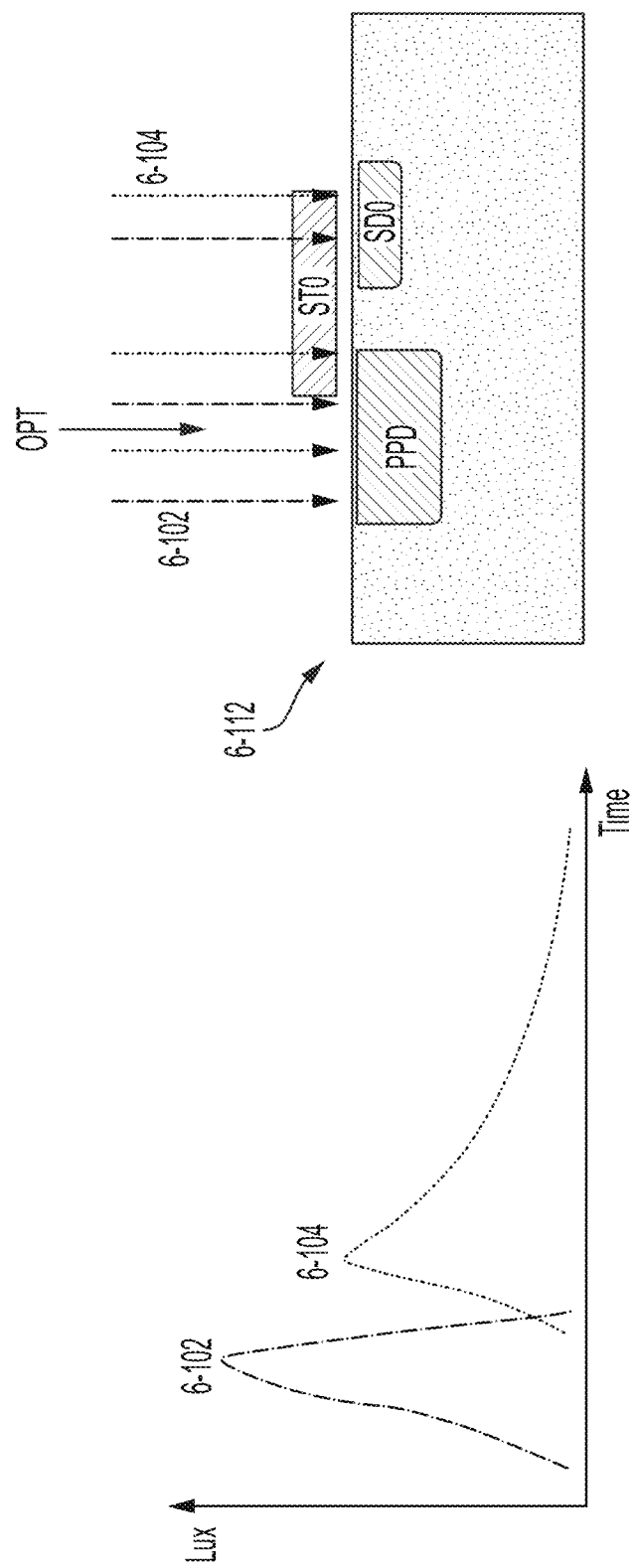

INTEGRATED SENSOR FOR LIFETIME CHARACTERIZATION

RELATED APPLICATIONS

This application claims priority under 35 U.S.C. § 119(e) to U.S. Provisional Application Ser. No. 62/961,133, filed Jan. 14, 2020, and titled, "INTEGRATED SENSOR FOR LIFETIME CHARACTERIZATION," which is herein incorporated by reference in its entirety.

FIELD OF THE DISCLOSURE

The present disclosure relates to integrated devices and related instruments that can perform massively-parallel analyses of samples by providing short optical pulses to tens of thousands of sample wells or more simultaneously and receiving fluorescent signals from the sample wells for sample analyses. The instruments may be useful for point-of-care genetic sequencing and for personalized medicine.

BACKGROUND

Photodetectors are used to detect light in a variety of applications. Integrated photodetectors have been developed that produce an electrical signal indicative of the intensity of incident light. Integrated photodetectors for imaging applications include an array of pixels to detect the intensity of light received from across a scene. Examples of integrated photodetectors include charge coupled devices (CCDs) and Complementary Metal Oxide Semiconductor (CMOS) image sensors.

Instruments that are capable of massively-parallel analyses of biological or chemical samples are typically limited to laboratory settings because of several factors that can include their large size, lack of portability, requirement of a skilled technician to operate the instrument, power need, need for a controlled operating environment, and cost. When a sample is to be analyzed using such equipment, a common paradigm is to extract a sample at a point of care or in the field, send the sample to the lab and wait for results of the analysis. The wait time for results can range from hours to days.

SUMMARY OF THE DISCLOSURE

Some aspects of the present disclosure relate to an integrated circuit comprising a photodetection region and a drain region electrically coupled to the photodetection region, wherein the photodetection region is configured to induce an intrinsic electric field in a direction from the photodetection region to the one or more drain regions.

Some aspects of the present disclosure relate to an integrated circuit comprising a photodetection region, a charge storage region electrically coupled to the photodetection region, and a drain region electrically coupled to the photodetection region, wherein the charge storage region and the drain region are positioned on a same side of the photodetection region.

Some aspects of the present disclosure relate to an integrated circuit comprising a first pixel comprising a first photodetection region configured to induce an electric field in a first direction and a second pixel comprising a second photodetection region configured to induce an electric field in a second direction opposite the first direction, wherein the first and second pixels are positioned one after another in one of the first and second directions.

Some aspects of the present disclosure relate to an integrated circuit comprising a photodetection region and at least one drain layer configured to receive incident photons and/or charge carriers via the photodetection region.

Some aspects of the present disclosure relate to an integrated circuit comprising a plurality of pixels, each pixel of the plurality of pixels comprising a photodetection region and a charge storage region, and a control circuit configured to control a transfer of charge carriers from the photodetection region to the charge storage region of each of the plurality of pixels.

Some aspects of the present disclosure relate to an integrated circuit comprising a photodetection region configured to receive incident light in a first direction and a surface positioned, in the first direction, before the photodetection region and configured to direct the incident photons towards the photodetection region.

The foregoing summary is not intended to be limiting. In addition, various embodiments may include any aspects of the disclosure either alone or in combination.

BRIEF DESCRIPTION OF DRAWINGS

FIG. 1-2 is a schematic of a pixel of the integrated device of FIG. 1-1, according to some embodiments.

FIG. 1-3 is a circuit diagram of an exemplary pixel that may be included in the integrated device of FIG. 1-1, according to some embodiments.

FIG. 1-4 is a diagram illustrating charge transfer in the pixel of FIG. 1-3, according to some embodiments.

FIG. 1-5A is a plan view of an exemplary pixel that may be included in the integrated device of FIG. 1-1, the pixel having multiple charge storage regions, according to some embodiments.

FIG. 1-5B is a circuit diagram of the pixel of FIG. 1-5A, according to some embodiments.

FIG. 1-6 is a diagram illustrating charge transfer in the pixel of FIGS. 1-5A and 1-5B, according to some embodiments.

FIG. 2-1 is a top view of an exemplary pixel that may be included in the integrated device of FIG. 1-1, the pixel having a photodetection region configured to induce an intrinsic electric field, according to some embodiments.

FIG. 2-2 is a computer-aided design (CAD) drawing of an exemplary row of pixels that may be included in the integrated device of FIG. 1-1, each pixel having a photodetection region configured to induce an intrinsic electric field, according to some embodiments.

FIG. 2-3 is a CAD drawing of two exemplary adjacent rows of pixels that may be included in the integrated device of FIG. 1-1, each pixel having a photodetection region configured to induce an intrinsic electric field, according to some embodiments.

FIG. 2-4 is a side view of a portion of an exemplary pixel that may be included in the integrated device of FIG. 1-1, the pixel having a via wall, according to some embodiments.

FIG. 3-1A is a side view of an exemplary pixel comprising a collection region, according to some embodiments.

FIG. 3-1B is a graph illustrating electrostatic potential vs. depth in the pixel of FIG. 3-1A, according to some embodiments.

FIG. 3-2 is a side view of an exemplary pixel having one or more drain layers, and one or more barriers, according to some embodiments.

FIG. 3-3 is a side view of an alternative exemplary pixel having one or more drain layers and one or more barriers, according to some embodiments.

FIG. 4-1 is a time graph illustrating two square wave control signals that may be configured to drive one or more transfer gates of a pixel of the integrated device of FIG. 1-1, according to some embodiments.

FIG. 4-2A is a time graph illustrating two balanced sinusoidal control signals that may be configured to drive a plurality of transfer gates of a pixel of the integrated device of FIG. 1-1, according to some embodiments.

FIG. 4-2B is a time graph illustrating charge transfer in charge transfer channels of a pixel in response to receiving the control signals of FIG. 4-2A, according to some embodiments.

FIG. 4-3A is a time graph illustrating two balanced Direct Current (DC)-offset sinusoidal control signals that may be configured to drive a plurality of transfer gates of a pixel of the integrated device of FIG. 1-1, according to some embodiments.

FIG. 4-3B is a time graph illustrating charge transfer in charge transfer channels of a pixel in response to receiving the control signals of FIG. 4-3A, according to some embodiments.

FIG. 4-4A is a time graph illustrating three balanced sinusoidal control signals that may be configured to drive a plurality of transfer gates of a pixel of the integrated device of FIG. 1-1, according to some embodiments.

FIG. 4-4B is a time graph illustrating charge transfer in charge transfer channels of a pixel in response to receiving the control signals of FIG. 4-4A, according to some embodiments.

FIG. 4-5A is a time graph illustrating three balanced DC-offset sinusoidal control signals that may be configured to drive a plurality of transfer gates of a pixel of the integrated device of FIG. 1-1, according to some embodiments.

FIG. 4-5B is a time graph illustrating charge transfer in charge transfer channels of a pixel in response to receiving the control signals of FIG. 4-5A, according to some embodiments.

FIG. 4-6A is a time graph illustrating three unbalanced DC-offset sinusoidal control signals that may be configured to drive a plurality of transfer gates of a pixel of the integrated device of FIG. 1-1, according to some embodiments.

FIG. 4-6B is a time graph illustrating charge transfer in charge transfer channels of a pixel in response to receiving the control signals of FIG. 4-6A, according to some embodiments.

FIG. 5-1A is a block diagram of an integrated device and an instrument, according to some embodiments.

FIG. 5-1B is a schematic of an apparatus including an integrated device, according to some embodiments.

FIG. 5-1C is a block diagram depiction of an analytical instrument that includes a compact mode-locked laser module, according to some embodiments.

FIG. 5-1D depicts a compact mode-locked laser module incorporated into an analytical instrument, according to some embodiments.

FIG. 5-2 depicts a train of optical pulses, according to some embodiments.

FIG. 5-3 depicts an example of parallel reaction chambers that can be excited optically by a pulsed laser via one or more waveguides according to some embodiments.

FIG. 5-4 illustrates optical excitation of a reaction chamber from a waveguide, according to some embodiments.

FIG. 5-5 depicts further details of an integrated reaction chamber, optical waveguide, and time-binning photodetector, according to some embodiments.

FIG. 5-6 depicts an example of a biological reaction that can occur within a reaction chamber, according to some embodiments.

FIG. 5-7 depicts emission probability curves for two different fluorophores having different decay characteristics according to some embodiments.

FIG. 5-8 depicts time-binning detection of fluorescent emission, according to some embodiments.

FIG. 5-9 depicts a time-binning photodetector, according to some embodiments.

FIG. 5-10A depicts pulsed excitation and time-binned detection of fluorescent emission from a sample, according to some embodiments.

FIG. 5-10B depicts a histogram of accumulated fluorescent photon counts in various time bins after repeated pulsed excitation of a sample, according to some embodiments.

FIG. 5-11A depicts a histogram corresponding to a T nucleotide or nucleotide analog, according to some embodiments.

FIG. 5-11B depicts a histogram corresponding to an A nucleotide or nucleotide analog, according to some embodiments.

FIG. 5-11C depicts a histogram corresponding to a C nucleotide or nucleotide analog, according to some embodiments.

FIG. 5-11D depicts a histogram corresponding to a G nucleotide or nucleotide analog, according to some embodiments.

FIG. 5-12 is a flow diagram illustrating a method of sequencing a labeled polypeptide by Edman degradation according to some embodiments.

FIG. 5-13 includes a flow diagram illustrating a method of sequencing in which discrete binding events give rise to signal pulses of a signal output, and a graph illustrating the signal output according to some embodiments.

FIG. 6-1A is a time graph of excitation and fluorescence light received at the integrated device 1-102 following an excitation pulse, according to some embodiments.

FIG. 6-1B is a side view of an exemplary pixel receiving the excitation and fluorescence light of FIG. 6-1A, according to some embodiments.

FIG. 6-2A is a side view of an exemplary pixel having a metal barrier receiving the excitation and fluorescence light of FIG. 6-1A, according to some embodiments.

FIG. 6-2B is a side view of the pixel of FIG. 6-2A showing charge carrier generation in the pixel, according to some embodiments.

FIG. 6-3 is a side view of an exemplary pixel having dielectric barriers configured to refract incident light, according to some embodiments.

FIG. 6-4 is a side view of an exemplary pixel having metal barriers configured to reflect incident light, according to some embodiments.

FIG. 6-5 is a side view of an exemplary pixel having an optically-directive structure at a surface of the pixel, according to some embodiments.

Figure 1:
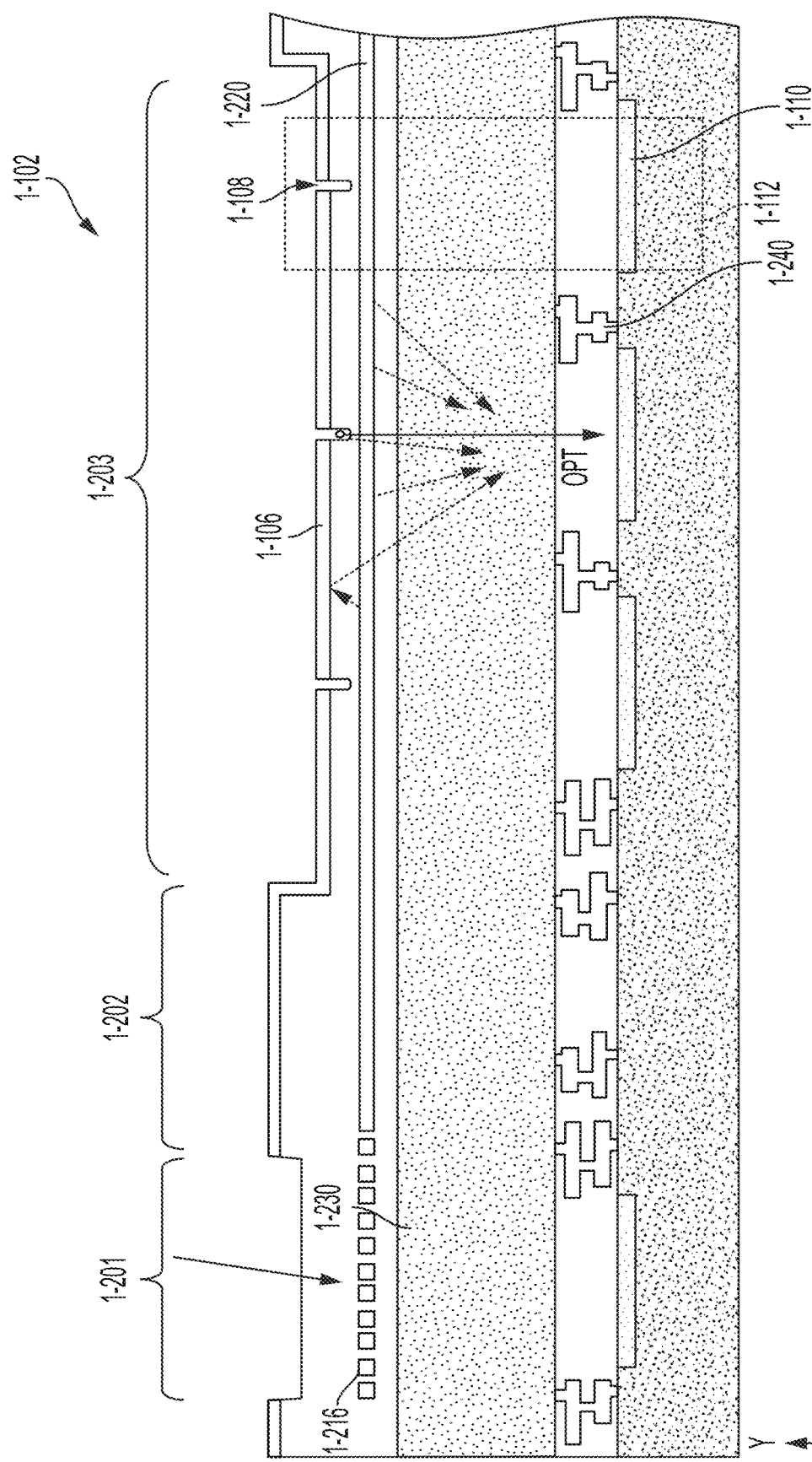
FIG. 1-1 is a schematic of an integrated device, according to some embodiments.

The features and advantages of the present invention will become more apparent from the detailed description set forth below when taken in conjunction with the drawings. When describing embodiments in reference to the drawings, directional references ("above," "below," "top," "bottom," "left," "right," "horizontal," "vertical," etc.) may be used. Such references are intended merely as an aid to the reader viewing the drawings in a normal orientation. These direc-

DETAILED DESCRIPTION

I. Introduction

Aspects of the present disclosure relate to integrated devices, instruments and related systems capable of analyzing samples in parallel, including identification of single molecules and nucleic acid sequencing. Such an instrument may be compact, easy to carry, and easy to operate, allowing a physician or other provider to readily use the instrument and transport the instrument to a desired location where care may be needed. Analysis of a sample may include labeling the sample with one or more fluorescent markers, which may be used to detect the sample and/or identify single molecules of the sample (e.g., individual nucleotide identification as part of nucleic acid sequencing). A fluorescent marker may become excited in response to illuminating the fluorescent marker with excitation light (e.g., light having a characteristic wavelength that may excite the fluorescent marker to an excited state) and, if the fluorescent marker becomes excited, emit emission light (e.g., light having a characteristic wavelength emitted by the fluorescent marker by returning to a ground state from an excited state). Detection of the emission light may allow for identification of the fluorescent marker, and thus, the sample or a molecule of the sample labeled by the fluorescent marker. According to some embodiments, the instrument may be capable of massively-parallel sample analyses and may be configured to handle tens of thousands of samples or more simultaneously.

The inventors have recognized and appreciated that an integrated device having sample wells configured to receive the sample and integrated optics formed on the integrated device and an instrument configured to interface with the integrated device may be used to achieve analysis of this number of samples. The instrument may include one or more excitation light sources, and the integrated device may interface with the instrument such that the excitation light is delivered to the sample wells using integrated optical components (e.g., waveguides, optical couplers, optical splitters) formed on the integrated device. The optical components may improve the uniformity of illumination across the sample wells of the integrated device and may reduce a large number of external optical components that might otherwise be needed. Furthermore, the inventors have recognized and appreciated that integrating photodetection regions (e.g., photodiodes) on the integrated device may improve detection efficiency of fluorescent emissions from the sample wells and reduce the number of light-collection components that might otherwise be needed.

In some embodiments, the integrated device may be configured to receive fluorescent emission photons from the sample wells and generate and transmit charge carriers to one or more charge storage regions in response to receiving the fluorescent emission photons. For example, a photodetection region may be positioned on the integrated device and configured to receive the fluorescent emission charge carriers along an optical axis, and the photodetection region also may be coupled to one or more charge storage regions (e.g., storage diodes) along an electrical axis, such that the charge storage region(s) may collect charge carriers generated in the photodetection region in response to the fluorescent emission charge carriers. In some embodiments, during a collection period, the charge storage region(s) may receive the charge carriers from the photodetection region, and during a separate readout period, the charge storage region(s) may provide the stored charge carriers to a readout circuit for processing. In some embodiments, during a drain period (e.g., preceding the collection period), a drain region of the integrated device may receive noise charge carriers (e.g., excitation charge carriers generated responsive to incident excitation photons) from the photodetection region for discarding.

Challenges arise in collecting fluorescent emission charge carriers in the charge storage regions due to the relatively small quantity of fluorescent emission charge carriers compared to excitation charge carriers that may reach the integrated device, as well as due to the close proximity of adjacent photodetectors on the integrated device. For instance, excitation photons from the excitation source may reach the photodetectors and generate noise charge carriers that would be indistinguishable from fluorescent emission charge carriers if they were to reach the charge storage regions. Thus, excitation photons can add noise to detected fluorescent emissions in the photodetectors. Alternatively or additionally, fluorescent emission charge carriers can take too long to reach the charge storage regions, reach the wrong charge storage region in a pixel having multiple charge storage regions, and/or reach charge storage regions in adjacent pixels, thereby adding noise to detected fluorescent emissions. Moreover, for large arrays of pixels, complex schemes for controlling synchronized charge carrier collection and/or draining become difficult to implement due to the difficulties in distributing signals to all of the pixels in the array without distorting the signals and causing the pixels to operate out of sync with one another.

To solve the above problems, the inventors have developed techniques to reduce or eliminate the impact of noise photons and/or charge carriers in the pixels. For instance, in some embodiments, a pixel described herein may include a photodetection region configured to induce an intrinsic electric field in the photodetection region. For instance, the photodetection region may have a doping configuration that generates a potential gradient in the photodetection region, such as due to doping the photodetection region with a triangular doping pattern. For example, the potential gradient may increase the transport rate of charge carriers from the photodetection region to a charge storage region and/or drain region of the pixel. By increasing the rate of transport, greater numbers of excitation charge carriers may be drained and/or greater numbers of fluorescence charge carriers may be accumulated during operation of the pixel, thus resulting in an increased rejection ratio of collected fluorescence charge carriers to excitation charge carriers. Moreover, the potential gradient may be intrinsic to the pixel in that the potential gradient is present even in the absence of any external electric field being applied to the integrated device. In some embodiments, a pixel may include a charge storage region and a drain region positioned on a same side of the photodetection region, which may likewise increase the transport rate of charge carriers in the pixel. For example, the photodetection region may be configured to induce an intrinsic electric field in the direction from the photodetection region to the charge storage region and the drain region. Alternatively or additionally, a row of pixels in an array may be configured to generate intrinsic electric fields oriented opposite the intrinsic electric fields generated in another row of pixels of the array (e.g., an adjacent row), which may further improve performance of the array such as by preventing at least some charge carriers from traveling between pixels of the multiple rows.

In some embodiments, a pixel described herein may include at least one drain layer disposed at least in part below a photodetection region of the pixel to collect charge carriers generated in the photodetection region. For instance, the drain layer(s) may be configured to collect noise charge carriers, such as charge carriers generated in response to excitation and/or fluorescence light that travels beyond a depth of the photodetection region, to prevent the noise charge carriers from reaching a charge storage region of the pixel. As a result, including the drain layer(s) may increase the rejection ratio of the pixel.

In some embodiments, a pixel described herein may include one or more optically-directive structures configured to direct incident photons towards a photodetection region of the pixel. For example, the optically-directive structure may include one or more dielectric and/or metal barriers configured to reflect and/or refract the incident photons towards the photodetection region and/or away from charge storage regions of the pixel. Alternatively or additionally, the optically directive structure may include a surface of a substrate of the pixel having openings configured to reflect and/or refract the incident photons towards the photodetection region. For instance, the openings may include a dielectric and/or otherwise reflective and/or refractive material. As a result of including the optically-directive structure(s), more of the incident photons may reach the photodetection region, and charge carriers generated responsive to receiving the incident photons may be appropriately drained or accumulated, resulting in an increased rejection ratio of the pixel.

The inventors also developed techniques useful for controlling pixels of a large array having enhanced flexibility. In some embodiments, a pixel described herein may include at least one charge storage region configured to receive charge carriers from a photodetection region of the pixel according to one or more control signals from a control circuit. For example, the one or more control signals may include square wave control signals and/or sinusoidal control signals. In some embodiments, voltage amplitudes, DC offsets, relative phases and/or duty cycles, and/or other characteristics of the control signals may be configured to set timings and/or durations of charge carrier accumulation and/or draining in the pixel(s). In some embodiments, control signals provided to a pixel may be balanced, such that the control signals sum to a constant voltage value over time, which can reduce skew in the control signals as they are delivered to the pixel. For instance, providing balanced control signals to pixels can reduce the amount of ground current returning from the pixel to the control circuit that provided the control signals, thereby allowing the metal lines of the pixel configured to carry the ground current to be made narrower without the resistance of the narrower metal lines increasing the propagation delay of the metal lines.

It should be appreciated that integrated devices described herein may incorporate any or all techniques described herein alone or in combination.

II. Exemplary Integrated Device Overview

A cross-sectional schematic of integrated device 1-102 illustrating a row of pixels 1-112 is shown in FIG. 1-1. Integrated device 1-102 may include coupling region 1-201, routing region 1-202, and pixel region 1-203. Pixel region 1-203 may include a plurality of pixels 1-112 having sample wells 1-108 positioned on a surface at a location separate from coupling region 1-201, which is where excitation light (shown as the dashed arrow) couples to integrated device 1-102. Sample wells 1-108 may be formed through metal layer(s) 1-106. One pixel 1-112, illustrated by the dotted rectangle, is a region of integrated device 1-102 that includes a sample well 1-108 and one or more photodetectors 1-110 associated with the sample well 1-108. In some embodiments, each photodetector 1-110 may include a photodetection region and one or more charge storage regions configured to receive charge carriers generated in the photodetection region in response to incident light from the sample well 1-108.

FIG. 1-1 illustrates the path of excitation light by coupling a beam of excitation light to coupling region 1-201 and to sample wells 1-108. The row of sample wells 1-108 shown in FIG. 1-1 may be positioned to optically couple with waveguide 1-220. Excitation light may illuminate a sample located within a sample well. The sample may reach an excited state in response to being illuminated by the excitation light. When a sample is in an excited state, the sample may emit emission light, which may be detected by one or more photodetectors associated with the sample well. FIG. 1-1 schematically illustrates an optical axis of emission light OPT from a sample well 1-108 to photodetector(s) 1-110 of pixel 1-112. The photodetector(s) 1-110 of pixel 1-112 may be configured and positioned to detect emission light from sample well 1-108. Examples of suitable photodetectors are described in U.S. patent application Ser. No. 14/821,656 titled "INTEGRATED DEVICE FOR TEMPORAL BINNING OF RECEIVED PHOTONS," which is incorporated herein by reference in its entirety. Alternative or additional examples of photodetectors are described further herein. For an individual pixel 1-112, a sample well 1-108 and its respective photodetector(s) 1-110 may be aligned along the optical axis OPT. In this manner, the photodetector(s) may overlap with the sample well within a pixel 1-112.

The directionality of the emission light from a sample well 1-108 may depend on the positioning of the sample in the sample well 1-108 relative to metal layer(s) 1-106 because metal layer(s) 1-106 may act to reflect emission light. In this manner, a distance between metal layer(s) 1-106 and a fluorescent marker on a sample positioned in a sample well 1-108 may impact the efficiency of photodetector(s) 1-110, that are in the same pixel as the sample well, to detect the light emitted by the fluorescent marker. The distance between metal layer(s) 1-106 and the bottom surface of a sample well 1-106, which is proximate to where a sample may be positioned during operation, may be in the range of 100 nm to 500 nm, or any value or range of values in that range. In some embodiments the distance between metal layer(s) 1-106 and the bottom surface of a sample well 1-106 is approximately 300 nm, but other distances may be used, as embodiments described herein are not so limited.

The distance between the sample and the photodetector(s) may also impact efficiency in detecting emission light. By decreasing the distance light has to travel between the sample and the photodetector(s), detection efficiency of emission light may be improved. In addition, smaller distances between the sample and the photodetector(s) may allow for pixels that occupy a smaller area footprint of the integrated device, which can allow for a higher number of pixels to be included in the integrated device. The distance between the bottom surface of a sample well 1-106 and photodetector(s) may be in the range of 5 $\mu$m to 15 $\mu$m, or any value or range of values in that range, in some embodiments, but the invention is not so limited. It should be appreciated that, in some embodiments, emission light may be provided through other means than an excitation light source and a sample well. Accordingly, some embodiments may not include sample well 1-108.

Photonic structure(s) 1-230 may be positioned between sample wells 1-108 and photodetectors 1-110 and configured to reduce or prevent excitation light from reaching photodetectors 1-110, which may otherwise contribute to signal noise in detecting emission light. As shown in FIG. 1-1, the one or more photonic structures 1-230 may be positioned between waveguide 1-220 and photodetectors 1-110. Photonic structure(s) 1-230 may include one or more optical rejection photonic structures including a spectral filter, a polarization filter, and a spatial filter. Photonic structure(s) 1-230 may be positioned to align with individual sample wells 1-108 and their respective photodetector(s) 1-110 along a common axis. Metal layers 1-240, which may be configured to route control signals and/or readout signals to and/or from portions of integrated device 1-102 as described further herein, may also act as a spatial filter, or polarization filter, in accordance with some embodiments. In such embodiments, one or more metal layers 1-240 may be positioned to block some or all excitation light from reaching photodetector(s) 1-110.

Coupling region 1-201 may include one or more optical components configured to couple excitation light from an external or internal excitation source. Coupling region 1-201 may include grating coupler 1-216 positioned to receive some or all of a beam of excitation light. Examples of suitable grating couplers are described in U.S. Pat. Application 62/435,693 titled "OPTICAL COUPLER AND WAVEGUIDE SYSTEM," which is incorporated herein by reference in its entirety. Grating coupler 1-216 may couple excitation light to waveguide 1-220, which may be configured to propagate excitation light to the proximity of one or more sample wells 1-108. Alternatively, coupling region 1-201 may comprise other well-known structures for coupling light into a waveguide, or directly into the sample wells.

Components located off of or within the integrated device may be used to position and align the excitation source 1-106 to the integrated device. Such components may include optical components including lenses, mirrors, prisms, windows, apertures, attenuators, and/or optical fibers. Additional mechanical components may be included in the instrument (to which the integrated device couples) to allow for control of one or more alignment components. Such mechanical components may include actuators, stepper motors, and/or knobs. Examples of suitable excitation sources and alignment mechanisms are described in U.S. patent application Ser. No. 15/161,088 titled "PULSED LASER AND SYSTEM," which is incorporated herein by reference in its entirety. Another example of a beam-steering module is described in U.S. patent application Ser. No. 15/842,720 titled "COMPACT BEAM SHAPING AND STEERING ASSEMBLY," which is incorporated herein by reference in its entirety.

A sample to be analyzed may be introduced into sample well 1-108 of pixel 1-112. The sample may be a biological sample or any other suitable sample, such as a chemical sample. The sample may include multiple molecules and the sample well may be configured to isolate a single molecule. In some instances, the dimensions of the sample well may act to confine a single molecule within the sample well, allowing measurements to be performed on the single molecule. Excitation light may be delivered into the sample well 1-108, so as to excite the sample or at least one fluorescent marker attached to the sample or otherwise associated with the sample while it is within an illumination area within the sample well 1-108.

In operation, parallel analyses of samples within the sample wells are carried out by exciting some or all of the samples within the wells using excitation light and detecting signals from sample fluorescent emissions using the photodetectors. Fluorescent emission light from a sample may reach one or more corresponding photodetectors and generate charge carriers therein, which can be collected in charge storage regions and read out from the photodetector(s) as at least one electrical signal. The electrical signals may be transmitted along metal lines (e.g., of metal layers 1-240) of the integrated device, which may be connected to an instrument interfaced with the integrated device. The electrical signals may be subsequently processed and/or analyzed. Processing or analyzing of electrical signals may occur on a suitable computing device either located on or off the instrument.

Figures 1, 2:
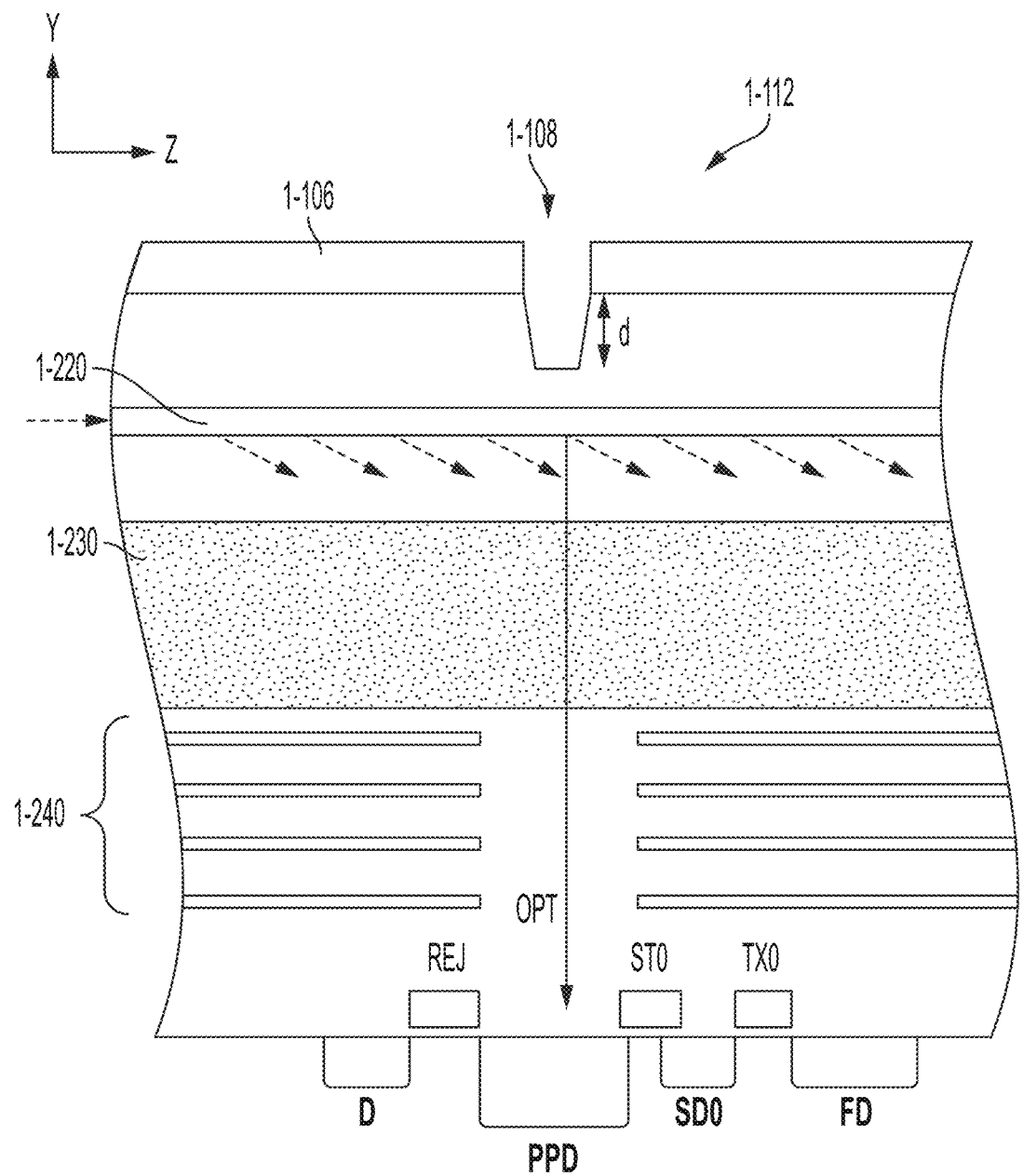

FIG. 1-2 illustrates a cross-sectional view of a pixel 1-112 of integrated device 1-102. Pixel 1-112 includes a photodetection region, which may be a pinned photodiode (PPD), a charge storage region, which may be a storage diode (SD0), a readout region, which may be a floating diffusion (FD) region, a drain region D, and transfer gates REJ, ST0, and TX0. In some embodiments, photodetection region PPD, charge storage region SD0, readout region FD, and/or drain region D may be formed in the integrated device 1-102 by doping portions of one or more substrate layers of the integrated device 1-102. For example, the integrated device 1-102 may have a lightly p-doped substrate, and photodetection region PPD, charge storage region SD0, readout region FD, and/or drain region D may be n-doped regions of the substrate. In this example, p-doped regions may be doped using boron and n-doped regions may be doped using phosphorus, although other dopants and configurations are possible. In some embodiments, pixel 1-112 may have an area smaller than or equal to 10 microns by 10 microns, such as smaller than or equal to 7.5 microns×5 microns. It should be appreciated that, in some embodiments, the substrate may be lightly n-doped and photodetection region PPD, charge storage region SD0, readout region FD, and/or drain region D may be p-doped, as embodiments described herein are not so limited.

In some embodiments, photodetection region PPD may be configured to generate charge carriers in response to incident light. For instance, during operation of pixel 1-112, excitation light may illuminate sample well 1-108 causing incident photons, including fluorescent emissions from a sample, to flow along the optical axis OPT to photodetection region PPD, which may be configured to generate fluorescent emission charge carriers in response to the incident photons from sample well 1-108. In some embodiments, the integrated device 1-102 may be configured to transfer the charge carriers to drain region D or to charge storage region SD0. For example, during a drain period following a pulse of excitation light, the incident photons reaching photodetection region PPD may be predominantly excitation photons to be transferred to drain region D to be discarded. In this example, during a collection period following the drain period, fluorescent emission photons may reach photodetection region PPD to be transferred to charge storage region SD0 for collection. In some embodiments, a drain period and collection period may follow each excitation pulse.

In some embodiments, charge storage region SD0 may be configured to receive charge carriers generated in photodetection region PPD in response to the incident light. For example, charge storage region SD0 may be configured to receive and store charge carriers generated in photodetection region PPD in response to fluorescent emission photons from the sample well 1-108. In some embodiments, charge storage region SD0 may be configured to accumulate charge carriers received from photodetection region PPD over the course of multiple collection periods, each preceded by an excitation pulse. In some embodiments, charge storage region SD0 may be electrically coupled to photodetection region PPD by a charge transfer channel. In some embodiments, the charge transfer channel may be formed by doping a region of pixel 1-112 between photodetection region PPD and charge storage region SD0 with a same conductivity type as photodetection region PPD and charge storage region SD0 such that the charge transfer channel is configured to be conductive when at least a threshold voltage is applied to the charge transfer channel and nonconductive when a voltage less than (or greater than, for some embodiments) the threshold voltage is applied to the charge transfer channel. In some embodiments, the threshold voltage may be a voltage above (or below) which the charge transfer channel is depleted of charge carriers, such that charge carriers from photodetection region PPD may travel through the charge transfer channel to charge storage region SD0. For example, the threshold voltage may be determined based on the materials, dimensions, and/or doping configuration of the charge transfer channel.

In some embodiments, transfer gate ST0 may be configured to control a transfer of charge carriers from photodetection region PPD to charge storage region SD0. For instance, transfer gate ST0 may be configured to receive a control signal and responsively determine a conductivity of a charge transfer channel electrically coupling photodetection region PPD to charge storage region SD0. For example, when a first portion of a control signal is received at transfer gate ST0, transfer gate ST0 may be configured to bias the charge transfer channel to cause the charge transfer channel to be nonconductive, such that charge carriers are blocked from reaching charge storage region SD0. Alternatively, when a second portion of the control signal is received at transfer gate ST0, transfer gate ST0 may be configured to bias to the charge transfer channel to cause the charge transfer channel to be conductive, such that charge carriers may flow from photodetection region PPD to charge storage region SD0 via the charge transfer channel. In some embodiments, transfer gate ST0 may be formed of an electrically conductive and at least partially opaque material such as polysilicon.

In some embodiments, transfer gate TX0 may be configured to control a transfer of charge carriers from charge storage region SD0 to readout region FD in the manner described for transfer gate ST0 in connection with photodetection region PPD and charge storage region SD0. For example, following a plurality of collection periods during which charge carriers are transferred from photodetection region PPD to charge storage region SD0, charge carriers stored in charge storage region SD0 may be transferred to readout region FD to be read out to other portions of the integrated device 1-102 for processing.

In some embodiments, transfer gate REJ may be configured to control a transfer of charge carriers from photodetection region PPD to drain region D in the manner described for transfer gate ST0 in connection with photodetection region PPD and charge storage region SD0. For example, excitation photons from the excitation light source may reach photodetection region PPD before fluorescent emission photons from the sample well 1-108 reach photodetection region PPD. In some embodiments, the integrated device 1-102 may be configured to control transfer gate REJ to transfer charge carriers generated in photodetection region PPD in response to the excitation photons to drain region D during a drain period following an excitation light pulse and preceding reception of fluorescent emission charge carriers In some embodiments, pixel 1-112 may be electrically coupled to a control circuit of integrated device 1-102 and configured to receive control signals at transfer gates REJ, ST0, and TX0. For example, metal lines of metal layers 1-240 may be configured to carry the control signals to pixels 1-112 of the integrated device 1-102. In some embodiments, a single metal line carrying a control signal may be electrically coupled to a plurality of pixels 1-112, such as an array, subarray, row, and/or column of pixels 1-112. For example, each pixel 1-112 in an array may be configured to receive a control signal from a same metal line and/or net such that the row of pixels 1-112 is configured to drain and/or collect charge carriers from photodetection region PPD at the same time. Alternatively or additionally, each row of pixels 1-112 in the array may be configured to receive different control signals (e.g., row-select signals) during a readout period such that the rows read out charge carriers one row at a time.

Figures 1, 2, 3:
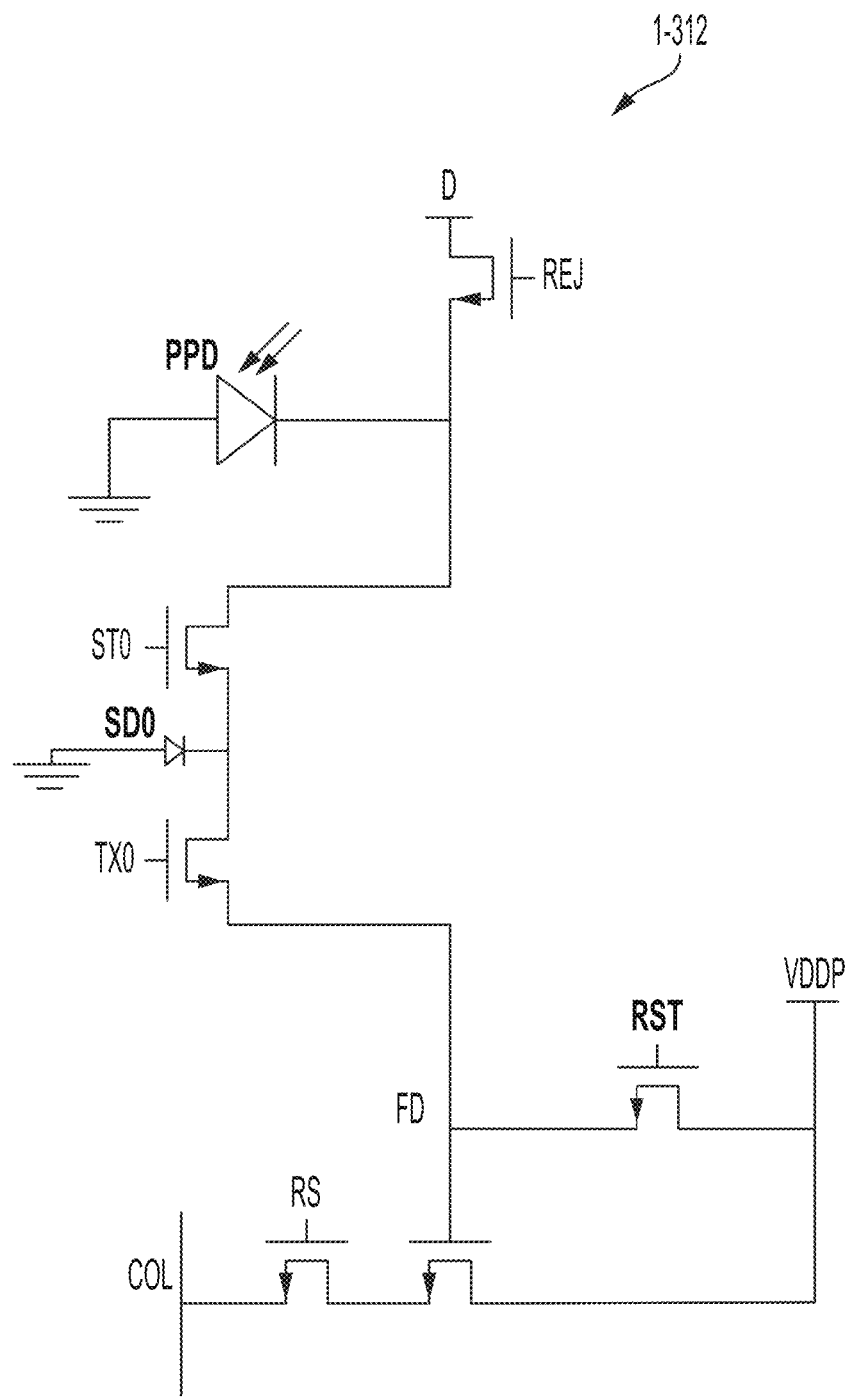

FIG. 1-3 is a circuit diagram of an exemplary pixel 1-312 that may be included in integrated device 1-102, according to some embodiments. In some embodiments, pixel 1-312 may be configured in the manner described for pixel 1-112. For example, as shown in FIG. 1-3, pixel 1-312 includes photodetection region PPD, charge storage region SD0, readout region FD, drain region D, and transfer gates REJ, ST0, and TX0. In FIG. 1-3, transfer gate REJ is the gate of a transistor coupling photodetection region PPD to drain region D, transfer gate ST0 is the gate of a transistor coupling photodetection region PPD to charge storage region SD0, and transfer gate TX0 is the gate of a transistor coupling charge storage region SD0 to readout region FD. Pixel 1-312 also includes a reset (RST) transfer gate and a row-select (RS) transfer gate. In some embodiments, transfer gate RST may be configured to, in response to a reset control signal, clear charge carriers in readout region FD and/or charge storage region SD0. For example, transfer gate RST may be configured to cause charge carriers to flow from readout region FD and/or from charge storage region SD0 via transfer gate TX0 and readout region FD, to a DC supply voltage VDDP. In some embodiments, transfer gate RS may be configured to, in response to a row select control signal, transfer charge carriers from readout region FD to a bitline COL for processing.

While the transistors shown in FIG. 1-3 are field effect transistors (FETs), it should be appreciated that other types of transistors such as bipolar junction transistors (BJTs) may be used.

FIG. 1-4 is a diagram showing exemplary charge transfer in pixel 1-312, according to some embodiments. In some embodiments, operation of pixel 1-312 may include one or more collection sequences. An exemplary collection sequence is shown in FIG. 1-3 including a first collection period 1-1, a first readout period 1-2, a second collection period 1-3, and a second readout period 1-4. In some embodiments, each collection period of the collection sequence may be preceded by a drain period, as described further herein. In some embodiments, operation of pixel 1-312 may include one or multiple iterations of the collection sequence shown in FIG. 1-3. In some embodiments, the collection sequence may be coordinated with the excitation of samples in the sample wells 1-108. For example, a single control circuit may be configured to control the excitation light source and operation of pixels 1-312.

In some embodiments, the first collection period 1-1 may include receiving a first plurality of fluorescent emission photons at photodetection region PPD. For example, first collection period 1-1 may occur in response to a pulse of excitation light that illuminates a sample well 1-108 configured to emit fluorescent emission photons toward photodetection region PPD. As shown in FIG. 1-4, photodetection region PPD may be configured to generate charge carriers Q1 in response to the incident fluorescent emission photons and transfer charge carriers Q1 to charge storage region SD0 during the first collection period 1-1. In some embodiments, excitation photons may reach photodetection region PPD during a drain period immediately following the excitation pulse but before first collection period 1-1, during which charge carriers generated in photodetection region PPD in response to the excitation photons may be transferred to drain region D. In some embodiments, collection period 1-1 may be repeated multiple times in response to multiple respective excitation pulses, and charge carriers $Q_1$ may be accumulated in charge storage region SD0 over the course of the collection periods 1-1. In some such embodiments, each collection period 1-1 may be preceded by a drain period. In some embodiments, the collection periods 1-1 and/or drain periods preceding each collection period 1-1 may occur at the same time for each pixel of an array, subarray, row, and/or column of the integrated device 1-102.

In some embodiments, the first readout period 1-2 may occur following one or more collection periods 1-1 during which charge carriers Q1 are accumulated in charge storage region SD0. As shown in FIG. 1-4, during the first readout period 1-2, charge carriers Q1 stored in charge storage region SD0 may be transferred to readout region FD to be read out for processing. In some embodiments, the readout period 1-2 may be performed using correlated double sampling (CDS) techniques. For example, a first voltage of readout region FD may be read out at a first time, followed by a reset of the readout region FD (e.g., by applying a reset signal to transfer gate RST) and the transfer of charge carriers Q1 from charge storage region SD0 to readout region FD, and a second voltage of readout region FD may be read out at a second time following the transfer of charge carriers Q1. In this example, the difference between the first and second voltages may indicate a quantity of charge carriers Q1 transferred from charge storage region SD0 to readout region FD. In some embodiments, the first readout period 1-2 may occur at a different time for each row, column, and/or pixel of an array. For example, by reading out pixels one row or column at a time, a single processing line may be configured to process readout of each row or column in sequence rather than dedicating a processing line to each pixel to read out simultaneously. In other embodiments, each pixel of an array may be configured to read out at the same time, as a processing line may be provided for each pixel of the array. According to various embodiments, charge carriers read out from the pixels may indicate fluorescence intensity, lifetime, spectral, and/or other such fluorescence information of the samples in the sample wells 1-108.

In some embodiments, the second collection period 1-3 may occur in the manner described for collection period 1-1. For example, following the first readout period 1-2, one or more second collection periods 1-3 may follow one or more respective excitation pulses, such as with a drain period preceding each collection period 1-3. As shown in FIG. 1-4, during the second collection period(s) 1-3, charge carriers Q2 generated in photodetection region PPD may be transferred to charge storage region SD0. In some embodiments, a delay between each excitation pulse and corresponding collection period 1-3 may be different from a delay between each excitation pulse and corresponding collection period 1-1. For example, by collecting charge carriers during a different time period following the excitation pulse during different collection periods, charge carriers read out from the collection periods 1-1 and 1-3 may indicate fluorescence lifetime information of the samples in the sample wells 1-108. In some embodiments, the second collection period(s) 1-3 may be followed by a second readout period 1-4 during which charge carriers accumulated in charge storage region SD0 over the course of the second collection period(s) may be read out in the manner described herein for the first readout period 1-2.

FIG. 1-5A is a plan view of pixel 1-512, which may be included in integrated device 1-102, according to some embodiments. In some embodiments, pixel 1-512 may be configured in the manner described herein for pixels 1-112 and 1-312. For example, in FIG. 1-5A, pixel 1-512 includes photodetection region PPD, charge storage region SD0, readout region FD, and transfer gates ST0, TX0, RST, and RS. In addition, in FIG. 1-5A, pixel 1-512 includes a second charge storage region SD1 and transfer gates ST1 and TX1, which may be configured in the manner described herein for charge storage region SD0 and transfer gates ST0 and TX0, respectively. For example, charge storage regions SD0 and SD1 may be configured to receive charge carriers generated in photodetection region PPD, which may be transferred to readout region FD. In some embodiments, charge storage regions SD0 and SD1 may be configured to receive charge carriers from photodetection region PPD at different times relative to an excitation pulse. In some embodiments, a separate readout region FD may be coupled to each charge storage region. FIG. 1-5B is a circuit diagram of pixel 1-512, according to some embodiments.

FIG. 1-6 is a diagram illustrating exemplary charge transfer in pixel 1-512, according to some embodiments. In some embodiments, operation of pixel 1-512 may include one or multiple iterations of the collection sequence shown in FIG. 1-6, including first collection period 1-1', second collection period 1-2', first readout period 1-3', and second readout period 1-4'.

In some embodiments, one or more first collection periods 1-1' may be performed in the manner described herein including in connection with first collection period 1-1, such as in response to one or more respective excitation pulses and/or having a drain period preceding each collection period 1-1'. As shown in FIG. 1-6, charge carriers Q1' may be generated in photodetection region PPD and transferred to charge storage region SD0. In some embodiments, one or more second collection periods 1-2' may occur following the first collection period(s) 1-1', during which charge carriers Q2' may be generated in photodetection region PPD and transferred to charge storage region SD1. For example, charge carriers Q2' may be transferred to charge storage region SD1 at a different time relative to the respective excitation pulse than charge carriers Q1' during first collection periods 1-1'. It should be appreciated that, in some embodiments, the first and second collection periods 1-1' and 1-2' may occur in response to the same one or more excitation pulses. For example, a common excitation pulse may cause fluorescent emission photons to reach photodetection region PPD over a period of time following the excitation pulse, and the period of time may be divided between a first collection period 1-1' during which charge carriers Q1' are transferred to charge storage region SD0 and a second collection period 1-2' during which charge carriers Q2' are transferred to charge storage region SD1. It should be appreciated that charge carriers Q1' and Q2' may be transferred to either charge storage region SD0 or SD1 and in either order, according to various embodiments.

In some embodiments, first readout period 1-3' may be performed in the manner described herein for first readout period 1-2 including in connection with FIG. 1-4. For example, as shown in FIG. 1-6, during the first readout period 1-3', charge carriers Q1' may be transferred from charge storage region SD0 to readout region FD. In some embodiments, second readout period 1-4' may occur following first readout period 1-3', and charge carriers Q2' may be transferred from charge storage region SD1 to readout region FD. It should be appreciated that charge carriers Q1' and Q2' may be read out in any order, according to various embodiments.

It should be appreciated that pixel 1-512 may be alternatively configured to operate in the manner described herein including in connection with FIG. 1-4, such as accumulating charge carriers in one charge storage region, reading out the charge carriers from the charge storage region, and then repeating this process with the other charge storage region. It should also be appreciated that, according to various embodiments, pixels described herein may include any number of charge storage regions.

III. Increased Charge Transfer Rate Techniques

The inventors have recognized that increasing the rate of charge transfer in a pixel can improve the noise performance of the pixel, as described further herein. For instance, it is desirable to transport fluorescent emission charge carriers generated in the photodetection region in response to fluorescent photons to the appropriate charge storage region as quickly as possible to ensure the accuracy of charge readouts from the pixel. Moreover, it is desirable to drain as many excitation charge carriers generated in the photodetection region in response to excitation photons as possible before fluorescent emission charge carriers reach the pixel to prevent the excitation charge carriers from being transported to the charge storage region as noise.

Accordingly, the inventors developed techniques for inducing an intrinsic electric field in the photodetection region of a pixel to increase the rate at which charge carriers are transferred out from the photodetection region to the appropriate location in the pixel (e.g., charge storage region or drain region). In some embodiments, a pixel described herein may include a charge storage region and a photodetection region configured to induce an intrinsic electric field in a direction from the photodetection region to the charge storage region. For example, the electric field may exert a force that causes charge carriers to travel more quickly from the photodetection region to the charge storage region than without the intrinsic electric field. Alternatively or additionally, in some embodiments, a pixel described herein may include a drain region, and the photodetection region may be configured to induce an intrinsic electric field from the photodetection region to the drain region. In some embodiments, the charge storage region and drain region may be positioned on a same side of the photodetection region, such that the intrinsic electric field may increase the rate of charge transfer to each of the drain and charge storage regions.

According to one example, a photodetection region may include a dopant pattern configured to induce the intrinsic electric field. In this example, the dopant pattern may be formed by placing a mask with a shaped opening over the photodetection region during at least a portion of doping of the photodetection region. By inducing an intrinsic electric field in the photodetection region, the rate at which charge carriers are transferred out from the photodetection region may be increased, thereby increasing the number of fluorescent emission photons and decreasing the number of excitation photons that reach the charge storage region(s), and resulting in an increase in the signal to noise ratio of charge readouts from the pixel.

FIG. 2-1 is a schematic view of an exemplary pixel 2-112 comprising a photodetection region PPD configured to induce an intrinsic electric field, according to some embodiments. Pixel 2-112 may be configured in the manner described for pixels 1-112, 1-312, and/or 1-512 in connection with FIGS. 1-1 to 1-6. As shown in FIG. 2-1, photodetection region PPD of pixel 2-112 may be configured to induce an intrinsic electric field from photodetection region PPD to drain region D and charge storage region SD0. For example, photodetection region PPD is shown in FIG. 2-1 having a dopant configuration that may be configured to induce a potential gradient due to a gradient in the dopant configuration. For instance, photodetection region PPD may have a higher number of dopants at the end of photodetection region PPD proximate drain region D and charge storage region SD0 than at the opposite end of photodetection region PPD, thereby causing a potential gradient from end to end.

As shown in FIG. 2-1, the dopant configuration may have a first end and a second end, with the first end being wider than the second end. For instance, the first end is shown in FIG. 2-1 spaced from the second end in a direction parallel a direction in which charge carriers are transferred from the photodetection region PPD to the charge storage region SD0. The dopant configuration is also shown wider in FIG. 2-1, in a direction perpendicular to both the electrical axis and the optical axis, at the first end than at the second end. In one example, the dopant configuration may be at least 75% wider at the first end than at the second end. In another example, the dopant configuration may be at least 90% wider at the first end than at the second end. For instance, in the illustrative example of FIG. 2-1, the dopant configuration has a substantially triangular shape, with a base positioned at the first end and an apex corresponding to the base positioned at the second end.

In some embodiments, a photodetection region configured to induce an intrinsic electric field may be formed by doping the photodetection region via a mask having a shaped opening, such as shown in FIG. 2-1. In some embodiments, the mask may include a thin, at least partially opaque and at least partially insulative material. For example, in some embodiments, the mask may have a thickness of less than 1 micron, such as 0.6 microns, in a direction parallel to the optical axis. In some embodiments, the mask opening may have a first end and a second end, with the first end being wider than the second end. For instance, the first end is shown in FIG. 2-1 spaced from the second end in a direction parallel to the electrical axis (e.g., from the photodetection region PPD to the charge storage region SD0). The opening is shown wider, in a direction perpendicular to both the electrical axis and the optical axis, at the first end than at the second end. In one example, the opening may be at least 75% wider at the first end than at the second end. In another example, the opening may be at least 90% wider at the first end than at the second end. For instance, in the illustrative example of FIG. 2-1, the mask opening has a substantially triangular shape, with a base positioned at the first end and an apex corresponding to the base positioned at the second end. In some embodiments, at least a portion of pixel 2-112 may be manufactured by depositing the mask above and/or below a portion of the photodetection region and removing at least a portion of the mask to create the mask opening, such that the opening is wider at the first end of the photodetection region than at the second end.

The inventors recognized that increasing the rate of charge carrier transport in the pixel 2-112 increases the excitation rejection ratio of the pixel 2-112 by draining excitation charge carriers faster and accumulating more fluorescent emission charge carriers in the charge storage region(s). As a result, the ratio of fluorescent emission signals to excitation noise may be improved for more accurate measurement of fluorescent information. In some embodiments, the drain region D and charge storage region SD0 may be positioned on a same side of photodetection region PD such that the potential gradient increases the rate of charge transport from photodetection region PPD to both drain region D and charge storage region SD0.

FIGS. 2-2 is a top view of a row of exemplary pixels 2-212 that may be included in integrated device 1-102, according to some embodiments. In some embodiments, pixels 2-212 may be configured in the manner described herein for pixel 1-212 including in connection with FIG. 2-1. FIG. 2-3 is a top view of multiple rows of pixels 2-212 that may be included in integrated device 1-102, according to some embodiments. In some embodiments, the rows of pixels 2-212 shown in FIG. 2-3 may be included as part of a larger array. For example, the array may include any number of pixels 2-212 per row and may have any number of rows.

As shown in FIG. 2-3, adjacent rows of pixels 2-212 may be positioned with photodetection regions PPD of pixels 2-212 oriented in opposite directions. In some embodiments, photodetection regions PPD in a first row of pixels 2-212 may be configured to induce an intrinsic electric field in a direction away from a second, adjacent row of pixels 2-212, and vice versa. The inventors recognized that orienting photodetection regions PPD in opposite directions, such as shown in FIG. 2-3, reduces the number of charge carriers that travel between pixels 2-212 of the adjacent rows. In some embodiments, photodetection regions PPD of pairs of rows of pixels 2-212 of integrated device 2-212 may be configured as shown in FIG. 2-3 for the rows of pixels 2-212.

Figures 1, 2, 3, 4:
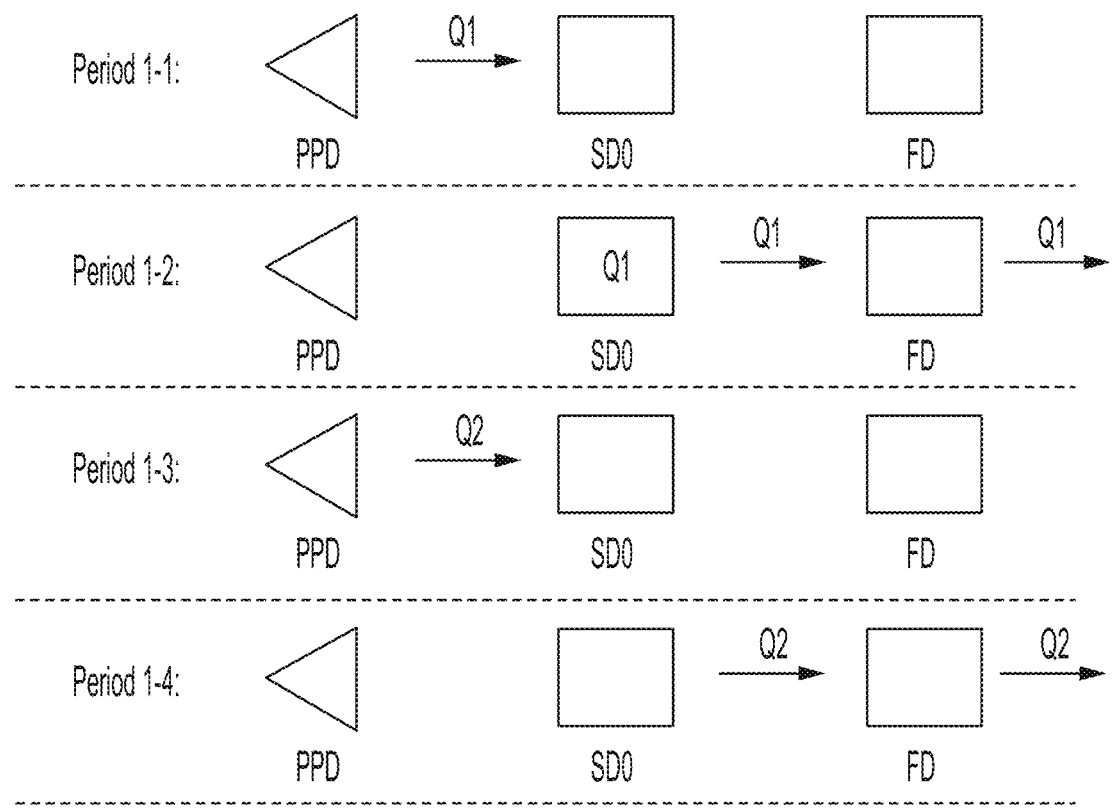

FIG. 2-4 is a side view of a portion of a pixel 2-212, according to some embodiments. In FIG. 2-4, a via wall is shown electrically coupling a top metal layer to a lower level metal layer. In some embodiments, the via wall may be configured to provide control signals from the top metal layer to transfer gates of adjacent pixel rows below the lower level metal layer. For instance, the inventors recognized the via wall may increase the conductivity of the conductive structure through which the control signals are provided, resulting in a less propagation delay in the conductive structure, and reduced skew in the control signals provided to the transfer gates.

IV. Techniques Incorporating One or More Drain Layers

The inventors have recognized that noise charge carriers can impact detection of fluorescent emissions in a pixel. For instance, noise photons and/or charge carriers can travel beyond the photodetection region and/or reach undesired locations in the pixel, such as a charge storage region. In one example, incident photons, or charge carriers generated therefrom, may pass through the photodetection region of a pixel and enter the bulk of the pixel, from which resulting charge carriers may reach a charge storage region and add noise to the charge carriers stored therein. If unmitigated, the noise photons and charge carriers can impact the accuracy of charge readouts from the pixel.

To solve this problem, the inventors have developed techniques to prevent noise photons and charge carriers from reaching the charge storage regions. In some embodiments, at least one drain layer may be configured to receive incident photons and/or charge carriers via the photodetection region. For example, the drain layer(s) may be positioned, at least in part, after the photodetection region in a direction in which the photodetection region is configured to receive incident photons. In some embodiments, the drain layer(s) may be configured to discard charge carriers received via the photodetection region and/or charge carriers generated in the drain layer(s) in response to incident photons received via the photodetection region. For example, the drain layer(s) may include a collection layer configured to be coupled to a DC power supply voltage, such that the charge carriers can flow to the DC power supply voltage. Thus, the drain layer(s) can be configured to discard noise charge carriers that may otherwise reach the charge storage regions, thereby increasing the rejection ratio of the pixel. It should be appreciated that drain layers described herein may be positioned above or below the photodetection region and/or may be configured to receive incident photons and/or charge carriers that do not pass through the photodetection region. For example, in some embodiments, incident photons and/or charge carriers incident at oblique angles relative to the optical axis may reach the drain layer(s) without passing through the photodetection region.

Figures 1A, 3:
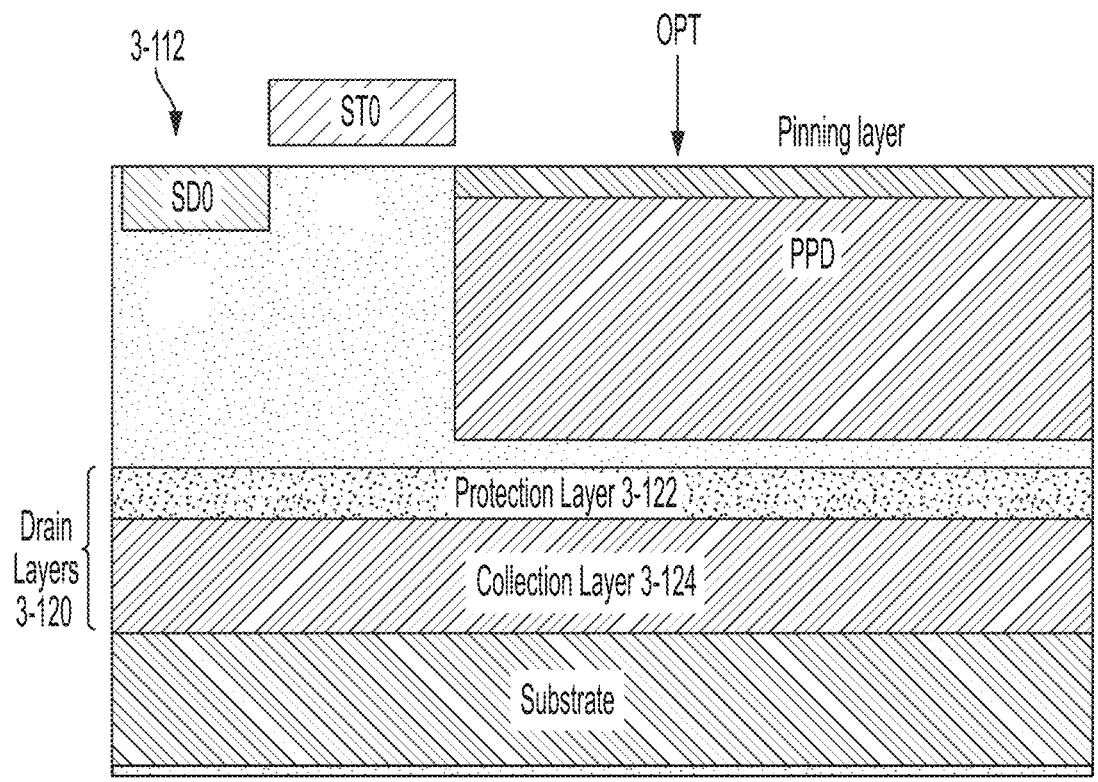

FIG. 3-1A is a side view of an exemplary pixel 3-112 having one or more drain layers, according to some embodiments. In some embodiments, pixel 3-112 may be configured in the manner described herein for pixel 1-112 and/or any other pixel described herein. As shown in FIG. 3-1A, pixel 3-112 includes a photodetection region PPD and drain layers 3-120 configured to receive incident photons and/or charge carriers via the photodetection region PPD. As shown in FIG. 3-1A, drain layers 3-120 are positioned after photodetection region PPD in the direction OPT in which photodetection region PPD is configured to receive incident photons. For example, incident photons and/or charge carriers generated therefrom may flow to drain layers 3-120 via photodetection region PPD (and/or along paths other than through photodetection region PPD).

In some embodiments, drain layers 3-120 may be configured to discard the received charge carriers and/or charge carriers generated in drain layers 3-120 in response to received incident photons. For example, drain layers 3-120 are shown in FIG. 3-1A including a protection layer 3-122 and a collection layer 3-124. In some embodiments, collection layer 3-124 may be configured to discard the received charge carriers and/or charge carriers generated in response to the incident photons. For example, collection layer 3-124 may be configured for coupling to a DC power supply voltage (e.g., a high voltage for discarding electrons or a low voltage for discarding holes). In some embodiments, collection layer 3-124 may be a doped semiconductor region having the same semiconductor doping type as photodetection region PPD. For instance, photodetection region PPD and collection layer 3-124 may include n-type doped regions formed of and/or disposed on one or more lightly p-doped substrate layers of pixel 3-112.

In some embodiments, drain layers 3-120 may be configured to block at least some charge carriers from leaving photodetection region PPD. For example, protection layer 3-122 may be configured to block at least some charge carriers from reaching collection layer 3-124 via photodetection region PPD. As shown in FIG. 3-1A, protection layer 3-122 may be disposed between photodetection region PPD and collection layer 3-124 in the direction OPT. In some embodiments, protection layer 3-122 may be configured to form a potential barrier between photodetection region PPD and collection layer 3-124. For example, protection layer 3-122 may have an opposite semiconductor doping type from photodetection region PPD and/or collection layer 3-124. For instance, in the above example, the protection layer may be p-type doped. By blocking charge carriers from leaving photodetection region PPD, the charge carriers may be routed to drain region D or a charge storage region.

Figures 1B, 3:
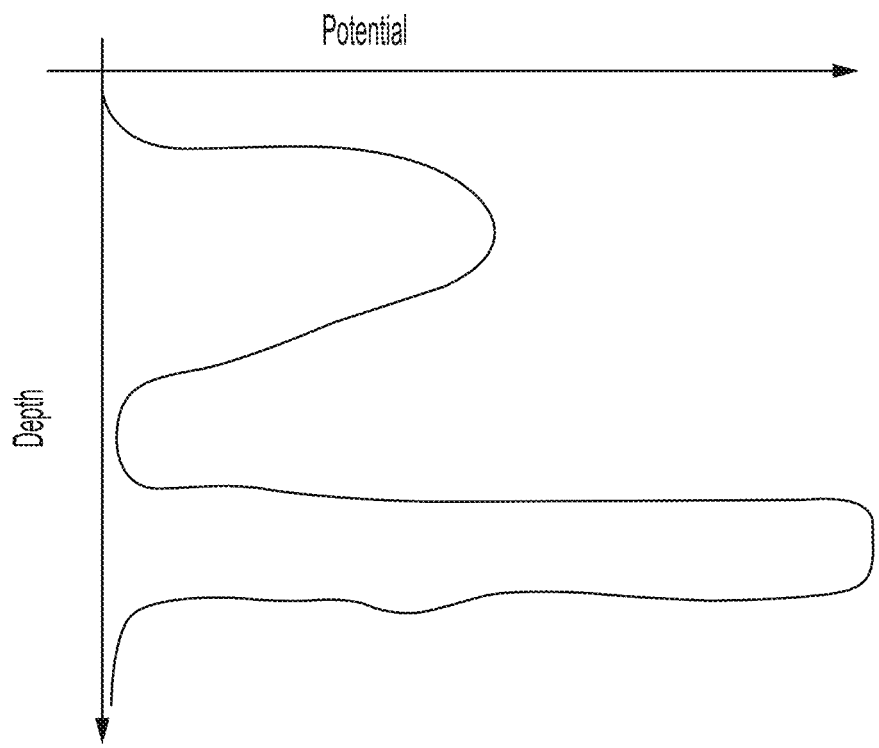
Figures 2, 3:
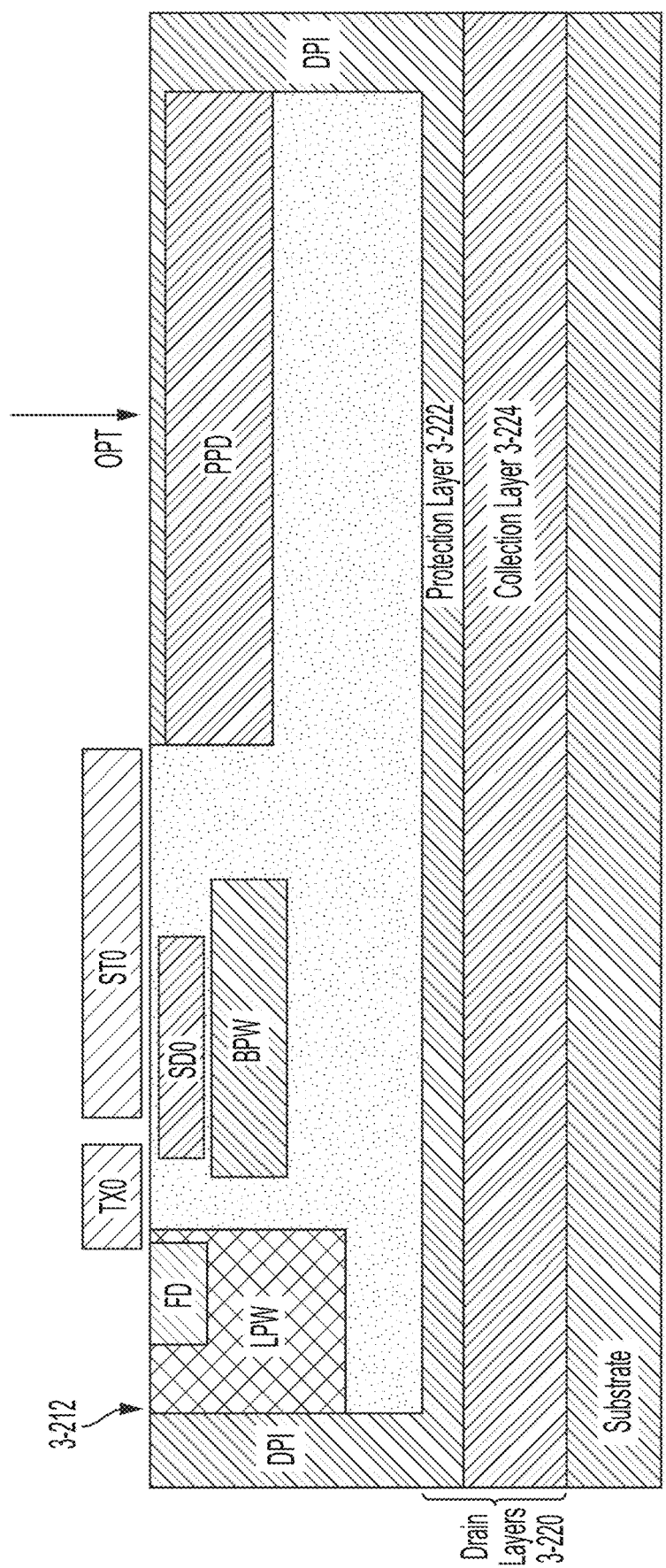
Figure 3:
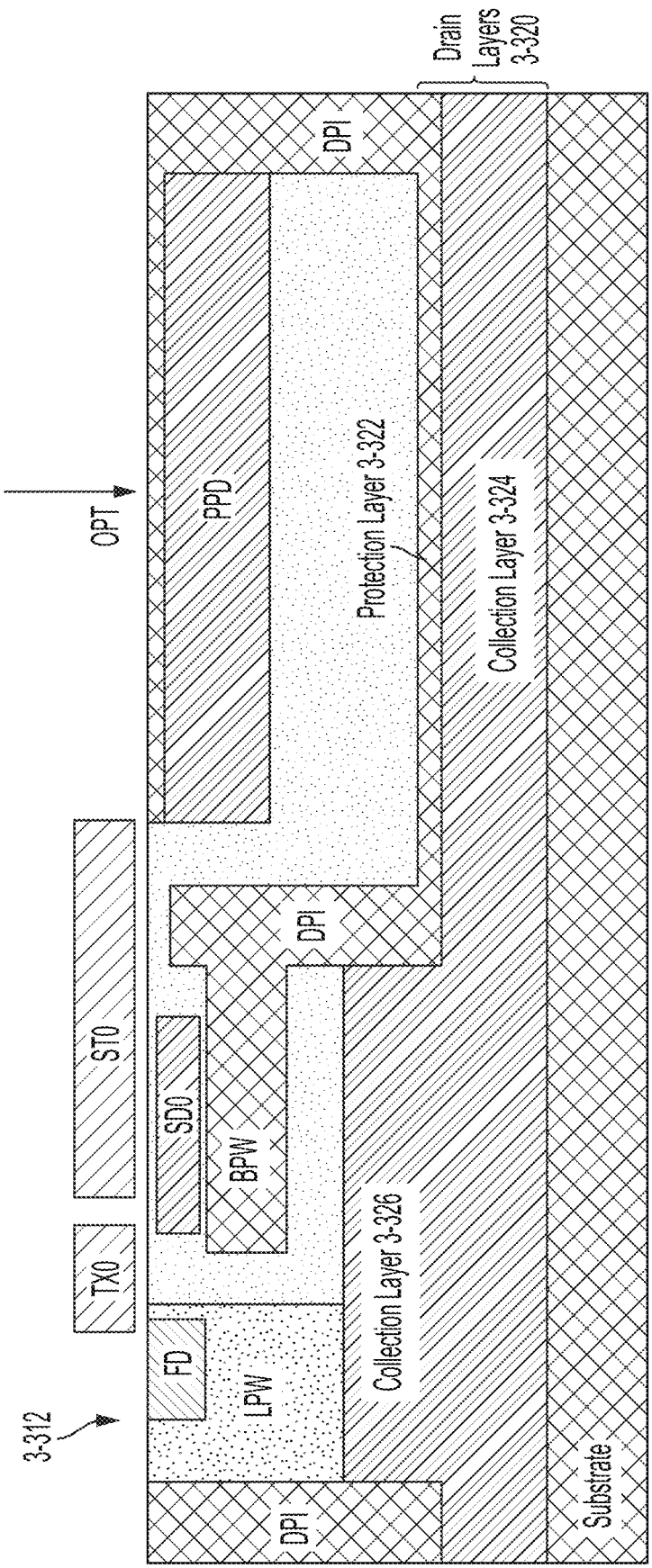

FIG. 3-1B is a graph illustrating electrostatic potential of pixel 3-112 by depth, according to some embodiments. As shown in FIG. 3-1B, the electrostatic potentials in photodetection region PPD and collection layer 3-124 are higher than protection layer 3-122. For instance, the relatively low electrostatic potential of the protection layer may block at least some charge carriers from leaving photodetection region PPD. Charge carriers having sufficient energy to pass through protection layer 3-122 may reach collection layer, which may discard the charge carriers.

In some embodiments, drain layers 3-120 may be configured to block fluorescent emission photons from leaving photodetection region PPD and allow excitation photons to leave photodetection region PPD and reach collection layer 3-124. For example, fluorescent emission photons typically have lower energy than excitation photons and are more likely to remain in photodetection region PPD rather than pass through protection layer 3-122 and reach collection layer 3-124. In this example, excitation photons are more likely than fluorescent emission photons to pass through protection layer 3-122 and reach collection layer 3-124. Moreover, fluorescent charge carriers that reach collection layer 3-124 may, if not discarded, reach the charge storage regions via undesired paths and add noise to the collected charge. For example, the fluorescent charge carriers may have high enough energy that they would otherwise reach the charge storage regions too late to be accurately measured Thus, drain layers 3-124 may be configured to reduce the number of noise charge carriers that reach the charge storage regions, thereby increasing the rejection ratio of the pixel.

It should be appreciated that, in some embodiments, protection layer 3-122 may have a higher electrostatic potential than photodetection region PPD and/or collection layer 3-124, such as in p-channel embodiments of pixel 3-112.

In some embodiments, at least a portion of the drain layer(s) may be further positioned after the charge storage region(s) in the direction in which the photodetection region PPD is configured to receive incident photons, as described further herein.

FIG. 3-2 is a side view of exemplary pixel 3-212 having one or more drain layers 3-220 and one or more barrier layers, according to some embodiments. In some embodiments, pixel 3-212 may be configured in the manner described herein for pixel 3-112 in connection with FIGS. 3-1A and 3-1B. For instance, pixel 3-212 is shown in FIG. 3-2 including protection layer 3-222 and collection layer 3-224. In addition, pixel 3-212 is illustrated having a barrier BPW positioned between protection layer 3-222 and charge storage region SD0. For instance, in some embodiments, barrier BPW may be configured to block at least some noise charge carriers (e.g., traveling in the bulk substrate layer(s)) that reach charge storage region SD0. For example, following an excitation pulse, the bulk semiconductor region of pixel 3-212 between charge storage region SD0 and protection layer 3-222 may receive a large number of noise charge carriers that would otherwise reach charge storage region SD0 and add noise to the collected charge carriers therein. In some embodiments, barrier BPW may be formed using p-type doping, such as by boron implant. As also shown in FIG. 3-2, pixel 3-212 may include one or more additional barriers, such as Deep P-implant Isolation (DPI) barriers shown on each horizontal end of pixel 3-212, which may be configured to block charge carriers from traveling between adjacent pixels. As a result, photons incident on the pixel 3-212 at oblique angles may be similarly drained and prevented from reaching the charge storage region SD0.

FIG. 3-3 is a side view of pixel 3-312 having one or more drain layers 3-320, according to some embodiments. In some embodiments, pixel 3-312 may be configured in the manner described herein for pixel 3-212 in connection with FIG. 3-2. For instance, pixel 3-312 is shown including protection layer 3-322 and collection layer 3-324. In addition, pixel 3-312 is illustrated having collection layer 3-326 positioned between collection layer 3-324 and charge storage region SD0. In some embodiments, collection layer 3-326 may be configured to discard charge carriers in the region of pixel 3-312 between collection layer 3-326 and charge storage region SD0. For example, collection layer 3-326 may be electrically coupled to collection layer 3-324 and/or a DC power supply voltage. In some embodiments, collection layers 3-324 and 3-326 may have a same doping conductivity type. In some embodiments, collection layer 3-326 may further reduce the number of noise charge carriers that reach charge storage region SD0, thereby increasing the rejection ratio of the pixel.

FIG. 3-3 also shows a barrier DPI connecting barrier BPW to protection layer 3-322. For example, barriers BPW and DPI, and protection layer 3-322 may be configured to block at least some charge carriers from reaching collection layers 3-324 and 3-326. As shown, collection layer 3-326 is disposed at a different depth from collection layer 3-324. For instance, collection layer 3-326 may be disposed closer to charge storage region SD0 collection layer 3-324 is. In FIG. 3-3, barrier BPW is shown disposed between charge storage region SD0 and collection layer 3-326.

V. Techniques Incorporating Various Control Signal Configurations

The inventors have developed techniques that facilitate operating one or more pixels of an integrated device using control signal configurations described further herein. According to various embodiments, control signals described herein may include sine waves and/or square waves having configurable amplitudes and/or DC offsets. In some embodiments, control signals described herein having a same operating frequency can be configured to exceed the threshold voltage of a charge transfer channel in a pixel for different amounts of time, thereby causing collection and/or drain periods of the pixel to have different durations. For example, the control signals can have different phases such that the peaks of the control signals are not aligned, thereby allowing one control signal to control a first charge transfer channel to a conductive state while another control signal maintains a charge transfer channel in a nonconductive state. In some embodiments, control signals described herein may be balanced, such that the control signals sum to a constant value over time. The inventors recognized that including balanced control signals is advantageous, in some applications, because they reduce the amount of ground return current from providing the control signals, thereby allowing the ground return path for the control signals to be made smaller, and thereby more resistive, without adding skew to the control signals. Thus, a large array can be controlled using low skew control signals as described further herein.

FIG. 4-1 is a time graph illustrating square wave control signals 4-102 and 4-104 that may be configured to drive one or more transfer gates of a pixel of integrated device 1-102, according to some embodiments. In some embodiments, control signals 4-102 and 4-104 may be generated by a control circuit of integrated device 1-102 coupled to one or more pixels of a pixel row and/or array of an integrated circuit via metal lines (e.g., of metal layers 1-240), as described herein.

In accordance with various embodiments, control signals 4-102 and 4-104 may be configured to control charge transfer between a photodetection region and a drain region of a pixel and/or one or more charge storage regions of the pixel. For example, control signal 4-102 may be configured to control a first transfer gate and control signal 4-104 may be configured to control a second transfer gate. In this example, control signal 4-102 may be configured to control a transfer of charge carriers from the photodetection region to a first charge storage region of a pixel and control signal 4-104 may be configured to control a transfer of charge carriers from the photodetection region to a second charge storage region of the pixel. Alternatively, in the above example, control signal 4-102 or 4-104 may be configured to control a transfer of charge carriers from the photodetection region to a drain region of the pixel during a drain period.

In some embodiments, control signals provided to a pixel may be configured to control charge transfer periods (e.g., rejection and/or collection periods), such as controlling the charge transfer periods to have different durations. For example, the control signals may exceed threshold voltages of respective charge transfer channels for different periods of time during each clock cycle. As illustrated in FIG. 4-1, control signal 4-104 has a longer duty cycle than a control signal 4-102. For instance, the control signal 4-102 may be configured to cause a transfer of excitation charge carriers from the photodetection region to the drain region following an excitation pulse, and control signal 4-104 may be configured to cause a transfer of fluorescent emission charge carriers from the photodetection region to a charge storage region during a collection period following the drain period. In some embodiments, control signals 4-102 and 4-104 may be generated by switching an output of a control circuit between two or more DC voltage levels.

Figures 1, 4:
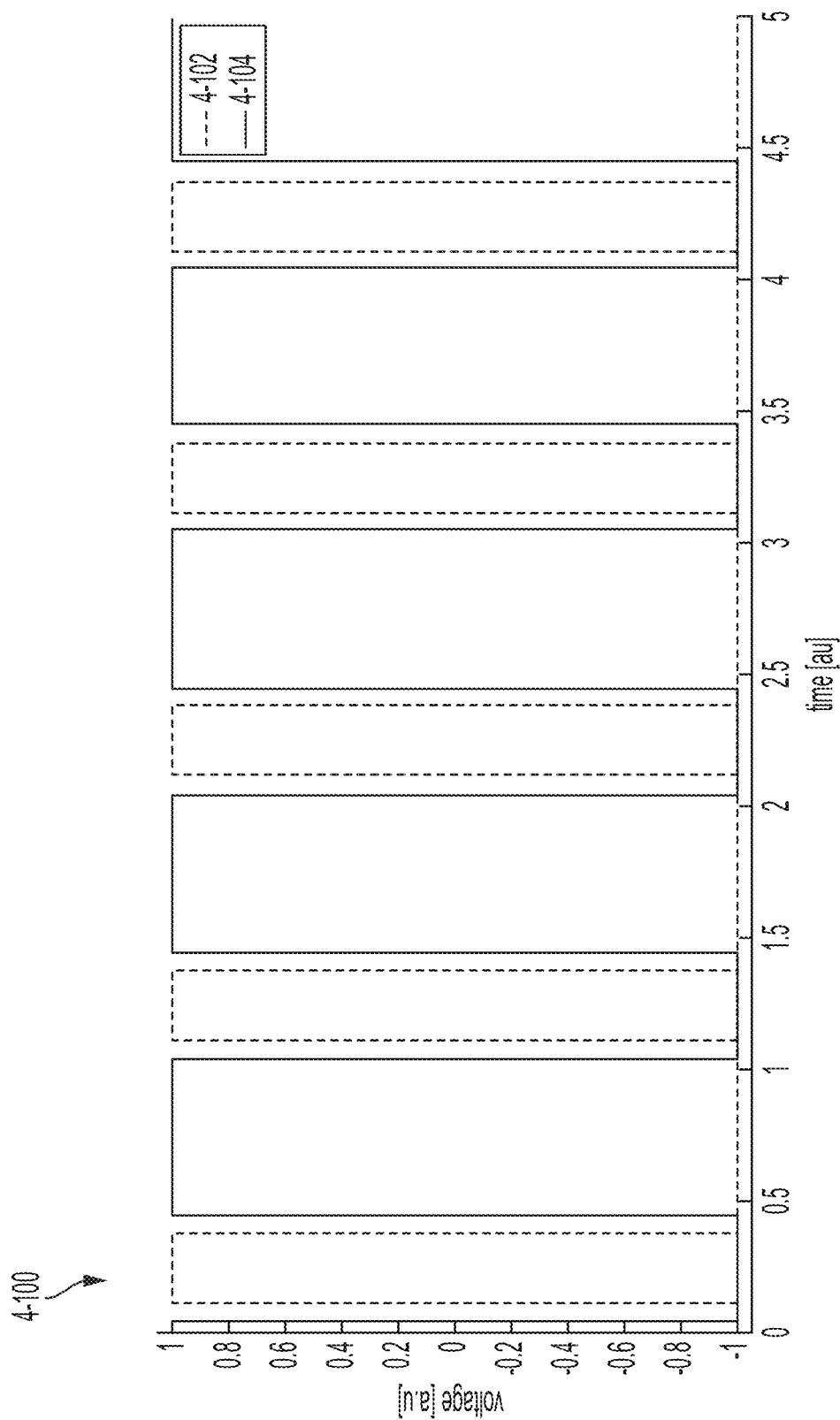
Figures 2A, 4:
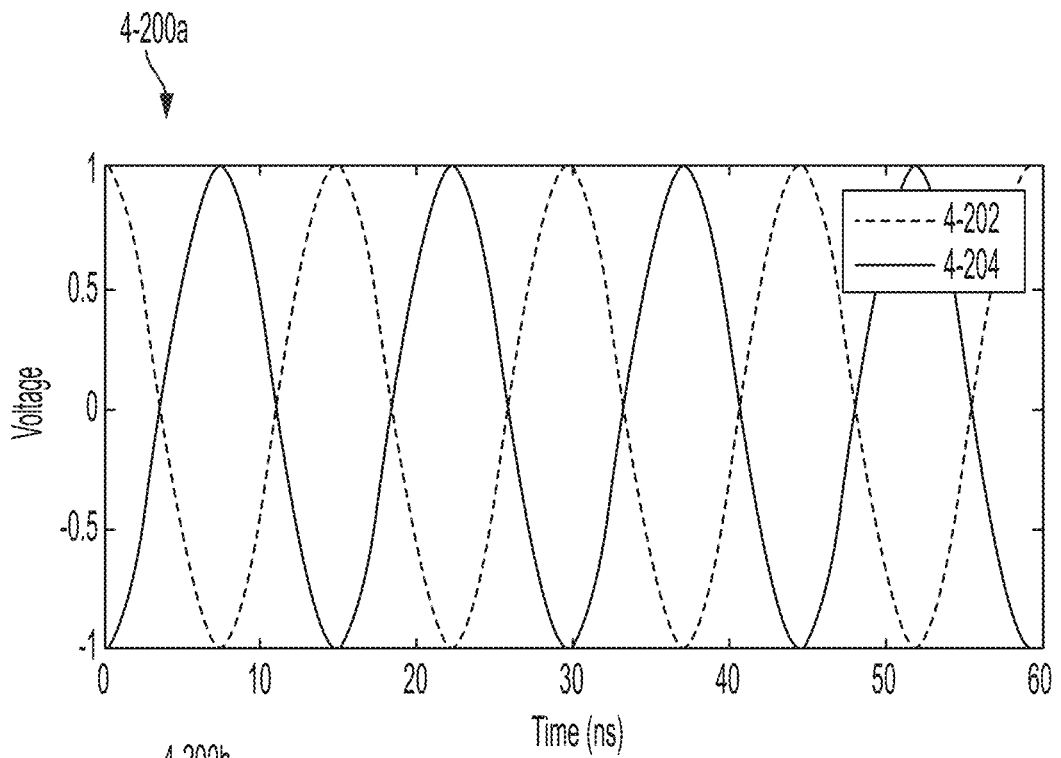

FIG. 4-2A is a time graph illustrating balanced, sinusoidal control signals 4-202 and 4-204 that may be configured to drive one or more transfer gates of a pixel, according to some embodiments. In some embodiments control signals 4-202 and 4-204 may be configured in the manner described for control signals 4-102 and 4-104. In addition, control signals 4-202 and 4-204 may be balanced and substantially uniform. In some embodiments, control signals 4-202 and 4-204 may have the same amplitude and may be out of phase from one another. In FIG. 4-2A, for example, control signals 4-202 and 4-204 are shown approximately 180 degrees out of phase from one another and operating about a same DC voltage. In FIG. 4-2A, control signals 4-202 and 4-204 both operate approximately about DC ground. As a result of being 180 degrees out of phase from one another and having the same amplitude, the control signals illustrated in FIG. 4-2A sum, at least approximately, to a constant voltage at each point in time, such as DC ground as shown in FIG. 4-2A.

Figures 2B, 4:
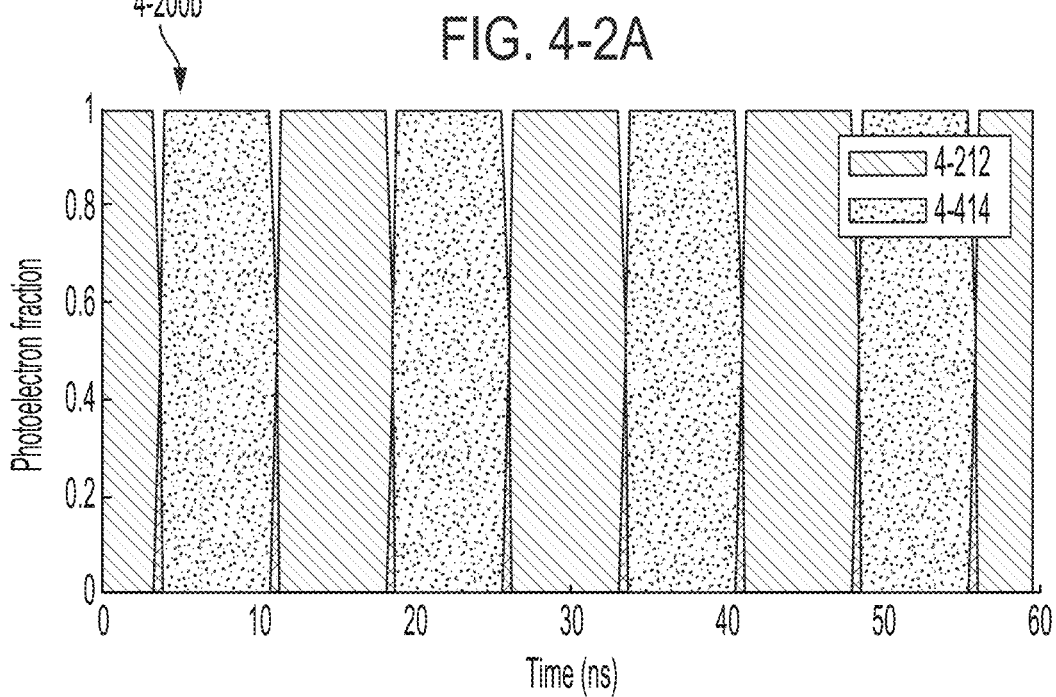

FIG. 4-2B is a time graph illustrating charge transfer in charge transfer channels 4-212 and 4-214 in response to receiving control signals 4-202 and 4-204, respectively, according to some embodiments. As shown in FIG. 4-2B, charge transfer channels 4-212 and 4-214 may be configured to transfer charge carriers for equal durations during the times when control signals 4-202 and 4-204 exceed the voltage thresholds of charge transfer channels 4-212 and 4-214. For example, charge transfer channels 4-212 and 4-214 may have equal voltage thresholds, and control signals 4-202 and 4-204 may thus exceed the voltage thresholds of charge transfer channels 4-212 and 4-214 for equal durations. In some embodiments, charge transfer channel 4-212 may be configured to transfer charge carriers from a photodetection region to a first charge storage region and charge transfer channel 4-214 may be configured to transfer charge carriers from the photodetection region to a second charge storage region. Alternatively, charge transfer channel 4-212 or 4-214 may be configured to transfer charge carriers from the photodetection region to a drain region.

Figures 3A, 4:
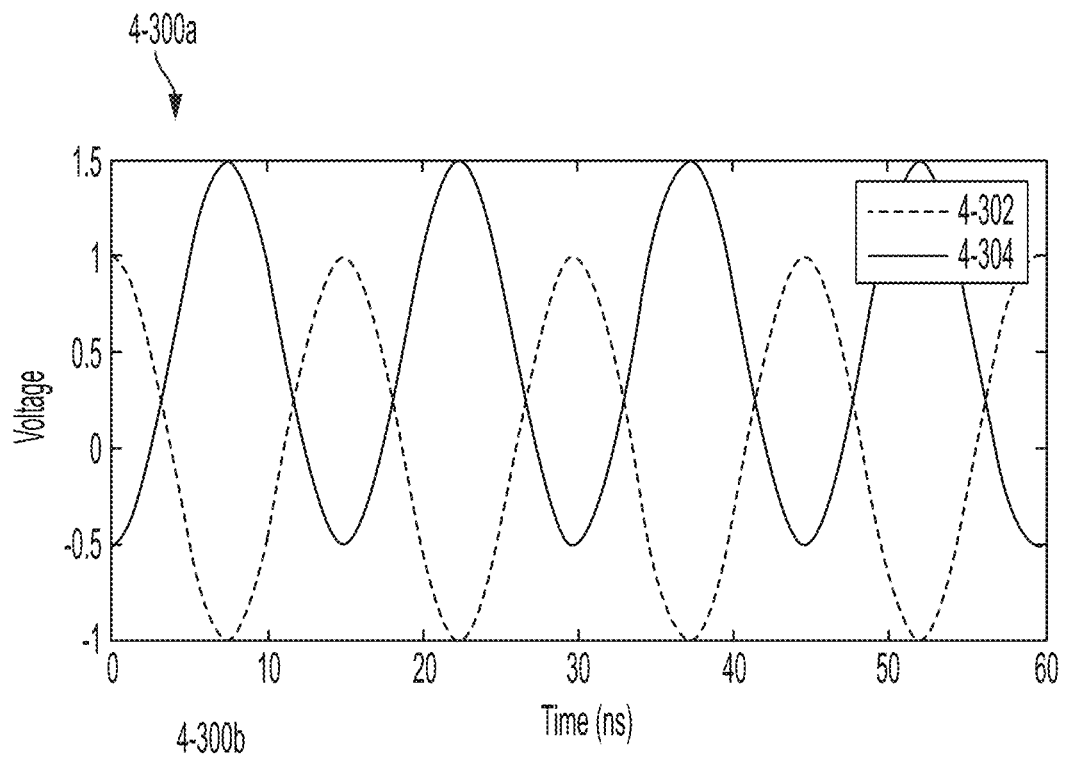

FIG. 4-3A is a time graph illustrating balanced, DC offset, sinusoidal control signals 4-302 and 4-304 that may be configured to drive a plurality of transfer gates of a pixel, according to some embodiments. In some embodiments, control signals 4-302 and 4-304 may be configured in the manner described herein for control signals 4-202 and 4-204 in connection with FIGS. 4-2A and 4-2B. In some embodiments, control signals 4-302 and 4-304 may operate about a center voltage other than DC ground. For instance, as shown in FIG. 4-3A, control signals 4-302 and 4-304 each operate about a center voltage of approximately 0.25 V. In some embodiments, control signals 4-302 and 4-304 may alternatively or additionally have different voltage amplitudes. For instance, as shown in FIG. 4-3A, control signal 4-304 has an amplitude of approximately 1.5 V, and control signal 4-302 has an amplitude of approximately 1.0 V. As a result of the DC offset of 0.25 V, control signals 4-302 and 4-304 do not sum to zero at each point in time. However, the waveforms are balanced, as they sum, at least approximately, to a constant non-zero voltage at each point in time (e.g., 0.5 V as shown in FIG. 4-3A).

Figures 3B, 4:
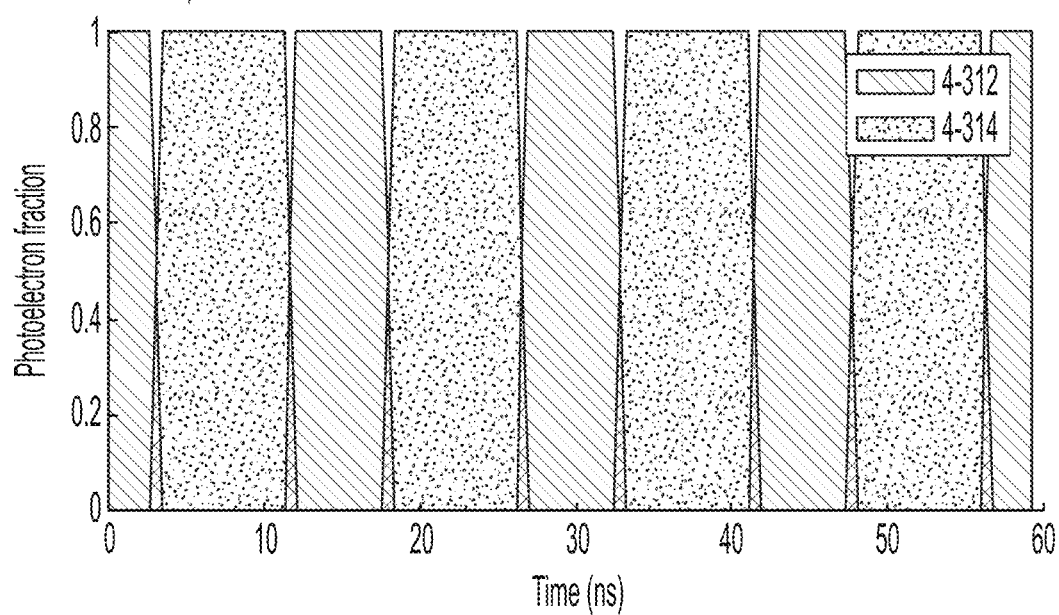

FIG. 4-3B is a time graph illustrating charge transfer in charge transfer channels 4-312 and 4-314 in response to receiving control signals 4-302 and 4-304, respectively, according to some embodiments. In some embodiments, control signals 4-302 and 4-304 may be configured to cause charge transfer periods of different durations. For example, in FIGS. 4-3A and 4-3B, the DC offset and difference in control signal amplitudes between control signals 4-302 and 4-304 causes charge transfer channel 4-312 to transfer charge carriers for a shorter time period than charge transfer channel 4-314. For example, charge transfer channels 4-312 and 4-314 may have the same threshold voltage. Since control signal 4-304 has a higher amplitude than and a same center voltage as control signal 4-302, control signal 4-304 may exceed the voltage threshold of charge transfer channel 4-314 for longer than control signal 4-302 exceeds the voltage threshold of charge transfer channel 4-312. In some embodiments, the center voltages of control signals 4-302 and 4-304 may be configured based on the threshold voltage level(s). For example, center voltages of the control signals 4-302 and 4-304 may be determined so as to set desired durations of the charge transfer periods controlled by each control signal. In some embodiments, the center voltages may be determined based on an expected arrival time and/or duration of receiving fluorescence emission photons at the photodetection region for collection in a charge storage region.

Figures 4, 4A:
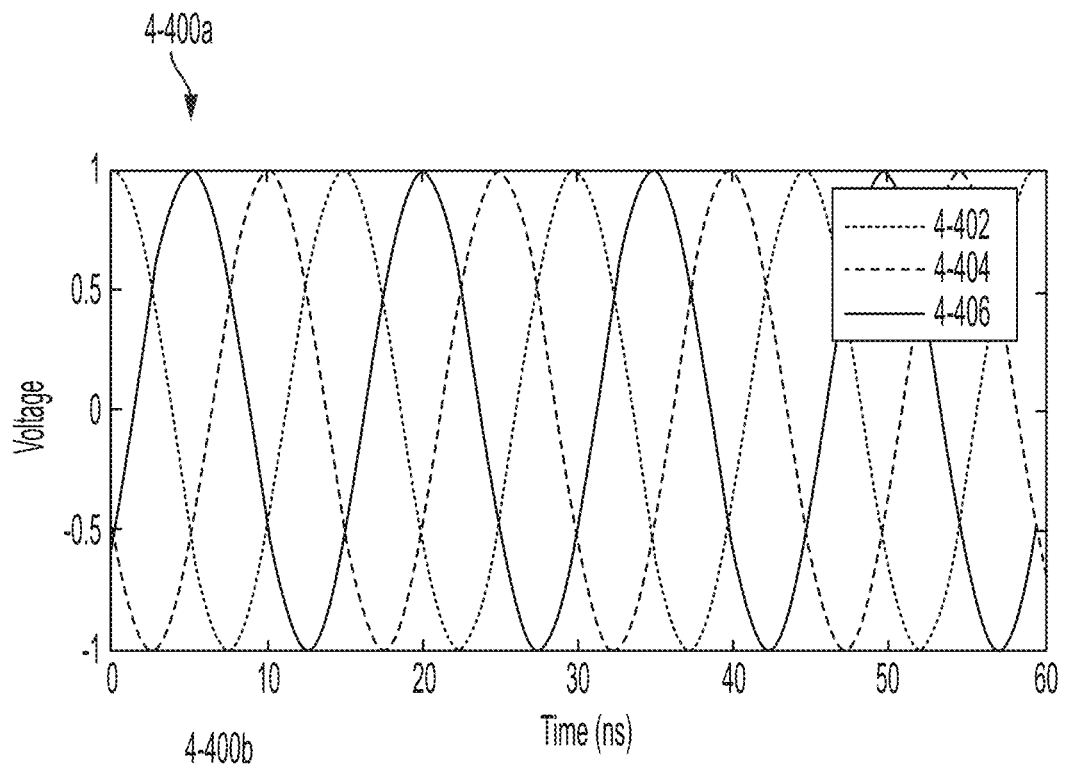

FIG. 4-4A is a time graph illustrating sinusoidal control signals 4-402, 4-404, and 4-406 that may be configured to drive one or more transfer gates of a pixel, according to some embodiments. In some embodiments, control signals 4-402, 4-404, and 4-406 may be configured in the manner described herein for control signals 4-202 and 4-204 including in connection with FIG. 4-2A. For instance, control signals 4-402, 4-404, and 4-406 may also be configured out of phase from one another and operate approximately about a same DC voltage (e.g., DC ground). As shown in FIG. 4-4A, control signals 4-402, 4-404, and 4-406 may be balanced in that they sum, at least approximately, to the center DC voltage at each point in time (e.g., 0V). As shown in FIG. 4-4A, control signals 4-402, 4-404, and 4-406 may have a same amplitude and may be approximately 120 degrees out of phase from one another.

Figures 4, 4B:
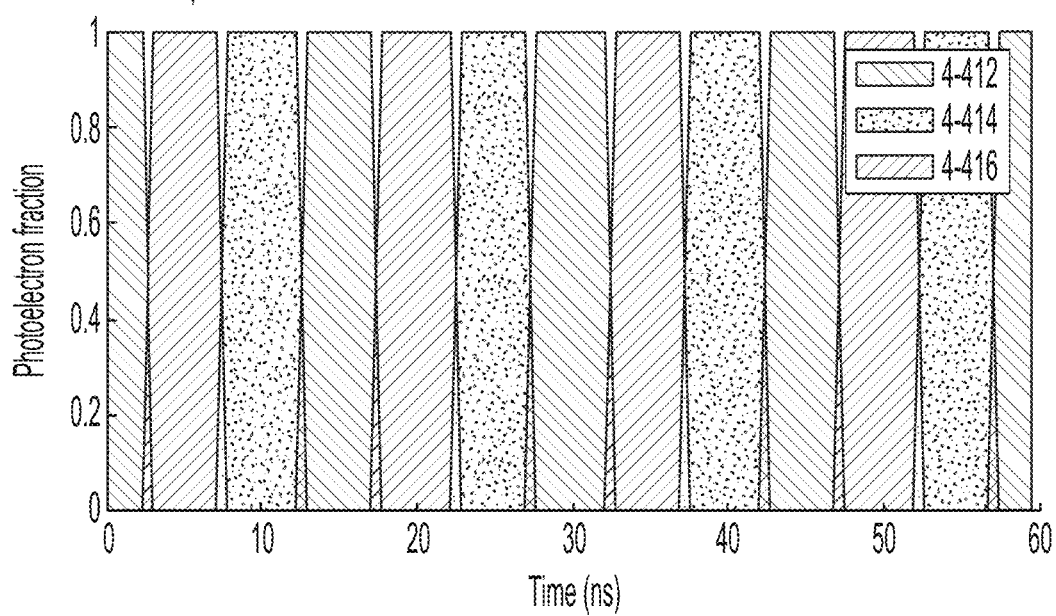
Figures 4, 5, 5A:
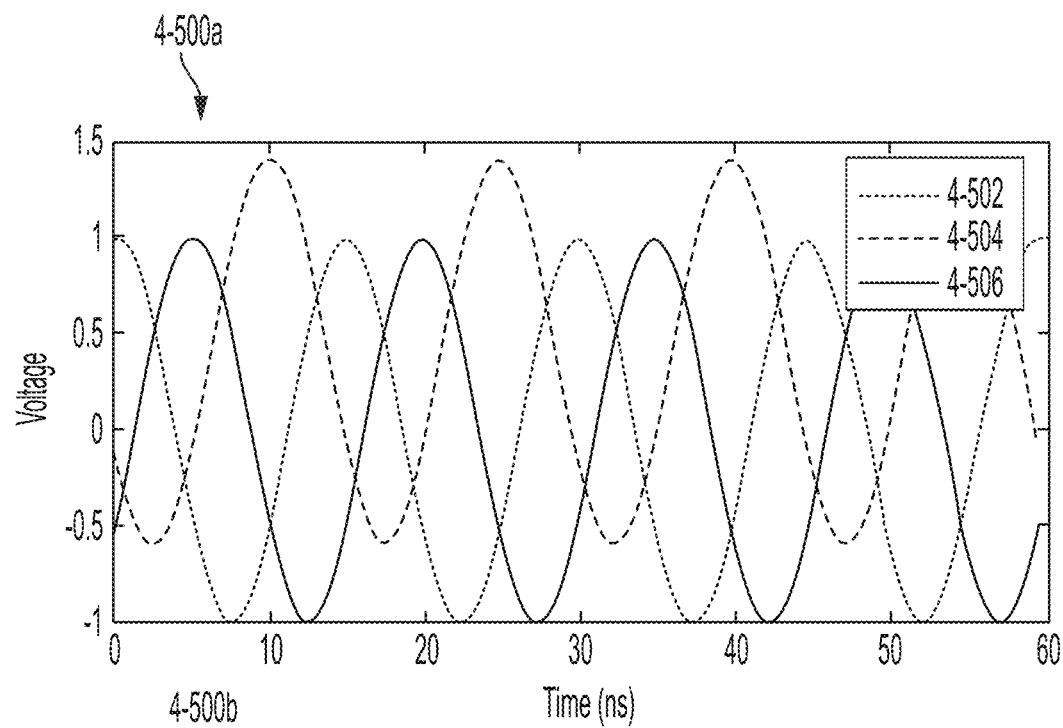
Figures 4, 5, 5B:
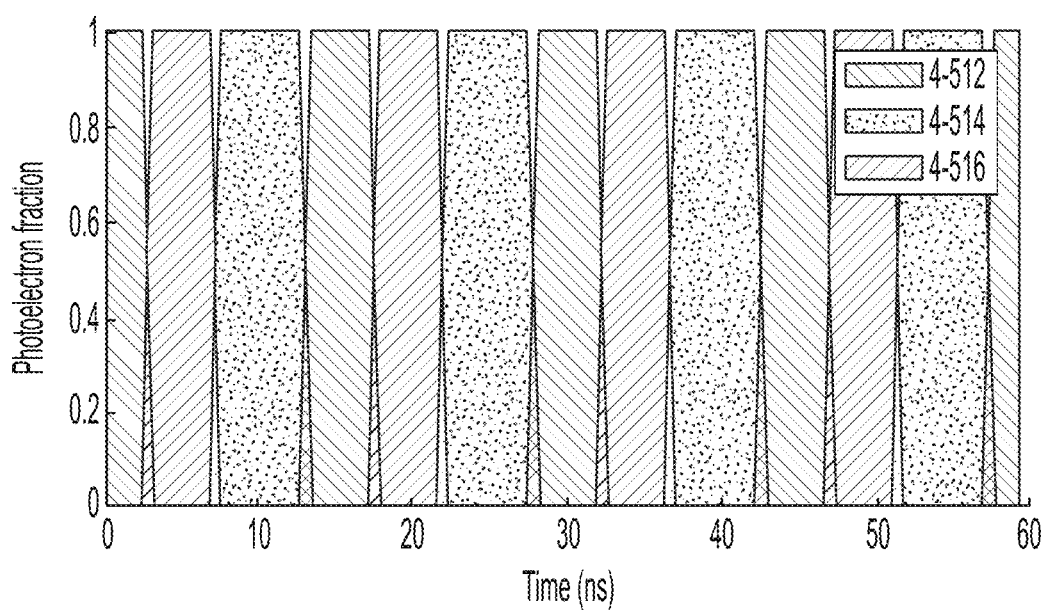
Figures 4, 5, 6, 6A:
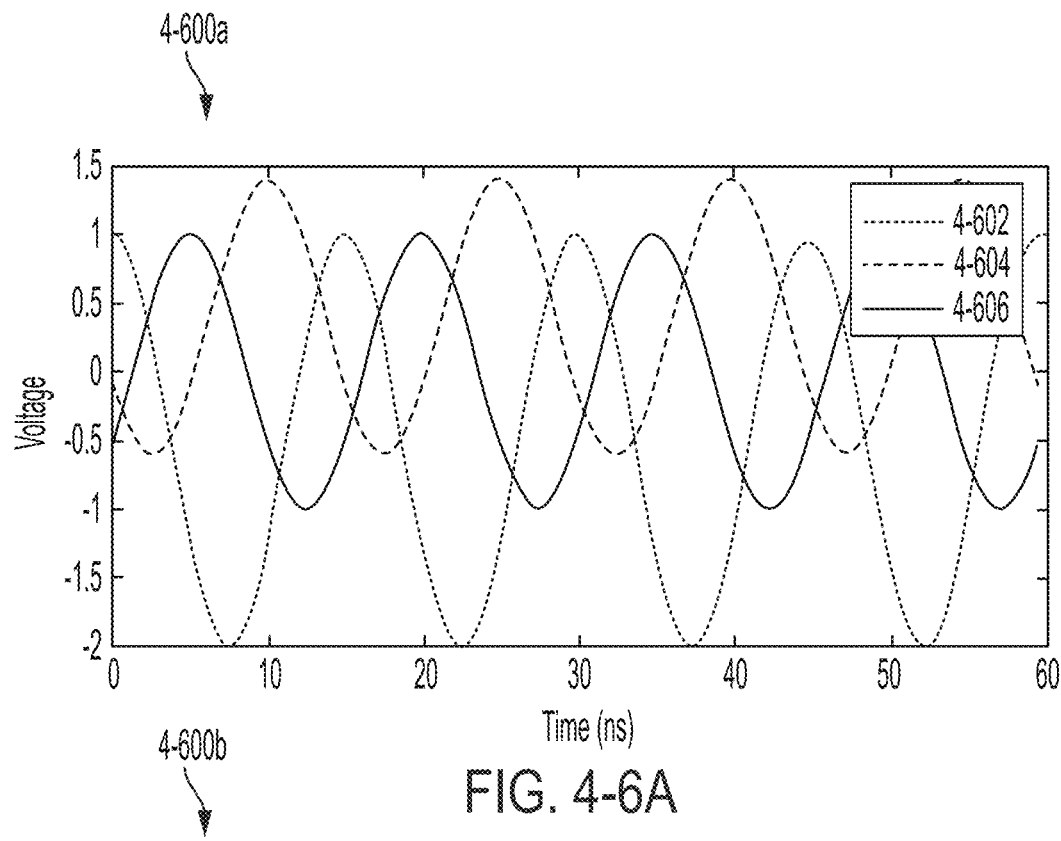
Figures 4, 5, 6, 6B:
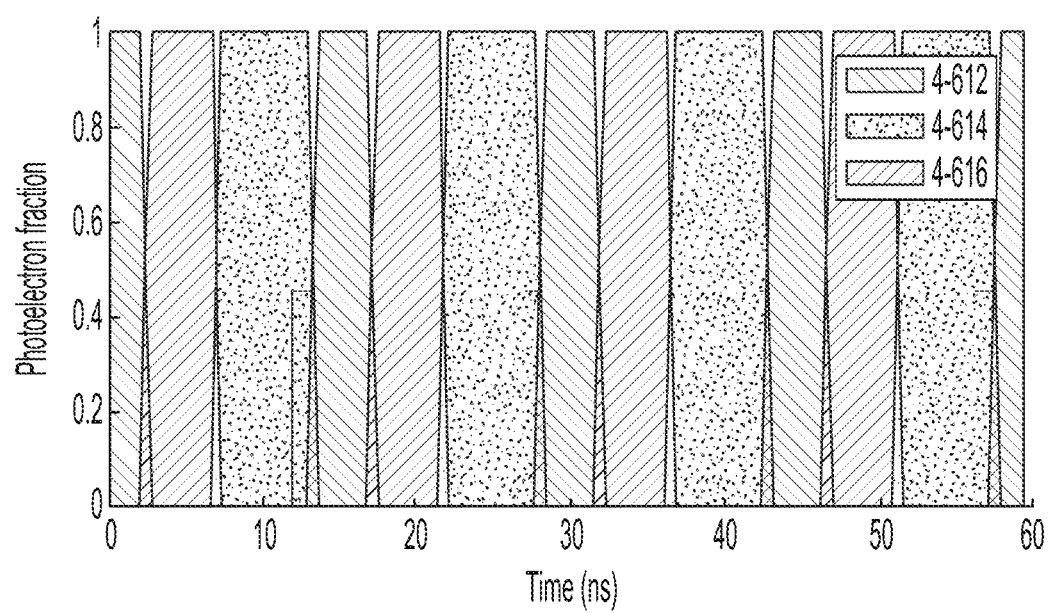

FIG. 4-4B is a time graph illustrating charge transfer in charge transfer channels 4-412, 4-414, and 4-416 that may be controlled by control signals 4-402, 4-404, and 4-406, respectively, according to some embodiments. As shown in FIG. 4-4B, each charge transfer channel 4-412, 4-414, and 4-416 may be configured to transfer charge carriers for a same duration. In this example, each charge transfer channel 4-412, 4-414, and 4-416 may have a same voltage threshold, and thus each control signal 4-402, 4-404, and 4-406 may be configured to exceed the voltage thresholds of charge transfer channels 4-412, 4-414, and 4-416 for the same duration. In some embodiments, charge transfer channel 4-412 may be configured to transfer charge carriers from a photodetection region to a drain region, charge transfer channel 4-414 may be configured to transfer charge carriers from the photodetection region to a first charge storage region, and charge transfer channel 4-416 may be configured to transfer charge carriers from the photodetection region to a second charge storage region.

Figures 1, 2, 3, 4, 5, 5A:
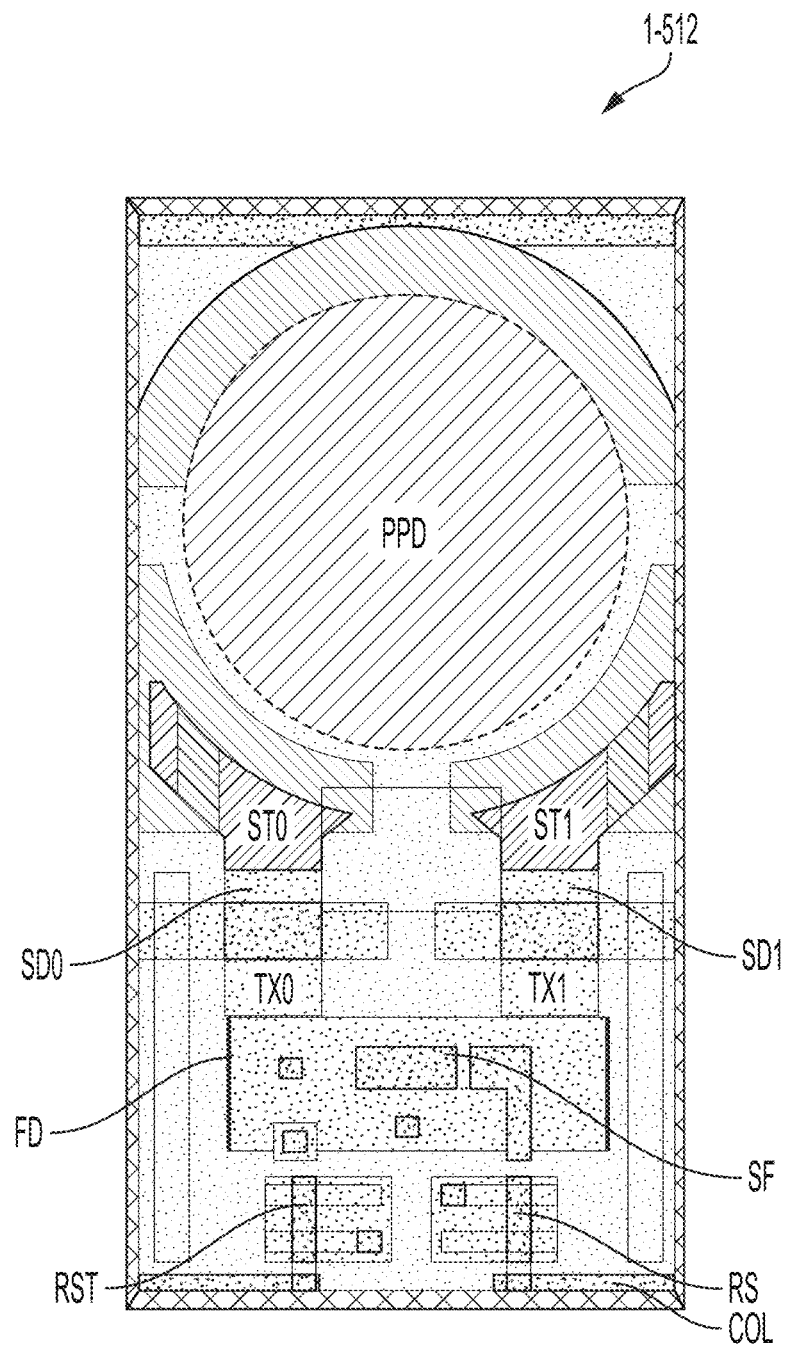

FIG. 4-5A is a time graph illustrating balanced, DC offset, sinusoidal control signals 4-502, 4-504, and 4-506 that may be configured to drive a plurality of transfer gates of a pixel, according to some embodiments. In some embodiments, control signals 4-502, 4-504, and 4-506 may be configured in the manner described herein for control signals 4-402, 4-404, and 4-406 including in connection with FIGS. 4-4A and 4-4B. Additionally, at least some of control signals 4-502, 4-504, and 4-506 may be DC offset from one another by operating about different center voltages. In FIG. 4-5A, control signals 4-502 and 4-506 operate about a same voltage (e.g., ground), and control signal 4-504 operates about a different voltage (e.g., 0.5 V) than control signals 4-502 and 4-506. In FIG. 4-5A, control signals 4-502, 4-504, and 4-506 are shown out of phase from each other by approximately 120 degrees. As a result, in FIG. 4-5A, control signals 4-502, 4-504, and 4-506 are balanced, in that they sum, at least approximately, to a constant voltage (e.g., 0.5 V) at each point in time. In some embodiments, each control signal may be DC offset from one another by each operating about a different voltage.

Figures 1, 2, 3, 4, 5, 5B:
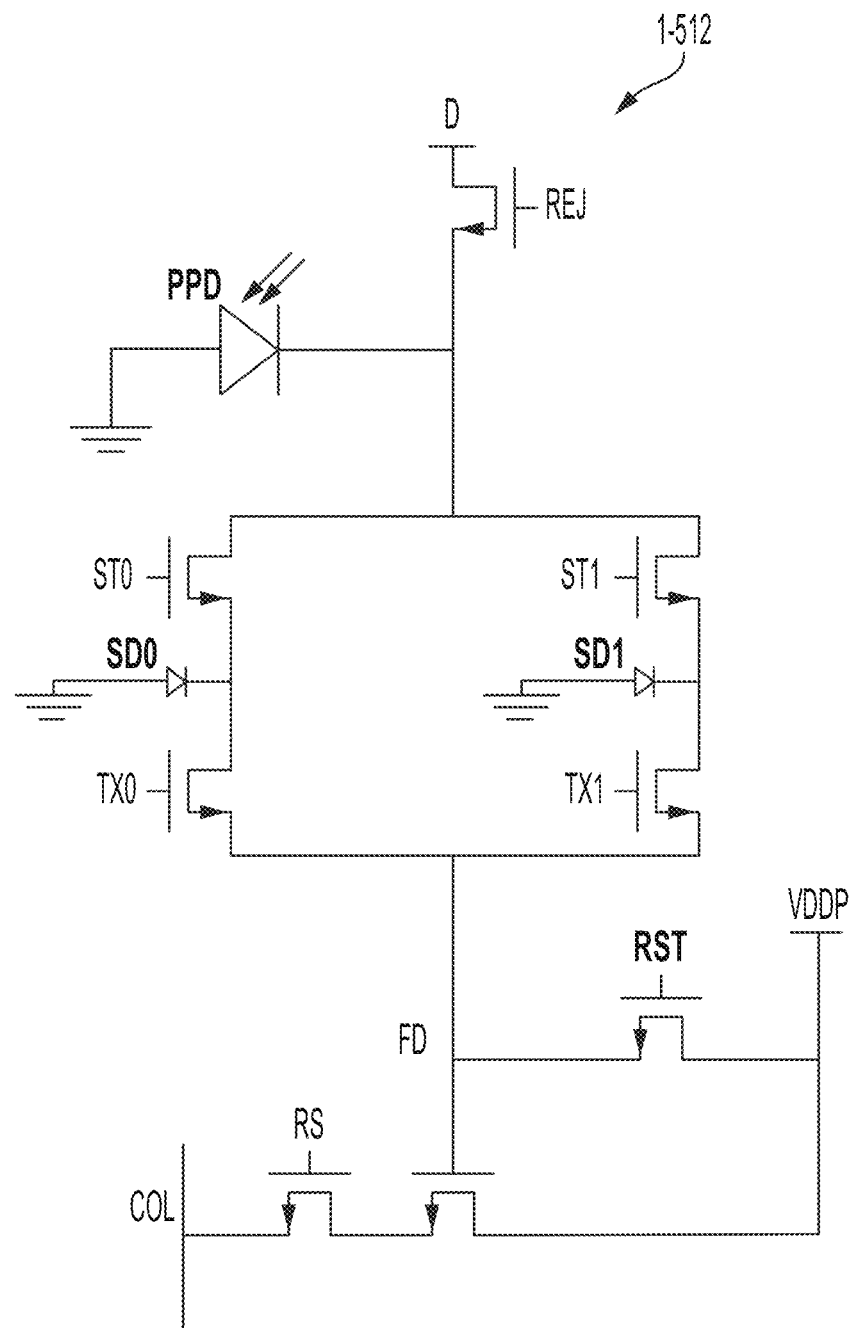

FIG. 4-5B is a time graph illustrating charge transfer in charge transfer channels 4-512, 4-514, and 4-516 in response to control signals 4-512, 4-514, and 4-516, respectively, according to some embodiments. In FIG. 4-5B, charge transfer channels 4-512 and 4-516 transfer charge carriers for shorter durations than charge transfer channel 4-514. For example, each charge transfer channel 4-512, 4-514, and 4-516 may have a same voltage threshold.

FIG. 4-6A is a time graph illustrating unbalanced, DC offset, sinusoidal control signals 4-602, 4-604, and 4-606 that may be configured to drive a plurality of transfer gates of a pixel, according to some embodiments. In some embodiments, control signals 4-602, 4-604, and 4-606 may be configured in the manner described herein for control signals 4-502, 4-504, and 4-506 including in connection with FIG. 4-5A. Additionally, in FIG. 4-6A, control signals 4-602, 4-604, and 4-606 are shown out of phase with one another, centered at different voltages, and having different voltage amplitudes. In FIG. 4-6A, control signals 4-602, 4-604, and 4-606 are shown out of phase from one another by approximately 120 degrees. In FIG. 4-6A, control signal 4-602 is shown having an amplitude of approximately 1.5 V centered at approximately −0.5 V, control signal 4-604 is shown having an amplitude of approximately 1.0 V centered at approximately 0.4 V, and control signal 4-606 is shown having an amplitude of approximately 1.0 V centered at approximately 0 V. As shown in FIG. 4-6A, control signals 4-602, 4-604, and 4-606 are unbalanced in that they sum to different voltages at different points in time.

FIG. 4-6B is a time graph illustrating charge transfer in charge transfer channels 4-612, 4-614, and 4-616 in response to receiving control signals 4-602, 4-604, and 4-606, respectively, according to some embodiments. As shown in FIG. 4-6B, charge transfer channel 4-614 may transfer charge carriers for a longer duration than charge transfer channel 4-616, which may transfer charge carriers for a longer duration than charge transfer channel 4-612. For example, control signal 4-604 may be configured to exceed the voltage threshold of charge transfer channel 4-614 for longer than control signals 4-606 and 4-602.

VI. Techniques Incorporating Optically Directive Structures

The inventors have also developed techniques for directing incident photons toward the photodetection region of a pixel to prevent the incident photons from generating noise charge carriers in other portions of the pixel that may reach the charge storage regions or from reaching neighboring pixels. In some embodiments, integrated circuits described herein may include one or more barriers configured to block incident photons from reaching the charge storage regions and generating noise charge carriers therein. For example, the barrier(s) may include an at least partially opaque metal barrier configured to block incident photons from reaching the charge storage region(s). In some embodiments, the barrier(s) may be positioned before the charge storage region(s) and/or transfer gate(s) in the direction in which the photodetection region is configured to receive incident light.

In some embodiments, integrated circuits described herein may include one or more optically directive structures configured to reflect and/or refract incident photons toward the photodetection region and/or away from the charge storage region(s). In some embodiments, the optically directive structure(s) may include a dielectric barrier configured to refract incident photons toward the photodetection region and/or away from the charge storage region(s). In some embodiments, the optically directive structure(s) may include a metal barrier configured to reflect incident photons toward the photodetection region and/or away from the charge storage region(s). In some embodiments, the optically directive structure(s) may include a surface of a pixel that is configured to receive and refract incident photons toward the photodetection region and/or away from the charge storage region(s), such as having a plurality of triangular openings.

Figures 1, 2, 3, 4, 5, 6:
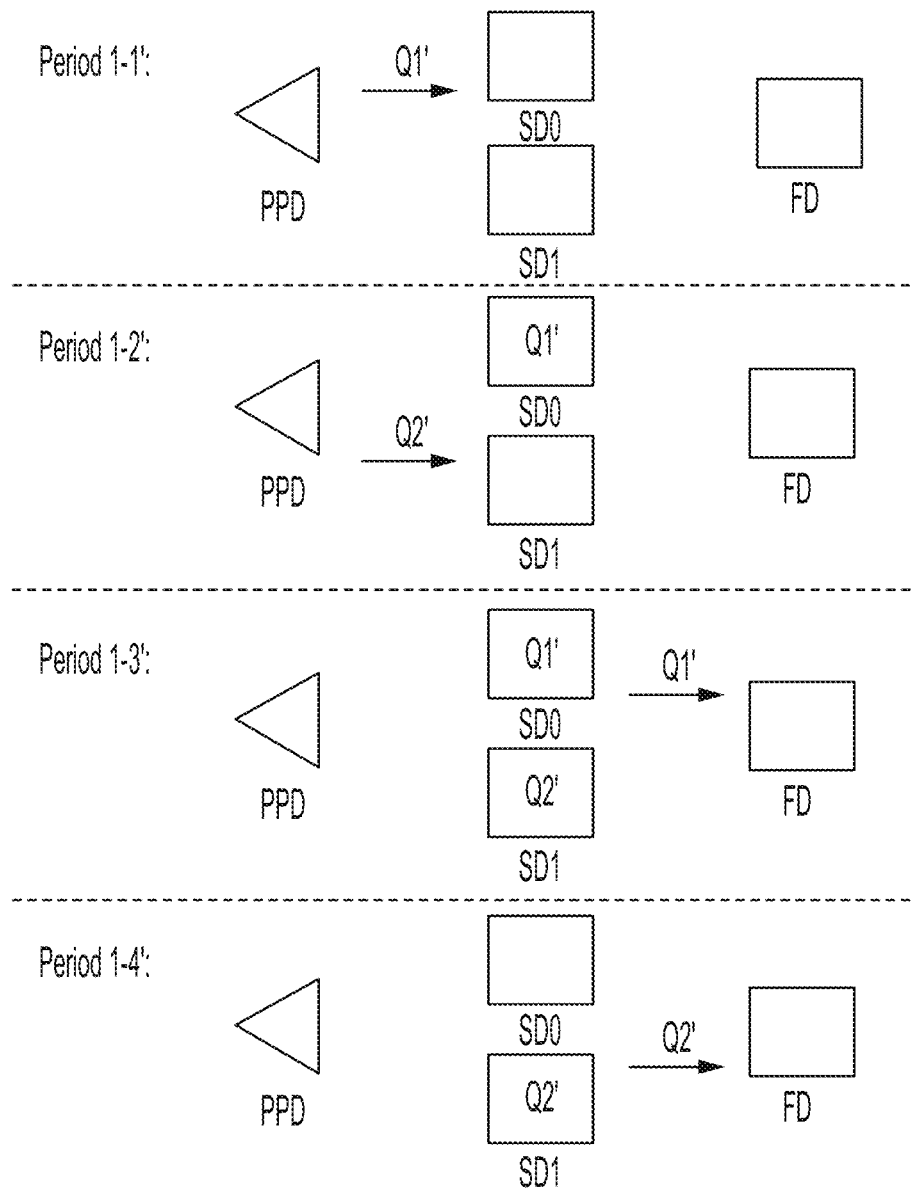
Figures 1, 2:
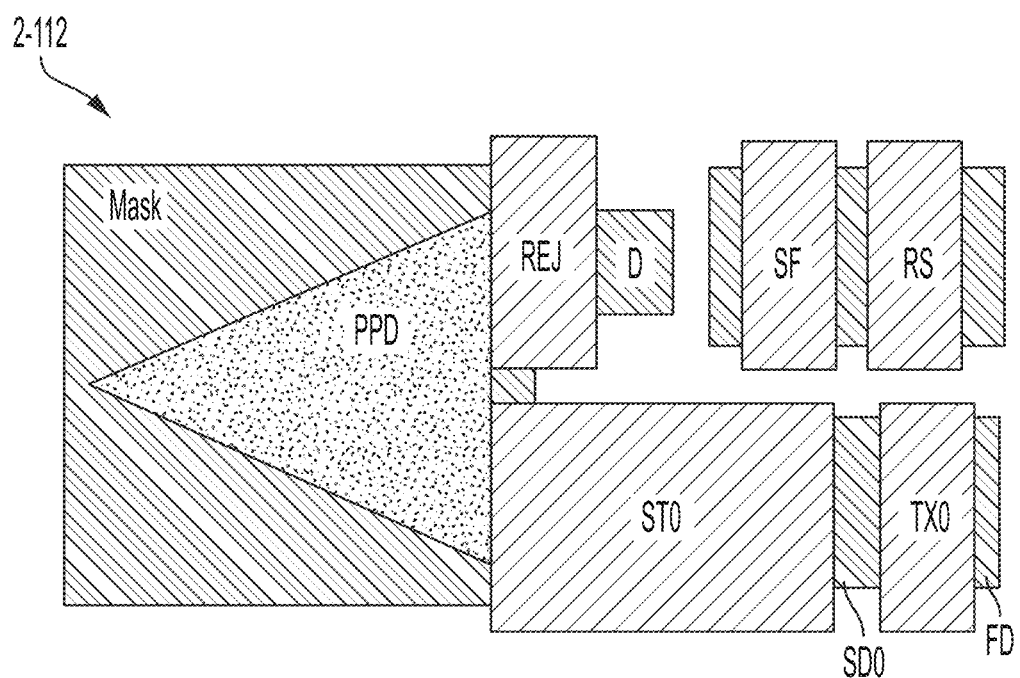
Figure 2:
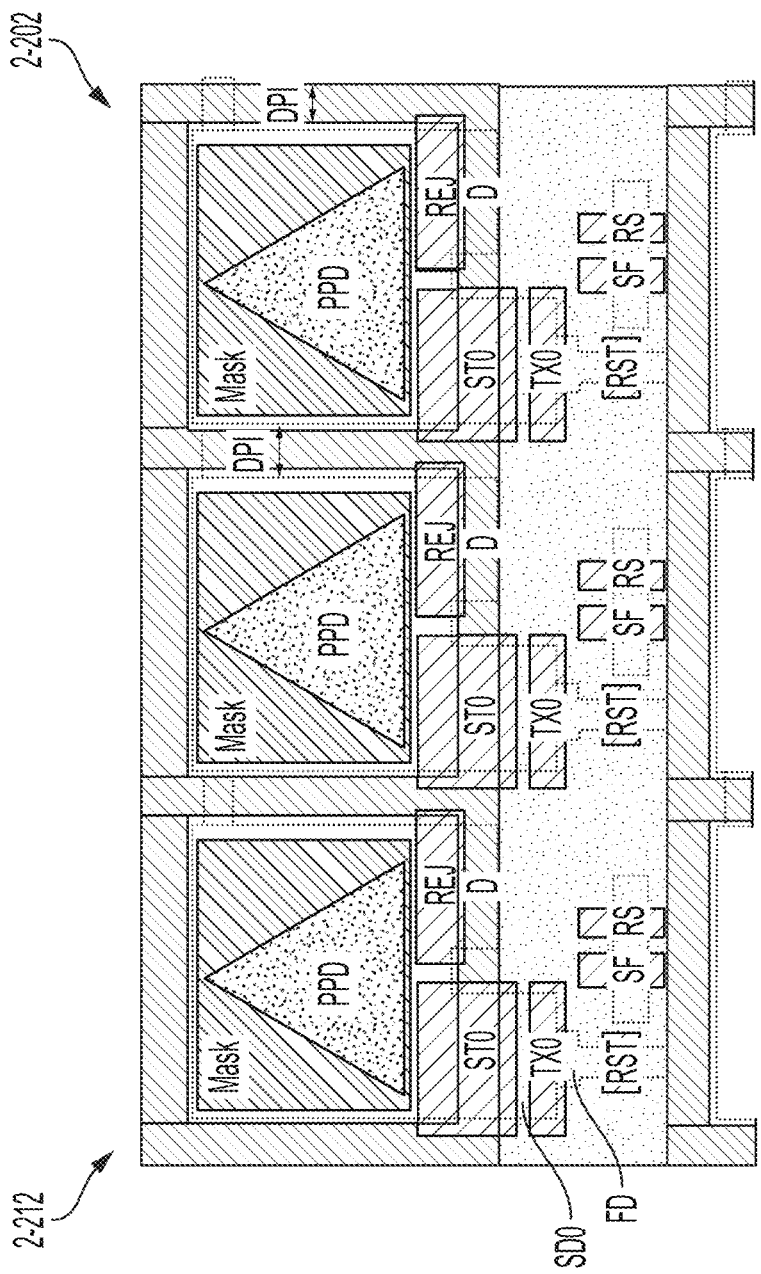
Figures 2, 3:
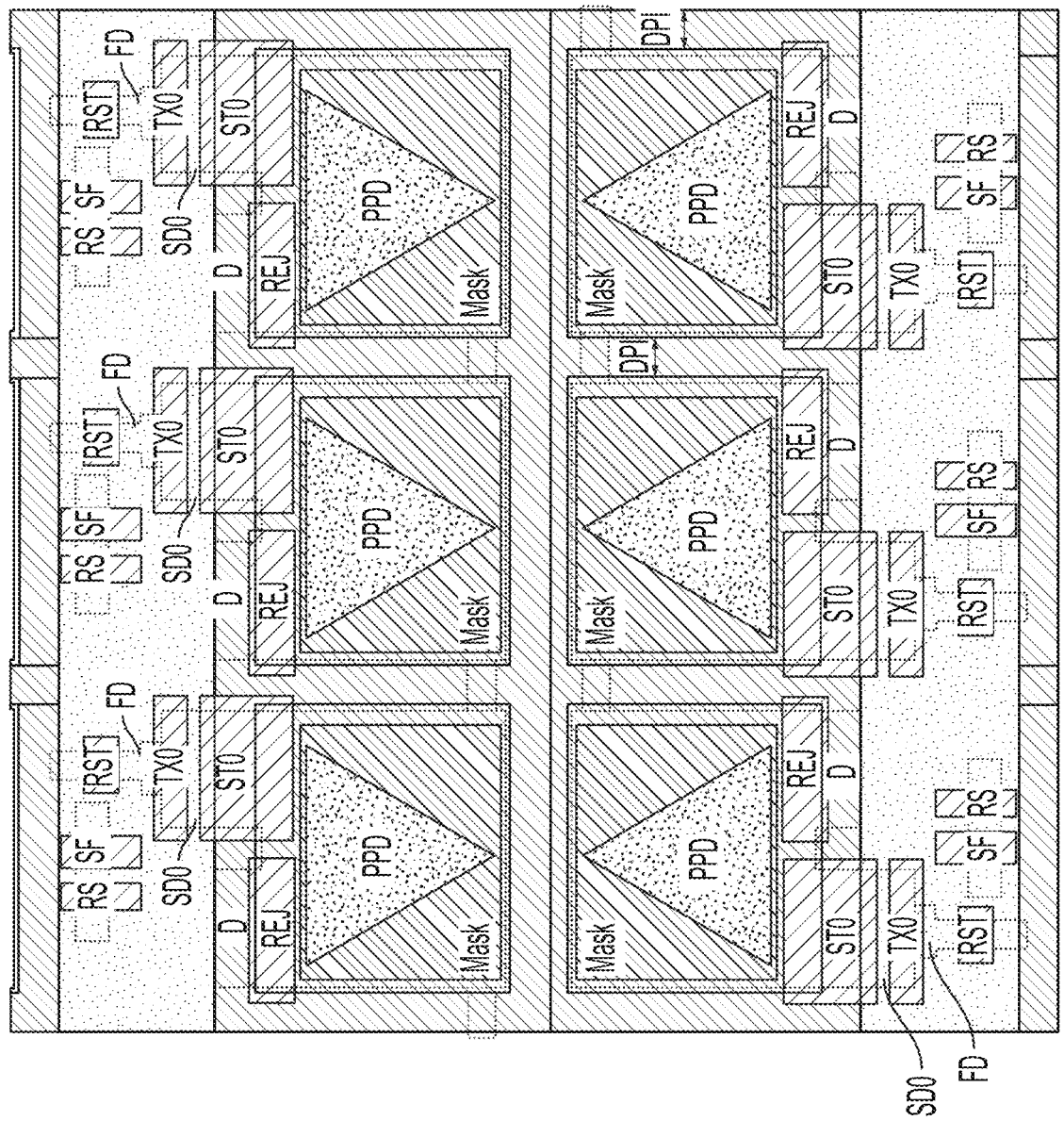
Figures 2, 3, 4:
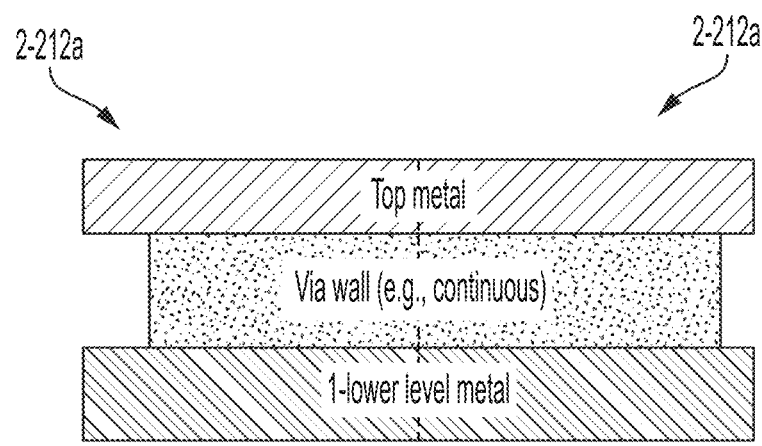

FIG. 6-1A is a time graph of excitation light 6-102 and fluorescence light 6-104 received at a photodetector during operation of integrated device 1-102, according to some embodiments. As shown in FIG. 6-1A, as typically an excitation pulse 6-102 precedes fluorescent emissions 6-104, such that the excitation pulse 6-102 illuminates a sample well and the fluorescent emissions 6-104 are generated in response. As shown in FIG. 6-1A, an excitation pulse 6-102 typically has greater luminance (lux) than the fluorescent emissions 6-104, resulting in more excitation photons incident towards the integrated device 1-102. In some embodiments, excitation light 6-102 may also have a higher frequency and greater energy than the fluorescent emission light 6-104. For example, the excitation light 6-102 may have a blue or green wavelength, such as less than 530 nm, with sufficient energy for generating the fluorescent light 6-104. In this example, the fluorescent light 6-104 may have a yellow or red wavelength, such as greater than 590 nm, and less energy than the excitation light 6-102.

FIG. 6-1B is a side view of a pixel 6-112 receiving the excitation light 6-102 and fluorescence light 6-104, according to some embodiments. In some embodiments, pixel 6-112 may be configured in the manner described for pixel 1-112 and/or any other pixel described herein. For instance, pixel 6-112 is illustrated including photodetection region PPD, charge storage region SD0, and transfer gate ST0. As shown in FIG. 6-1B, fluorescence light 6-102 and excitation light 6-104 may reach charge storage region SD0 through transfer gate ST0 and generate charge carriers in charge storage region SD0, thereby adding noise charge carriers to charge storage region SD0. For example, transfer gate ST0 may be at least partially transparent, thereby allowing incident photons to pass through transfer gate ST0.

FIG. 6-2A is a side view of an exemplary pixel 6-212 having a metal barrier receiving the excitation light 6-102 and fluorescence light 6-104, according to some embodiments. In some embodiments, pixel 6-212 may be configured in the manner described for pixel 6-112. Additionally, pixel 6-212 is shown including a metal barrier configured to block at least some photons from reaching charge storage region SD0 via the transfer gate ST0. As shown in FIG. 6-2A, the metal barrier may be a part of metal layer M0 (e.g., of metal layers 1-240) and positioned above transfer gate ST0 to extend over charge storage region SD0. In the illustrate configuration, metal layer M0 may be configured to block at least some photons from reaching the transfer gate ST0 and/or charge storage region SD0, thus reducing in the number of noise charge carriers that reach or are generated in charge storage region SD0. In some embodiments, metal layer M0 may be more opaque than transfer gate ST0.

FIG. 6-2B is a side view of pixel 6-212 illustrating charge carrier generation in pixel 6-212 in response to excitation light 6-102 and fluorescent emissions 6-104, according to some embodiments. As shown in FIG. 6-2B, the incident light may generate charge carriers in pixel 6-212 and enter photodetection region PPD and/or charge storage region SD0, adding noise charge carriers to charge storage region SD0. In some embodiments, including one or more drain layers as described herein may reduce the number of charge carriers that reach charge storage region SD0 via other portions of pixel 6-212.

FIG. 6-3 is a side view of exemplary pixel 6-312 having dielectric barriers 6-302 and 6-304 configured to direct incident light toward photodetection region PPD and away from charge storage region SD0, according to some embodiments. In some embodiments, pixel 6-312 may be configured in the manner described herein for pixel 6-112. Additionally, in FIG. 6-3, transfer gate ST0 is positioned after photodetection region PPD in the direction OPT in which photodetection region PPD is configured to receive incident photons. For example, pixel 6-312 may have a backside-illumination (BSI) configuration. In FIG. 6-3, incident photons received in photodetection region PPD may have traveled through at least part of the bulk semiconductor region of pixel 6-312 before reaching photodetection region PPD.

In some embodiments, barriers 6-302 and 6-304 may be configured to direct incident photons towards the photodetection region PPD. For instance, barriers 6-302 and 6-304 may have a dielectric material configured to refract incident photons away from the charge storage region SD0 and towards the photodetection region PPD. In some embodiments, the dielectric material may include an oxide material. In some embodiments, barriers 6-302 and 6-304 may be at least partially filled with dielectric material. For example, in some embodiments, the barrier may be entirely filled with dielectric material. In some embodiments, the barrier may be filled using multiple dielectric materials, such as having different dielectric constants. In some embodiments, such as illustrated in FIG. 6-3, pixel 6-312 may further include metal barrier of metal layer M0 configured to block at least some photons from reaching the charge storage region SD0$n$, as described herein including in connection with FIGS. 6-2A and 6-2B.

FIG. 6-4 is a side view of exemplary pixel 6-412 having one or more metal barriers 6-402 and 6-404 configured to direct incident light toward photodetection region PPD and away from charge storage region SD0, according to some embodiments. In some embodiments, pixel 6-412 may be configured in the manner described herein for pixel 6-112. In addition, pixel 6-412 is shown in FIG. 6-4 including metal barriers 6-402 and 6-404 configured to direct incident light towards the photodetection region PPD and away from the charge storage region SD0. As shown in FIG. 6-4, metal barriers 6-402 and 6-404 are oriented parallel to the direction OPT in which photodetection region PPD is configured to receive incident photons. In some embodiments, metal barriers 6-402 and 6-404 may be configured to reflect photons incident on pixel 6-412 at oblique angles. In FIG. 6-4, a third metal barrier of metal layer M0 may be oriented perpendicular to the direction OPT and configured to block incident photons from reaching charge storage region SD0. In some embodiments, metal barriers 6-402 and 6-404 may be further configured to block noise charge carriers from reaching charge storage region SD0.

FIG. 6-5 is a side view of exemplary pixel 6-512 having an optically-directive structure at a surface of pixel 6-512, according to some embodiments. In some embodiments, pixel 6-512 may be configured in the manner described for pixel 6-112. In addition, pixel 6-512 includes optically directive structure 6-506. For example, as illustrated in FIG. 6-5, optically-directive structure 6-506 is positioned on a surface of pixel 6-512 and is configured to direct incident photons towards the photodetection regions PPD-1 and PPD-2 and away from charge storage region SD0. As shown in FIG. 6-5, optically-directive structure 6-506 may include openings disposed along the surface of pixel 6-512. In particular, the openings are illustrated as triangular openings having bases disposed along the surface of pixel 6-512 and apexes pointed towards the photodetection regions PPD-1 and PPD-2. In some embodiments, the openings may include a dielectric material, such as a material having a refractive index greater than the bulk semiconductor region of pixel 6-512. For example, the openings may include a material having a greater dielectric constant than the bulk semiconductor region. In some embodiments, the illustrated portion of pixel 6-512 may have a thickness between 4 and 6 microns along the direction OPT.

Also shown in FIG. 6-5, pixel 6-512 may include barriers 6-502 and 6-504 configured to direct photons toward the photodetection regions PPD-1 and PPD-2 and away from charge storage region SD0. For instance, in FIG. 6-5, barriers 6-502 and 6-504 are elongated parallel to the direction OPT and positioned on opposite sides of the photodetection region PPD. In some embodiments, barriers 6-502 and 6-504 may be configured to reflect and/or refract the incident photons towards the photodetection regions PPD-1 and PPD-2. In one example, barriers 6-502 and 6-504 may be at least partially filled using a dielectric material, such as an oxide material. In another example, barriers 6-502 and 6-504 may be at least partially filled using an opaque material such as metal.

In some embodiments, such as illustrated in FIG. 6-5, pixel 6-512 may include a second photodetection region PPD-2 positioned between the optically-directive surface and the photodetection region PPD-1 to facilitate generation of charge carriers responsive to the reflected and/or refracted photons. It should be appreciated that any pixel embodiments described herein many include multiple photodetection regions as described herein, and that techniques described herein in connection with FIG. 6-5 may be incorporated into pixel embodiments having a single photodetection region.

In some embodiments, the openings of the optically directive surface may have a base length of approximately 0.5 microns and a height of approximately 0.3 microns from the center of the base to the apex. In some embodiments, the openings may have an equilateral-triangular cross-section. In some embodiments, the openings may have other types of triangular or non-triangular cross-sections.

In some embodiments, an optically directive structure may be manufactured at least in part by removing some of the substrate layer(s) (e.g., of pixel 6-512) to create openings. For instance, the portions of the substrate layer(s) removed to create the openings may have substantially square cross-sections perpendicular to the optical axis, resulting in substantially pyramid shaped openings. In one example, the openings may be created using wet-etching, such as using potassium hydroxide (KOH). It should be appreciated that other manufacturing (e.g., etching) techniques may be used alternatively or additionally, such as dry-etching, (e.g., plasma-based etching).

It should be appreciated that techniques described herein in connection with BSI pixels may be alternatively incorporated in frontside illumination (FSI) pixels, and vice versa, as embodiments described herein are not so limited.

VII. DNA and/or RNA Sequencing Applications

An analytic system described herein may include an integrated device and an instrument configured to interface with the integrated device. The integrated device may include an array of pixels, where a pixel includes a reaction chamber and at least one photodetector. A surface of the integrated device may have a plurality of reaction chambers, where a reaction chamber is configured to receive a sample from a suspension placed on the surface of the integrated device. A suspension may contain multiple samples of a same type, and in some embodiments, different types of samples. In this regard, the phrase "sample of interest" as used herein can refer to a plurality of samples of a same type that are dispersed in a suspension, for example. Similarly, the phrase "molecule of interest" as used herein can refer to a plurality of molecules of a same type that are dispersed in a suspension. The plurality of reaction chambers may have a suitable size and shape such that at least a portion of the reaction chambers receive one sample from a suspension. In some embodiments, the number of samples within a reaction chamber may be distributed among the reaction chambers such that some reaction chambers contain one sample with others contain zero, two or more samples.

In some embodiments, a suspension may contain multiple single-stranded DNA templates, and individual reaction chambers on a surface of an integrated device may be sized and shaped to receive a sequencing template. Sequencing templates may be distributed among the reaction chambers of the integrated device such that at least a portion of the reaction chambers of the integrated device contain a sequencing template. The suspension may also contain labeled nucleotides which then enter in the reaction chamber and may allow for identification of a nucleotide as it is incorporated into a strand of DNA complementary to the single-stranded DNA template in the reaction chamber. In some embodiments, the suspension may contain sequencing templates and labeled nucleotides may be subsequently introduced to a reaction chamber as nucleotides are incorporated into a complementary strand within the reaction chamber. In this manner, timing of incorporation of nucleotides may be controlled by when labeled nucleotides are introduced to the reaction chambers of an integrated device.

Excitation light is provided from an excitation source located separate from the pixel array of the integrated device. The excitation light is directed at least in part by elements of the integrated device towards one or more pixels to illuminate an illumination region within the reaction chamber. A marker may then emit emission light when located within the illumination region and in response to being illuminated by excitation light. In some embodiments, one or more excitation sources are part of the instrument of the system where components of the instrument and the integrated device are configured to direct the excitation light towards one or more pixels.

Emission light emitted from a reaction chamber (e.g., by a fluorescent label) may then be detected by one or more photodetectors within a pixel of the integrated device. Characteristics of the detected emission light may provide an indication for identifying the marker associated with the emission light. Such characteristics may include any suitable type of characteristic, including an arrival time of photons detected by a photodetector, an amount of photons accumulated over time by a photodetector, and/or a distribution of photons across two or more photodetectors. In some embodiments, a photodetector may have a configuration that allows for the detection of one or more timing characteristics associated with emission light (e.g., fluorescence lifetime). The photodetector may detect a distribution of photon arrival times after a pulse of excitation light propagates through the integrated device, and the distribution of arrival times may provide an indication of a timing characteristic of the emission light (e.g., a proxy for fluorescence lifetime). In some embodiments, the one or more photodetectors provide an indication of the probability of emission light emitted by the marker (e.g., fluorescence intensity). In some embodiments, a plurality of photodetectors may be sized and arranged to capture a spatial distribution of the emission light. Output signals from the one or more photodetectors may then be used to distinguish a marker from among a plurality of markers, where the plurality of markers may be used to identify a sample or its structure. In some embodiments, a sample may be excited by multiple excitation energies, and emission light and/or timing characteristics of the emission light from the reaction chamber in response to the multiple excitation energies may distinguish a marker from a plurality of markers.

A schematic overview of the system 5-100 is illustrated in FIG. 5-1A. The system comprises both an integrated device 5-102 that interfaces with an instrument 5-104. In some embodiments, instrument 5-104 may include one or more excitation sources 5-106 integrated as part of instrument 5-104. In some embodiments, an excitation source may be external to both instrument 5-104 and integrated device 5-102, and instrument 5-104 may be configured to receive excitation light from the excitation source and direct excitation light to the integrated device. The integrated device may interface with the instrument using any suitable socket for receiving the integrated device and holding it in precise optical alignment with the excitation source. The excitation source 5-106 may be configured to provide excitation light to the integrated device 5-102. As illustrated schematically in FIG. 5-1A, the integrated device 5-102 has a plurality of pixels 5-112, where at least a portion of pixels may perform independent analysis of a sample of interest. Such pixels 5-112 may be referred to as "passive source pixels" since a pixel receives excitation light from a source 5-106 separate from the pixel, where excitation light from the source excites some or all of the pixels 5-112. Excitation source 5-106 may be any suitable light source. Examples of suitable excitation sources are described in U.S. patent application Ser. No. 14/821,688, filed Aug. 7, 2015, titled "INTEGRATED DEVICE FOR PROBING, DETECTING AND ANALYZING MOLECULES," which is incorporated by reference in its entirety. In some embodiments, excitation source 5-106 includes multiple excitation sources that are combined to deliver excitation light to integrated device 5-102. The multiple excitation sources may be configured to produce multiple excitation energies or wavelengths.

A pixel 5-112 has a reaction chamber 5-108 configured to receive a single sample of interest and a photodetector 5-110 for detecting emission light emitted from the reaction chamber in response to illuminating the sample and at least a portion of the reaction chamber 5-108 with excitation light provided by the excitation source 5-106. In some embodiments, reaction chamber 5-108 may retain the sample in proximity to a surface of integrated device 5-102, which may ease delivery of excitation light to the sample and detection of emission light from the sample or a reaction component (e.g., a labeled nucleotide).

Optical elements for coupling excitation light from excitation light source 5-106 to integrated device 5-102 and guiding excitation light to the reaction chamber 5-108 are located both on integrated device 5-102 and the instrument 5-104. Source-to-chamber optical elements may comprise one or more grating couplers located on integrated device 5-102 to couple excitation light to the integrated device and waveguides to deliver excitation light from instrument 5-104 to reaction chambers in pixels 5-112. One or more optical splitter elements may be positioned between a grating coupler and the waveguides. The optical splitter may couple excitation light from the grating coupler and deliver excitation light to at least one of the waveguides. In some embodiments, the optical splitter may have a configuration that allows for delivery of excitation light to be substantially uniform across all the waveguides such that each of the waveguides receives a substantially similar amount of excitation light. Such embodiments may improve performance of the integrated device by improving the uniformity of excitation light received by reaction chambers of the integrated device.

Reaction chamber 5-108, a portion of the excitation source-to-chamber optics, and the reaction chamber-to-photodetector optics are located on integrated device 5-102. Excitation source 5-106 and a portion of the source-to-chamber components are located in instrument 5-104. In some embodiments, a single component may play a role in both coupling excitation light to reaction chamber 5-108 and delivering emission light from reaction chamber 5-108 to photodetector 5-110. Examples of suitable components, for coupling excitation light to a reaction chamber and/or directing emission light to a photodetector, to include in an integrated device are described in U.S. patent application Ser. No. 14/821,688, filed Aug. 7, 2015, titled "INTEGRATED DEVICE FOR PROBING, DETECTING AND ANALYZING MOLECULES," and U.S. patent application Ser. No. 14/543,865, filed Nov. 17, 2014, titled "INTEGRATED DEVICE WITH EXTERNAL LIGHT SOURCE FOR PROBING, DETECTING, AND ANALYZING MOLECULES," both of which are incorporated by reference in their entirety.

Pixel 5-112 is associated with its own individual reaction chamber 5-108 and at least one photodetector 5-110. The plurality of pixels of integrated device 5-102 may be arranged to have any suitable shape, size, and/or dimensions. Integrated device 5-102 may have any suitable number of pixels. The number of pixels in integrated device 5-102 may be in the range of approximately 10,000 pixels to 1,000,000 pixels or any value or range of values within that range. In some embodiments, the pixels may be arranged in an array of 512 pixels by 512 pixels. Integrated device 5-102 may interface with instrument 5-104 in any suitable manner. In some embodiments, instrument 5-104 may have an interface that detachably couples to integrated device 5-102 such that a user may attach integrated device 5-102 to instrument 5-104 for use of integrated device 5-102 to analyze at least one sample of interest in a suspension and remove integrated device 5-102 from instrument 5-104 to allow for another integrated device to be attached. The interface of instrument 5-104 may position integrated device 5-102 to couple with circuitry of instrument 5-104 to allow for readout signals from one or more photodetectors to be transmitted to instrument 5-104. Integrated device 5-102 and instrument 5-104 may include multi-channel, high-speed communication links for handling data associated with large pixel arrays (e.g., more than 10,000 pixels).

A cross-sectional schematic of integrated device 5-102 illustrating a row of pixels 5-112 is shown in FIG. 5-1B. Integrated device 5-102 may include coupling region 5-201, routing region 5-202, and pixel region 5-203. Pixel region 5-203 may include a plurality of pixels 5-112 having reaction chambers 5-108 positioned on a surface at a location separate from coupling region 5-201, which is where excitation light (shown as the dashed arrow) couples to integrated device 5-102. Reaction chambers 5-108 may be formed through metal layer(s) 5-116. One pixel 5-112, illustrated by the dotted rectangle, is a region of integrated device 5-102 that includes a reaction chamber 5-108 and a photodetection region having one or more photodetectors 5-110.

FIG. 5-1B illustrates the path of excitation (shown in dashed lines) by coupling a beam of excitation light to coupling region 5-201 and to reaction chambers 5-108. The row of reaction chambers 5-108 shown in FIG. 5-1B may be positioned to optically couple with waveguide 5-220. Excitation light may illuminate a sample located within a reaction chamber. The sample or a reaction component (e.g., fluorescent label) may reach an excited state in response to being illuminated by the excitation light. When in an excited state, the sample or reaction component may emit emission light, which may be detected by one or more photodetectors associated with the reaction chamber. FIG. 5-1B schematically illustrates the path of emission light (shown as the solid line) from a reaction chamber 5-108 to photodetector(s) 5-110 of pixel 5-112. The photodetector(s) 5-110 of pixel 5-112 may be configured and positioned to detect emission light from reaction chamber 5-108. Examples of suitable photodetectors are described in U.S. patent application Ser. No. 14/821,656, filed Aug. 7, 2015, titled "INTEGRATED DEVICE FOR TEMPORAL BINNING OF RECEIVED PHOTONS," which is incorporated by reference in its entirety. For an individual pixel 5-112, a reaction chamber 5-108 and its respective photodetector(s) 5-110 may be aligned along a common axis (along the y-direction shown in FIG. 5-1B). In this manner, the photodetector(s) may overlap with the reaction chamber within a pixel 5-112.

The directionality of the emission light from a reaction chamber 5-108 may depend on the positioning of the sample in the reaction chamber 5-108 relative to metal layer(s) 5-116 because metal layer(s) 5-116 may act to reflect emission light. In this manner, a distance between metal layer(s) 5-116 and a fluorescent marker positioned in a reaction chamber 5-108 may impact the efficiency of photodetector(s) 5-110, that are in the same pixel as the reaction chamber, to detect the light emitted by the fluorescent marker. The distance between metal layer(s) 5-116 and the bottom surface of a reaction chamber 5-106, which is proximate to where a sample may be positioned during operation, may be in the range of 100 nm to 500 nm, or any value or range of values in that range. In some embodiments the distance between metal layer(s) 5-116 and the bottom surface of a reaction chamber 5-108 is approximately 300 nm.

The distance between the sample and the photodetector(s) may also impact efficiency in detecting emission light. By decreasing the distance light has to travel between the sample and the photodetector(s), detection efficiency of emission light may be improved. In addition, smaller distances between the sample and the photodetector(s) may allow for pixels that occupy a smaller area footprint of the integrated device, which can allow for a higher number of pixels to be included in the integrated device. The distance between the bottom surface of a reaction chamber 5-108 and photodetector(s) may be in the range of 1 µm to 15 µm, or any value or range of values in that range.

Photonic structure(s) 5-230 may be positioned between reaction chambers 5-108 and photodetectors 5-110 and configured to reduce or prevent excitation light from reaching photodetectors 5-110, which may otherwise contribute to signal noise in detecting emission light. As shown in FIG. 5-1B, the one or more photonic structures 5-230 may be positioned between waveguide 5-220 and photodetectors 5-110. Photonic structure(s) 5-230 may include one or more optical rejection photonic structures including a spectral filter, a polarization filter, and a spatial filter. Photonic structure(s) 5-230 may be positioned to align with individual reaction chambers 5-108 and their respective photodetector(s) 5-110 along a common axis. Metal layers 5-240, which may act as a circuitry for integrated device 5-102, may also act as a spatial filter, in accordance with some embodiments. In such embodiments, one or more metal layers 5-240 may be positioned to block some or all excitation light from reaching photodetector(s) 5-110.

Coupling region 5-201 may include one or more optical components configured to couple excitation light from an external excitation source. Coupling region 5-201 may include grating coupler 5-216 positioned to receive some or all of a beam of excitation light. Examples of suitable grating couplers are described in U.S. patent application Ser. No. 15/844,403, filed Dec. 15, 2017, titled "OPTICAL COUPLER AND WAVEGUIDE SYSTEM," which is incorporated by reference in its entirety. Grating coupler 5-216 may couple excitation light to waveguide 5-220, which may be configured to propagate excitation light to the proximity of one or more reaction chambers 5-108. Alternatively, coupling region 5-201 may comprise other well-known structures for coupling light into a waveguide.

Components located off of the integrated device may be used to position and align the excitation source 5-106 to the integrated device. Such components may include optical components including lenses, mirrors, prisms, windows, apertures, attenuators, and/or optical fibers. Additional mechanical components may be included in the instrument to allow for control of one or more alignment components. Such mechanical components may include actuators, stepper motors, and/or knobs. Examples of suitable excitation sources and alignment mechanisms are described in U.S. patent application Ser. No. 15/161,088, filed May 20, 2016, titled "PULSED LASER AND SYSTEM," which is incorporated by reference in its entirety. Another example of a beam-steering module is described in U.S. patent application Ser. No. 15/842,720, filed Dec. 14, 2017, titled "COMPACT BEAM SHAPING AND STEERING ASSEMBLY," which is incorporated herein by reference.

A sample to be analyzed may be introduced into reaction chamber 5-108 of pixel 5-112. The sample may be a biological sample or any other suitable sample, such as a chemical sample. In some cases, the suspension may include multiple molecules of interest and the reaction chamber may be configured to isolate a single molecule. In some instances, the dimensions of the reaction chamber may act to confine a single molecule within the reaction chamber, allowing measurements to be performed on the single molecule. Excitation light may be delivered into the reaction chamber 5-108, so as to excite the sample or at least one fluorescent marker attached to the sample or otherwise associated with the sample while it is within an illumination area within the reaction chamber 5-108.

In operation, parallel analyses of samples within the reaction chambers are carried out by exciting some or all of the samples within the reaction chambers using excitation light and detecting signals with the photodetectors that are representative of emission light from the reaction chambers. Emission light from a sample or reaction component (e.g., fluorescent label) may be detected by a corresponding photodetector and converted to at least one electrical signal. The electrical signals may be transmitted along conducting lines (e.g., metal layers 5-240) in the circuitry of the integrated device, which may be connected to an instrument interfaced with the integrated device. The electrical signals may be subsequently processed and/or analyzed. Processing or analyzing of electrical signals may occur on a suitable computing device either located on or off the instrument.

Instrument 5-104 may include a user interface for controlling operation of instrument 5-104 and/or integrated device 5-102. The user interface may be configured to allow a user to input information into the instrument, such as commands and/or settings used to control the functioning of the instrument. In some embodiments, the user interface may include buttons, switches, dials, and a microphone for voice commands. The user interface may allow a user to receive feedback on the performance of the instrument and/or integrated device, such as proper alignment and/or information obtained by readout signals from the photodetectors on the integrated device. In some embodiments, the user interface may provide feedback using a speaker to provide audible feedback. In some embodiments, the user interface may include indicator lights and/or a display screen for providing visual feedback to a user.

In some embodiments, instrument 5-104 may include a computer interface configured to connect with a computing device. Computer interface may be a USB interface, a FireWire interface, or any other suitable computer interface. Computing device may be any general purpose computer, such as a laptop or desktop computer. In some embodiments, computing device may be a server (e.g., cloud-based server) accessible over a wireless network via a suitable computer interface. The computer interface may facilitate communication of information between instrument 5-104 and the computing device. Input information for controlling and/or configuring the instrument 5-104 may be provided to the computing device and transmitted to instrument 5-104 via the computer interface. Output information generated by instrument 5-104 may be received by the computing device via the computer interface. Output information may include feedback about performance of instrument 5-104, performance of integrated device 5-112, and/or data generated from the readout signals of photodetector 5-110.

In some embodiments, instrument 5-104 may include a processing device configured to analyze data received from one or more photodetectors of integrated device 5-102 and/or transmit control signals to excitation source(s) 2-106. In some embodiments, the processing device may comprise a general purpose processor, a specially-adapted processor (e.g., a central processing unit (CPU) such as one or more microprocessor or microcontroller cores, a field-programmable gate array (FPGA), an application-specific integrated circuit (ASIC), a custom integrated circuit, a digital signal processor (DSP), or a combination thereof.) In some embodiments, the processing of data from one or more photodetectors may be performed by both a processing device of instrument 5-104 and an external computing device. In other embodiments, an external computing device may be omitted and processing of data from one or more photodetectors may be performed solely by a processing device of integrated device 5-102.

Figures 1A, 5:
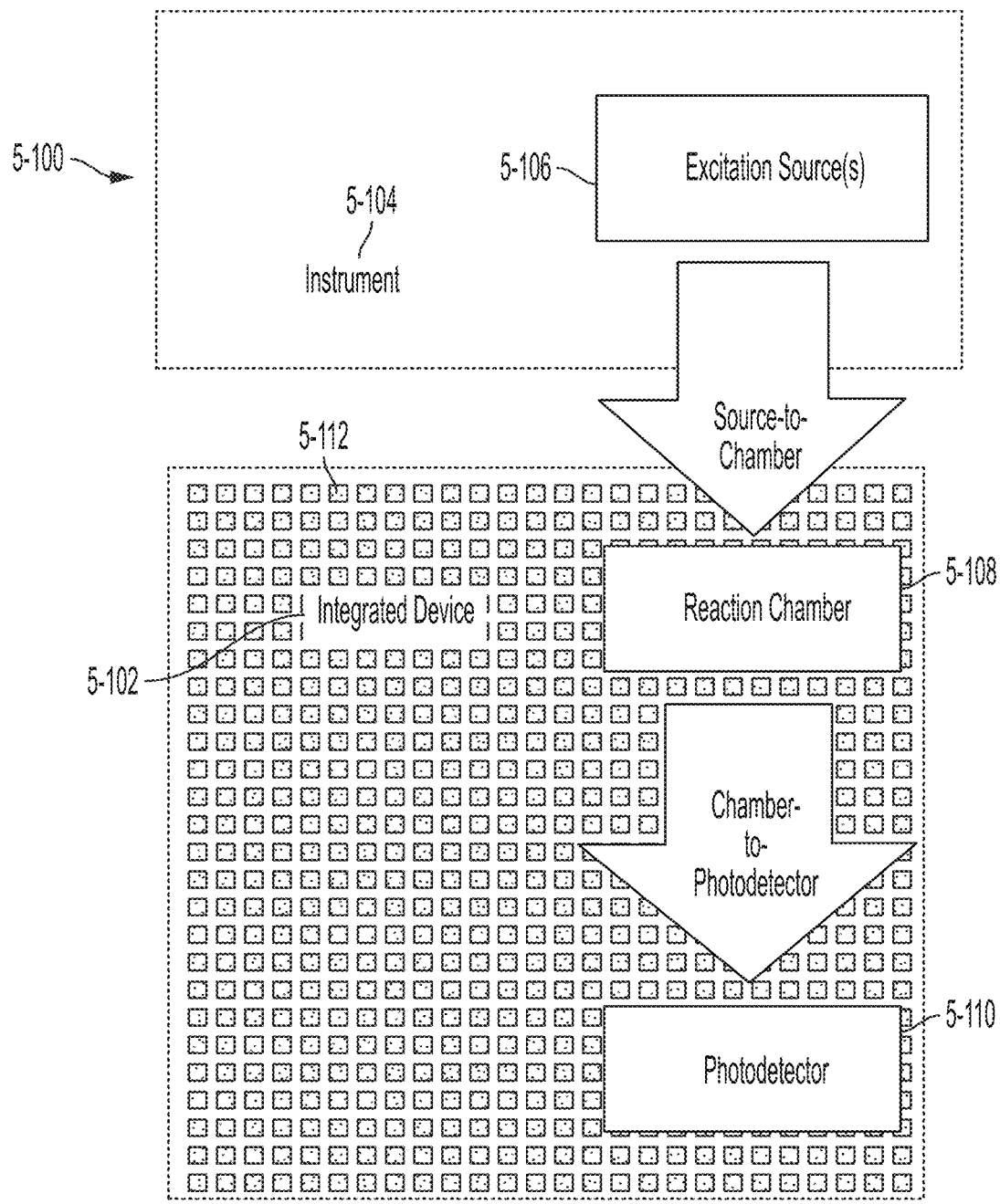
Figures 1B, 5:
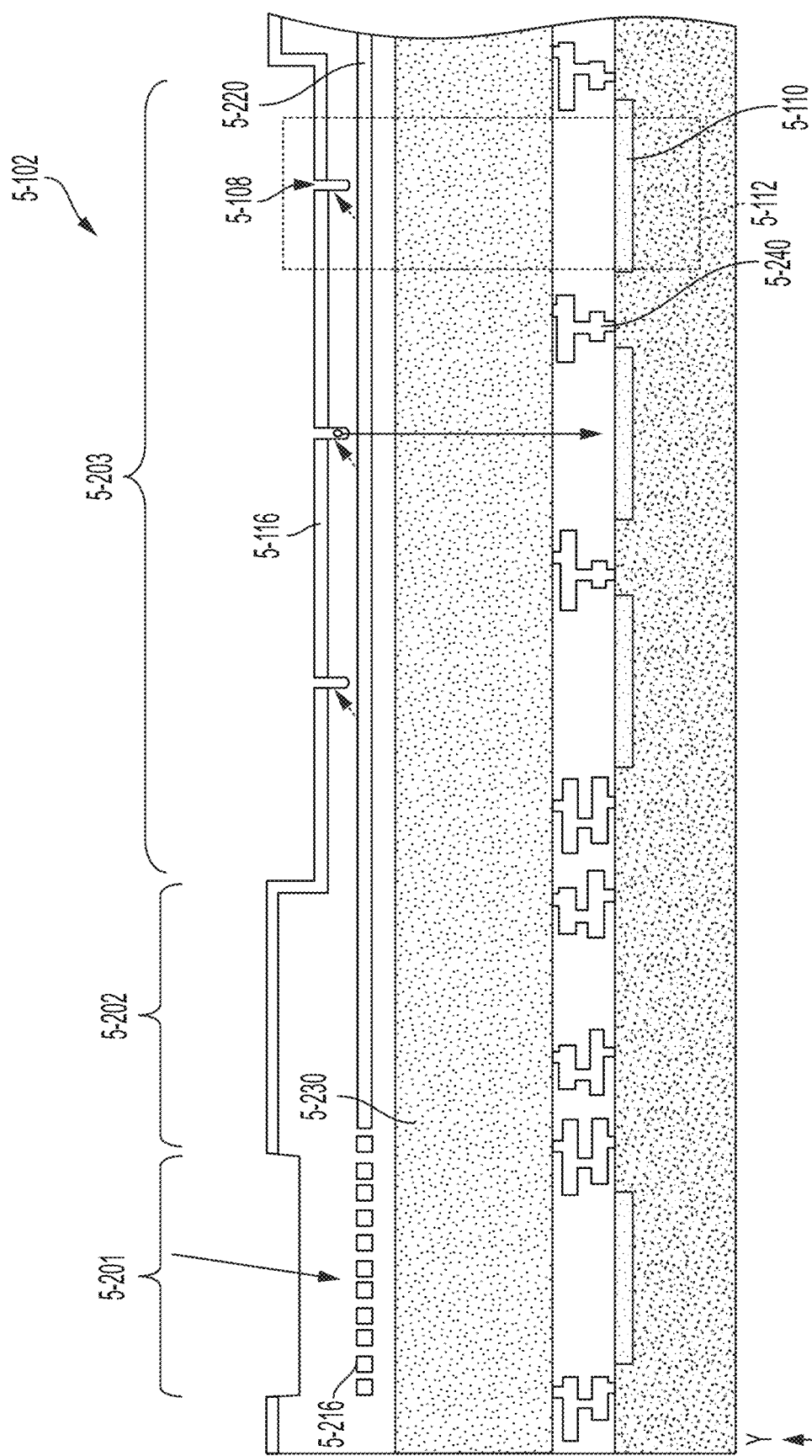
Figures 1C, 5:
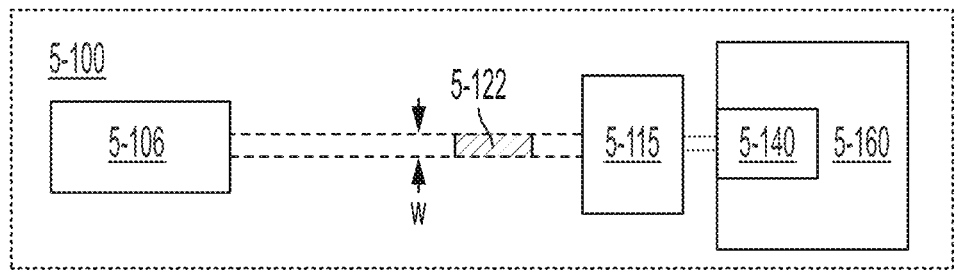

Referring to FIG. 5-1C, a portable, advanced analytic instrument 5-100 can comprise one or more pulsed optical sources 5-106 mounted as a replaceable module within, or otherwise coupled to, the instrument 5-100. The portable analytic instrument 5-100 can include an optical coupling system 5-115 and an analytic system 5-160. The optical coupling system 5-115 can include some combination of optical components (which may include, for example, none, one from among, or more than one component from among the following components: lens, mirror, optical filter, attenuator, beam-steering component, beam shaping component) and be configured to operate on and/or couple output optical pulses 5-122 from the pulsed optical source 5-106 to the analytic system 5-160. The analytic system 5-160 can include a plurality of components that are arranged to direct the optical pulses to at least one reaction chamber for sample analysis, receive one or more optical signals (e.g., fluorescence, backscattered radiation) from the at least one reaction chamber, and produce one or more electrical signals representative of the received optical signals. In some embodiments, the analytic system 5-160 can include one or more photodetectors and may also include signal-processing electronics (e.g., one or more microcontrollers, one or more field-programmable gate arrays, one or more microprocessors, one or more digital signal processors, logic gates, etc.) configured to process the electrical signals from the photodetectors. The analytic system 5-160 can also include data transmission hardware configured to transmit and receive data to and from external devices (e.g., one or more external devices on a network to which the instrument 5-100 can connect via one or more data communications links). In some embodiments, the analytic system 5-160 can be configured to receive a bio-optoelectronic chip 5-140, which holds one or more samples to be analyzed.

Figures 1D, 5:
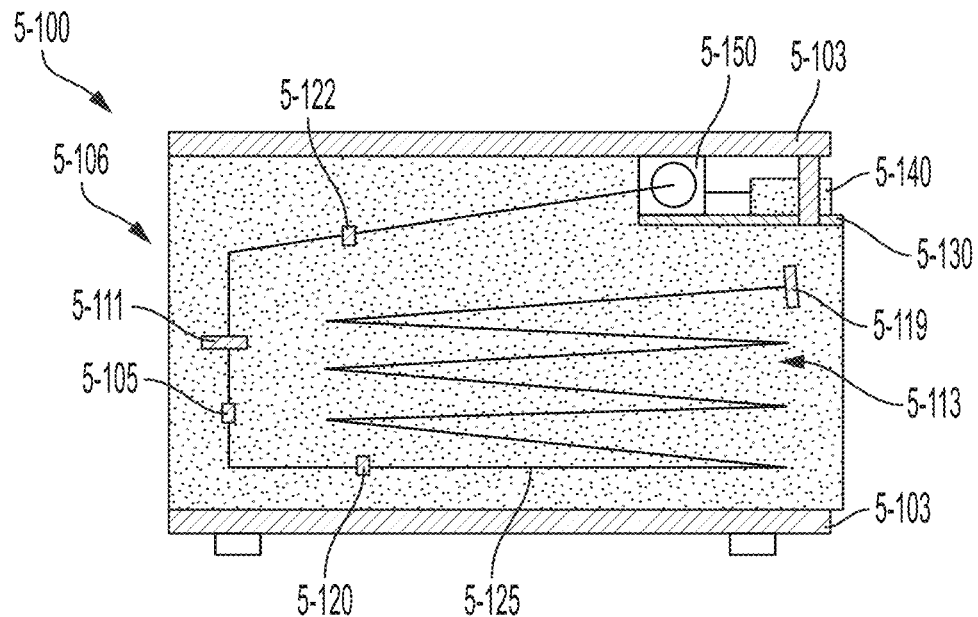
Figures 2, 5:
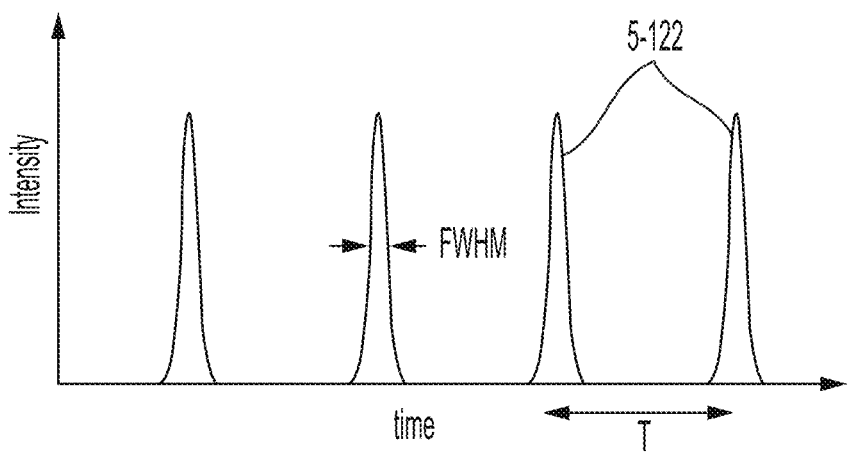
Figures 3, 5:
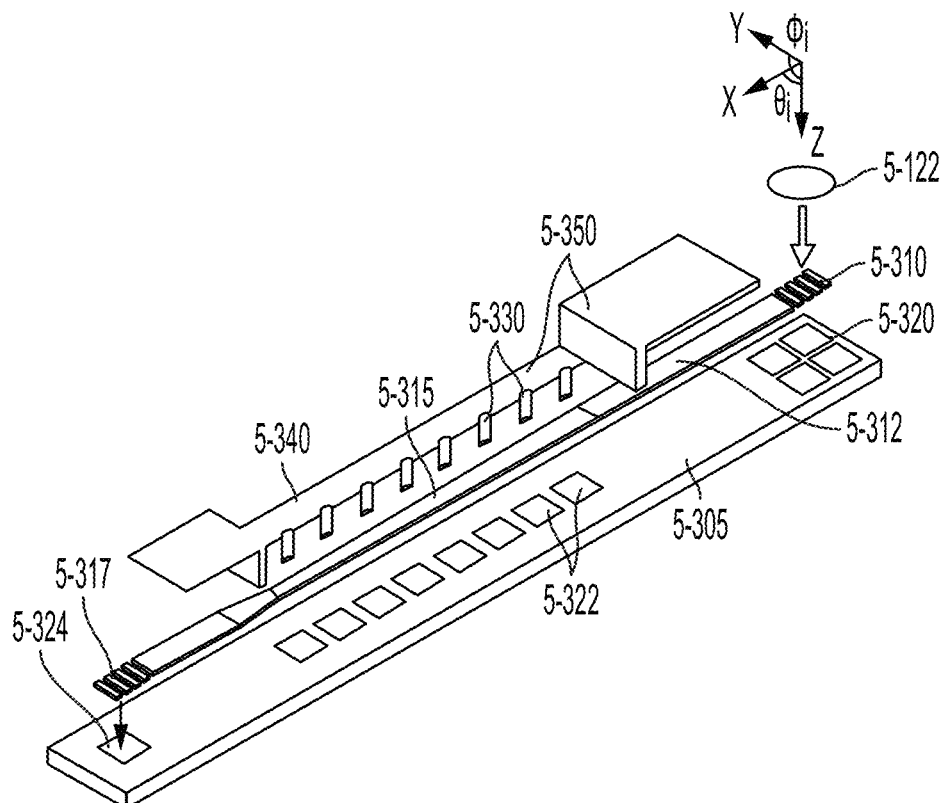
Figures 4, 5:
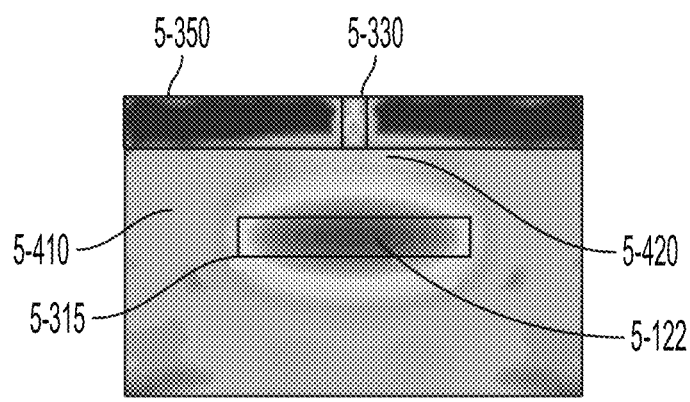
Figure 5:
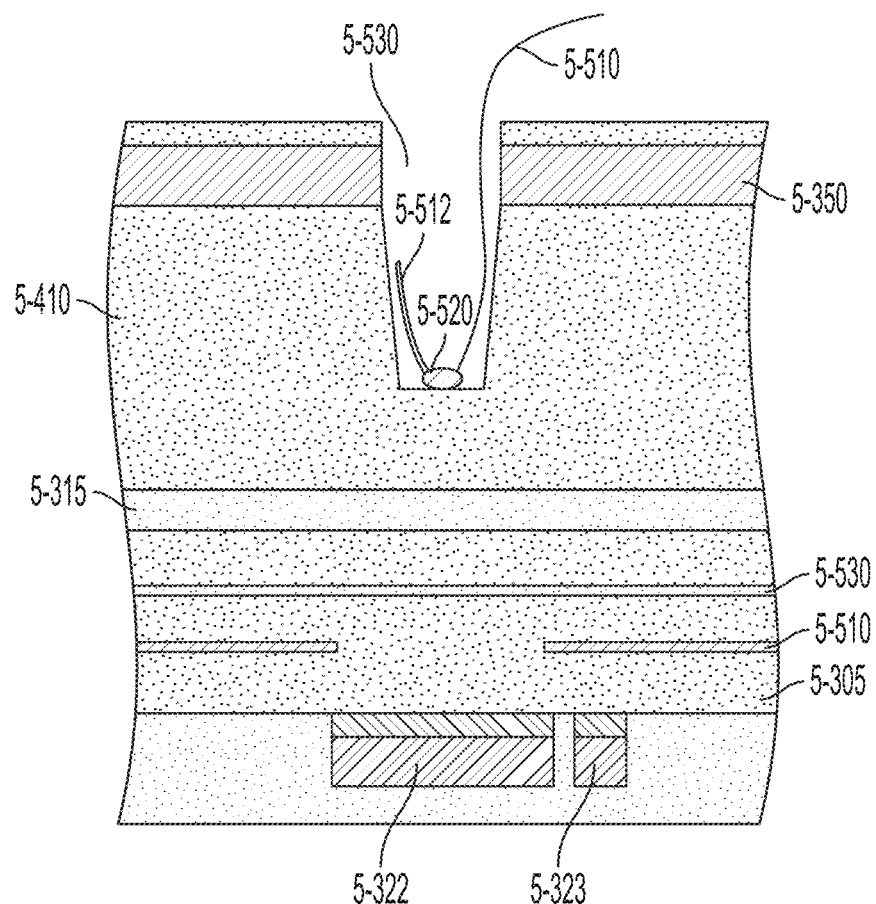
Figures 5, 6:
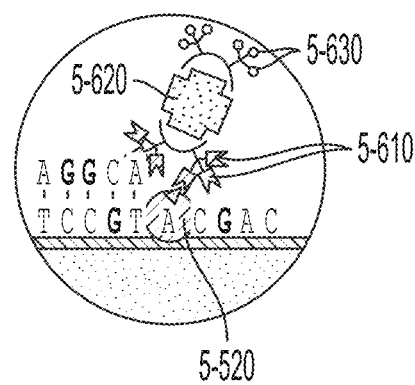

FIG. 5-1D depicts a further detailed example of a portable analytical instrument 5-100 that includes a compact pulsed optical source 5-108. In this example, the pulsed optical source 5-108 comprises a compact, passively mode-locked laser module 5-113. A passively mode-locked laser can produce optical pulses autonomously, without the application of an external pulsed signal. In some implementations, the module can be mounted to an instrument chassis or frame 5-103, and may be located inside an outer casing of the instrument. According to some embodiments, a pulsed optical source 5-106 can include additional components that can be used to operate the optical source and operate on an output beam from the optical source 5-106. A mode-locked laser 5-113 may comprise an element (e.g., saturable absorber, acousto-optic modulator, Kerr lens) in a laser cavity, or coupled to the laser cavity, that induces phase locking of the laser's longitudinal frequency modes. The laser cavity can be defined in part by cavity end mirrors 5-111, 5-119. Such locking of the frequency modes results in pulsed operation of the laser (e.g., an intracavity pulse 5-120 bounces back-and-forth between the cavity end mirrors) and produces a stream of output optical pulses 5-122 from one end mirror 5-111 which is partially transmitting.

In some cases, the analytic instrument 5-100 is configured to receive a removable, packaged, bio-optoelectronic or optoelectronic chip 5-140 (also referred to as a "disposable chip"). The disposable chip can include a bio-optoelectronic chip, for example, that comprises a plurality of reaction chambers, integrated optical components arranged to deliver optical excitation energy to the reaction chambers, and integrated photodetectors arranged to detect fluorescent emission from the reaction chambers. In some implementations, the chip 5-140 can be disposable after a single use, whereas in other implementations the chip 5-140 can be reused two or more times. When the chip 5-140 is received by the instrument 5-100, it can be in electrical and optical communication with the pulsed optical source 5-106 and with apparatus in the analytic system 5-160. Electrical communication may be made through electrical contacts on the chip package, for example.

In some embodiments and referring to FIG. 5-1D, the disposable chip 5-140 can be mounted (e.g., via a socket connection) on an electronic circuit board 5-130, such as a printed circuit board (PCB) that can include additional instrument electronics. For example, the PCB 5-130 can include circuitry configured to provide electrical power, one or more clock signals, and control signals to the optoelectronic chip 5-140, and signal-processing circuitry arranged to receive signals representative of fluorescent emission detected from the reaction chambers. Data returned from the optoelectronic chip can be processed in part or entirely by electronics on the instrument 5-100, although data may be transmitted via a network connection to one or more remote data processors, in some implementations. The PCB 5-130 can also include circuitry configured to receive feedback signals from the chip relating to optical coupling and power levels of the optical pulses 5-122 coupled into waveguides of the optoelectronic chip 5-140. The feedback signals can be provided to one or both of the pulsed optical source 5-106 and optical system 5-115 to control one or more parameters of the output beam of optical pulses 5-122. In some cases, the PCB 5-130 can provide or route power to the pulsed optical source 5-106 for operating the optical source and related circuitry in the optical source 5-106.

According to some embodiments, the pulsed optical source 5-106 comprises a compact mode-locked laser module 5-113. The mode-locked laser can comprise a gain medium 5-105 (which can be solid-state material in some embodiments), an output coupler 5-111, and a laser-cavity end mirror 5-119. The mode-locked laser's optical cavity can be bound by the output coupler 5-111 and end mirror 5-119. An optical axis 5-125 of the laser cavity can have one or more folds (turns) to increase the length of the laser cavity and provide a desired pulse repetition rate. The pulse repetition rate is determined by the length of the laser cavity (e.g., the time for an optical pulse to make a round-trip within the laser cavity).

In some embodiments, there can be additional optical elements (not shown in FIG. 5-1D) in the laser cavity for beam shaping, wavelength selection, and/or pulse forming. In some cases, the end mirror 5-119 comprises a saturable-absorber mirror (SAM) that induces passive mode locking of longitudinal cavity modes and results in pulsed operation of the mode-locked laser. The mode-locked laser module 5-113 can further include a pump source (e.g., a laser diode, not shown in FIG. 5-1D) for exciting the gain medium 5-105. Further details of a mode-locked laser module 5-113 can be found in U.S. patent application Ser. No. 15/844,469, titled "Compact Mode-Locked Laser Module," filed Dec. 15, 2017, each application of which is incorporated herein by reference.

When the laser 5-113 is mode locked, an intracavity pulse 5-120 can circulate between the end mirror 5-119 and the output coupler 5-111, and a portion of the intracavity pulse can be transmitted through the output coupler 5-111 as an output pulse 5-122. Accordingly, a train of output pulses 5-122, as depicted in the graph of FIG. 5-2, can be detected at the output coupler as the intracavity pulse 5-120 bounces back-and-forth between the output coupler 5-111 and end mirror 5-119 in the laser cavity.

FIG. 5-2 depicts temporal intensity profiles of the output pulses 5-122, though the illustration is not to scale. In some embodiments, the peak intensity values of the emitted pulses may be approximately equal, and the profiles may have a Gaussian temporal profile, though other profiles such as a sech2 profile may be possible. In some cases, the pulses may not have symmetric temporal profiles and may have other temporal shapes. The duration of each pulse may be characterized by a full-width-half-maximum (FWHM) value, as indicated in FIG. 5-2. According to some embodiments of a mode-locked laser, ultrashort optical pulses can have FWHM values less than 100 picoseconds (ps). In some cases, the FWHM values can be between approximately 5 ps and approximately 30 ps.

The output pulses 5-122 can be separated by regular intervals T. For example, T can be determined by a round-trip travel time between the output coupler 5-111 and cavity end mirror 5-119. According to some embodiments, the pulse-separation interval T can be between about 1 ns and about 30 ns. In some cases, the pulse-separation interval T can be between about 5 ns and about 20 ns, corresponding to a laser-cavity length (an approximate length of the optical axis 5-125 within the laser cavity) between about 0.7 meter and about 3 meters. In embodiments, the pulse-separation interval corresponds to a round trip travel time in the laser cavity, so that a cavity length of 3 meters (round-trip distance of 6 meters) provides a pulse-separation interval T of approximately 20 ns.

According to some embodiments, a desired pulse-separation interval T and laser-cavity length can be determined by a combination of the number of reaction chambers on the chip 5-140, fluorescent emission characteristics, and the speed of data-handling circuitry for reading data from the optoelectronic chip 5-140. In embodiments, different fluorophores can be distinguished by their different fluorescent decay rates or characteristic lifetimes. Accordingly, there needs to be a sufficient pulse-separation interval T to collect adequate statistics for the selected fluorophores to distinguish between their different decay rates. Additionally, if the pulse-separation interval T is too short, the data handling circuitry cannot keep up with the large amount of data being collected by the large number of reaction chambers. Pulse-separation interval T between about 5 ns and about 20 ns is suitable for fluorophores that have decay rates up to about 2 ns and for handling data from between about 60,000 and 10,000,000 reaction chambers.

According to some implementations, a beam-steering module 5-150 can receive output pulses from the pulsed optical source 5-106 and is configured to adjust at least the position and incident angles of the optical pulses onto an optical coupler (e.g., grating coupler) of the optoelectronic chip 5-140. In some cases, the output pulses 5-122 from the pulsed optical source 5-106 can be operated on by a beam-steering module 5-150 to additionally or alternatively change a beam shape and/or beam rotation at an optical coupler on the optoelectronic chip 5-140. In some implementations, the beam-steering module 5-150 can further provide focusing and/or polarization adjustments of the beam of output pulses onto the optical coupler. One example of a beam-steering module is described in U.S. patent application Ser. No. 15/161,088 titled "Pulsed Laser and Bioanalytic System," filed May 20, 2016, which is incorporated herein by reference. Another example of a beam-steering module is described in a separate U.S. patent application No. 62/435,679, filed Dec. 16, 2016 and titled "Compact Beam Shaping and Steering Assembly," which is incorporated herein by reference.

Referring to FIG. 5-3, the output pulses 5-122 from a pulsed optical source can be coupled into one or more optical waveguides 5-312 on a bio-optoelectronic chip 5-140, for example. In some embodiments, the optical pulses can be coupled to one or more waveguides via a grating coupler 5-310, though coupling to an end of one or more optical waveguides on the optoelectronic chip can be used in some embodiments. According to some embodiments, a quad detector 5-320 can be located on a semiconductor substrate 5-305 (e.g., a silicon substrate) for aiding in alignment of the beam of optical pulses 5-122 to a grating coupler 5-310. The one or more waveguides 5-312 and reaction chambers or reaction chambers 5-330 can be integrated on the same semiconductor substrate with intervening dielectric layers (e.g., silicon dioxide layers) between the substrate, waveguide, reaction chambers, and photodetectors 5-322.

Each waveguide 5-312 can include a tapered portion 5-315 below the reaction chambers 5-330 to equalize optical power coupled to the reaction chambers along the waveguide. The reducing taper can force more optical energy outside the waveguide's core, increasing coupling to the reaction chambers and compensating for optical losses along the waveguide, including losses for light coupling into the reaction chambers. A second grating coupler 5-317 can be located at an end of each waveguide to direct optical energy to an integrated photodiode 5-324. The integrated photodiode can detect an amount of power coupled down a waveguide and provide a detected signal to feedback circuitry that controls the beam-steering module 5-150, for example.

The reaction chambers 5-330 or reaction chambers 5-330 can be aligned with the tapered portion 5-315 of the waveguide and recessed in a tub 5-340. There can be photodetectors 5-322 located on the semiconductor substrate 5-305 for each reaction chamber 5-330. In some embodiments, a semiconductor absorber (shown in FIG. 5-5 as an optical filter 5-530) may be located between the waveguide and a photodetector 5-322 at each pixel. A metal coating and/or multilayer coating 5-350 can be formed around the reaction chambers and above the waveguide to prevent optical excitation of fluorophores that are not in the reaction chambers (e.g., dispersed in a solution above the reaction chambers). The metal coating and/or multilayer coating 5-350 may be raised beyond edges of the tub 5-340 to reduce absorptive losses of the optical energy in the waveguide 5-312 at the input and output ends of each waveguide.

There can be a plurality of rows of waveguides, reaction chambers, and time-binning photodetectors on the optoelectronic chip 5-140. For example, there can be 128 rows, each having 512 reaction chambers, for a total of 65,536 reaction chambers in some implementations. Other implementations may include fewer or more reaction chambers, and may include other layout configurations. Optical power from the pulsed optical source 5-106 can be distributed to the multiple waveguides via one or more star couplers or multimode interference couplers, or by any other means, located between an optical coupler 5-310 to the chip 5-140 and the plurality of waveguides 5-312.

FIG. 5-4 illustrates optical energy coupling from an optical pulse 5-122 within a tapered portion of waveguide 5-315 to a reaction chamber 5-330. The drawing has been produced from an electromagnetic field simulation of the optical wave that accounts for waveguide dimensions, reaction chamber dimensions, the different materials' optical properties, and the distance of the tapered portion of waveguide 5-315 from the reaction chamber 5-330. The waveguide can be formed from silicon nitride in a surrounding medium 5-410 of silicon dioxide, for example. The waveguide, surrounding medium, and reaction chamber can be formed by microfabrication processes described in U.S. application Ser. No. 14/821,688, filed Aug. 7, 2015, titled "Integrated Device for Probing, Detecting and Analyzing Molecules." According to some embodiments, an evanescent optical field 5-420 couples optical energy transported by the waveguide to the reaction chamber 5-330.

A non-limiting example of a biological reaction taking place in a reaction chamber 5-330 is depicted in FIG. 5-5. The example depicts sequential incorporation of nucleotides or nucleotide analogs into a growing strand that is complementary to a target nucleic acid. The sequential incorporation can take place in a reaction chamber 5-330, and can be detected by an advanced analytic instrument to sequence DNA. The reaction chamber can have a depth between about 150 nm and about 250 nm and a diameter between about 80 nm and about 160 nm. A metallization layer 5-540 (e.g., a metallization for an electrical reference potential) can be patterned above a photodetector 5-322 to provide an aperture or iris that blocks stray light from adjacent reaction chambers and other unwanted light sources. According to some embodiments, polymerase 5-520 can be located within the reaction chamber 5-330 (e.g., attached to a base of the chamber). The polymerase can take up a target nucleic acid 5-510 (e.g., a portion of nucleic acid derived from DNA), and sequence a growing strand of complementary nucleic acid to produce a growing strand of DNA 5-512. Nucleotides or nucleotide analogs labeled with different fluorophores can be dispersed in a solution above and within the reaction chamber.

When a labeled nucleotide or nucleotide analog 5-610 is incorporated into a growing strand of complementary nucleic acid, as depicted in FIG. 5-6, one or more attached fluorophores 5-630 can be repeatedly excited by pulses of optical energy coupled into the reaction chamber 5-330 from the waveguide 5-315. In some embodiments, the fluorophore or fluorophores 5-630 can be attached to one or more nucleotides or nucleotide analogs 5-610 with any suitable linker 5-620. An incorporation event may last for a period of time up to about 100 ms. During this time, pulses of fluorescent emission resulting from excitation of the fluorophore(s) by pulses from the mode-locked laser can be detected with a time-binning photodetector 5-322, for example. In some embodiments, there can be one or more additional integrated electronic devices 5-323 at each pixel for signal handling (e.g., amplification, read-out, routing, signal preprocessing, etc.). According to some embodiments, each pixel can include at least one optical filter 5-530 (e.g., a semiconductor absorber) that passes fluorescent emission and reduces transmission of radiation from the excitation pulse. Some implementations may not use the optical filter 5-530. By attaching fluorophores with different emission characteristics (e.g., fluorescent decay rates, intensity, fluorescent wavelength) to the different nucleotides (A, C, G, T), detecting and distinguishing the different emission characteristics while the strand of DNA 5-512 incorporates a nucleic acid and enables determination of the genetic sequence of the growing strand of DNA.

Figures 5, 6, 7:
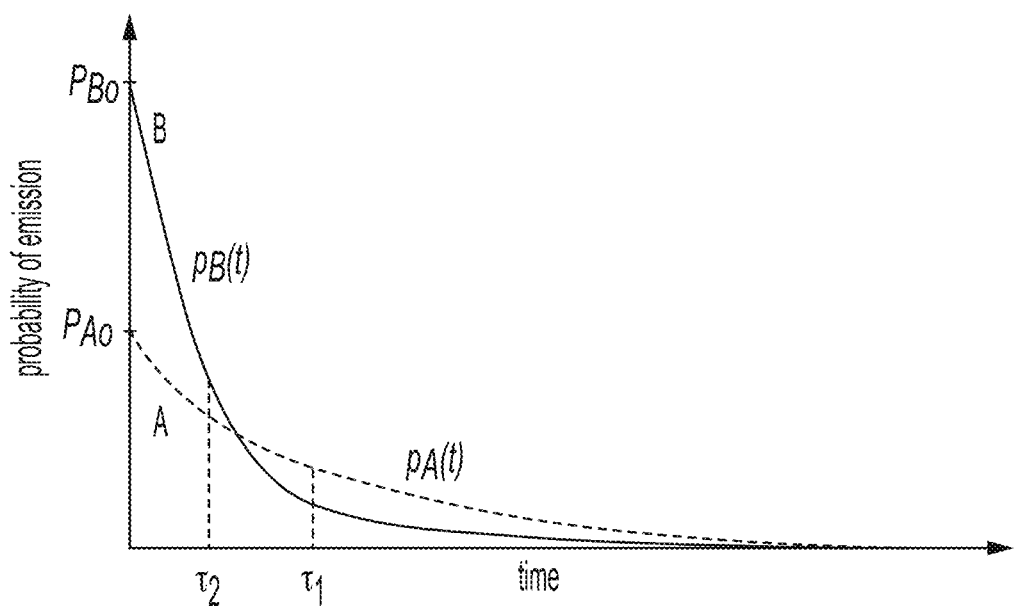
Figures 5, 6, 7, 8:
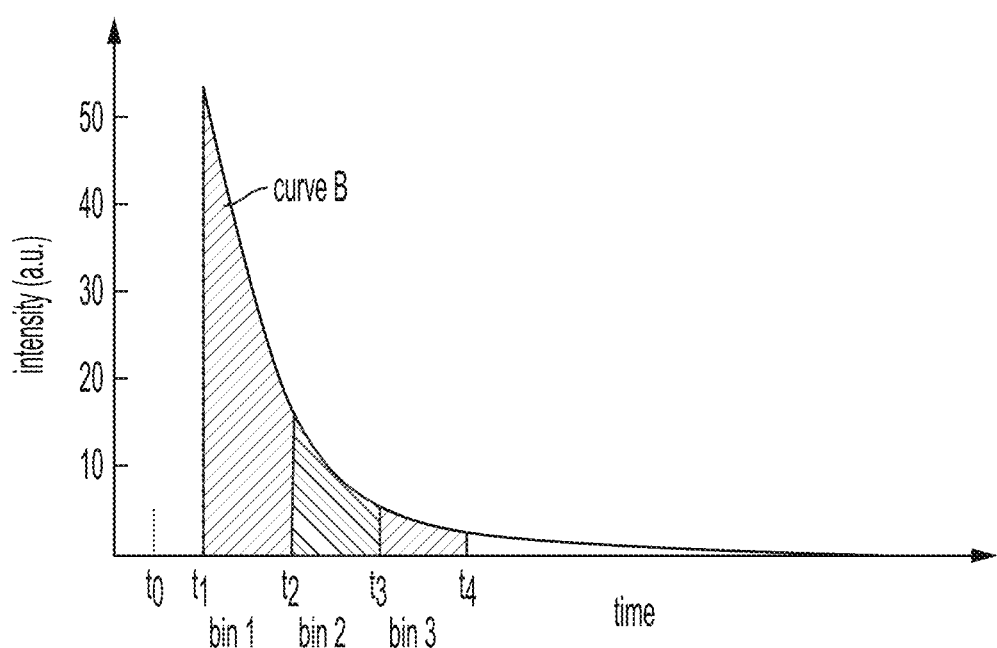
Figures 5, 6, 7, 8, 9:
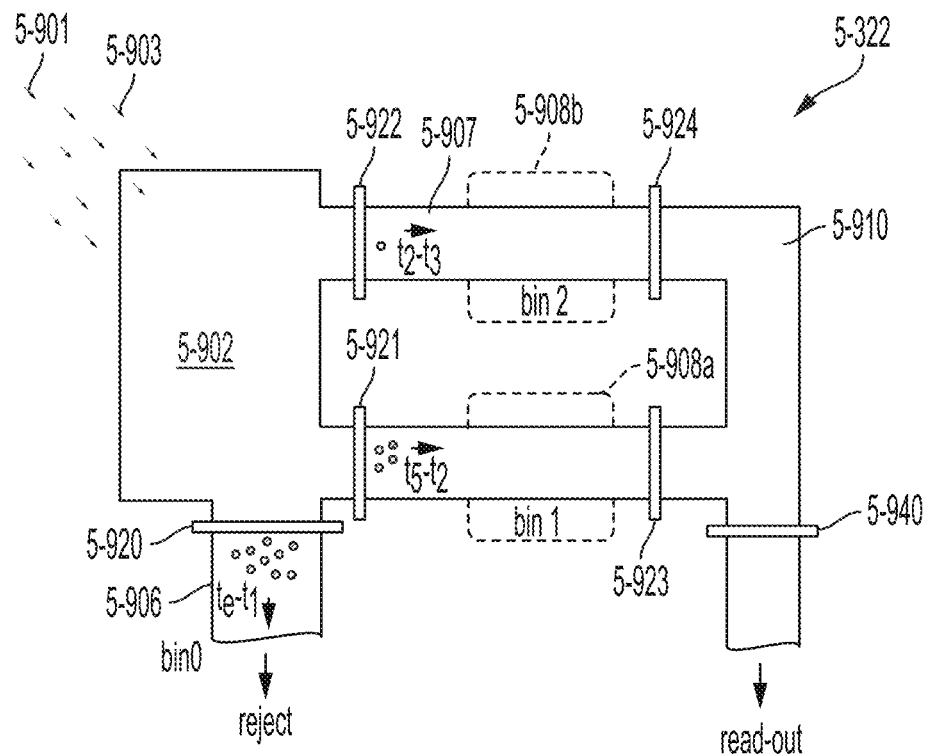
Figures 5, 6, 7, 8, 9, 10, 10A:
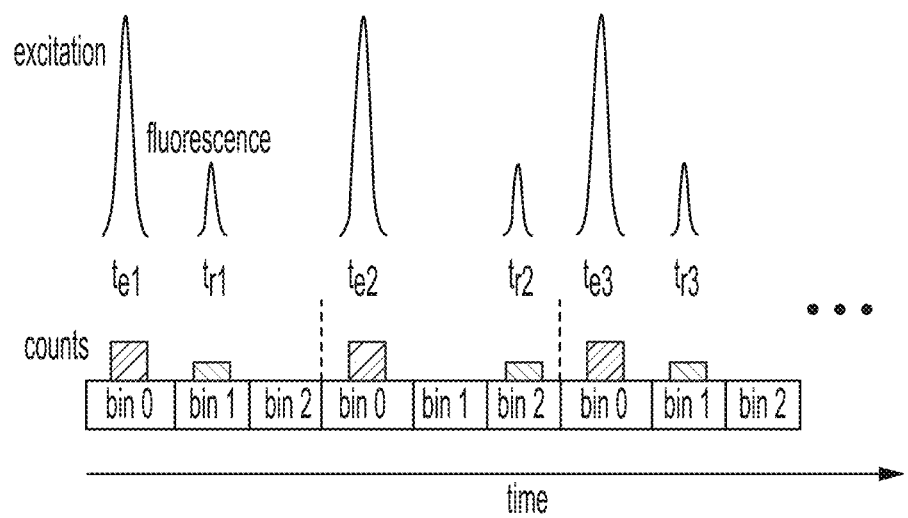
Figures 5, 6, 7, 8, 9, 10, 10B:
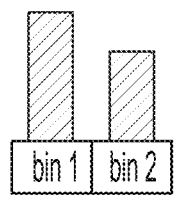
Figures 5, 6, 7, 8, 9, 10, 11, 11A:
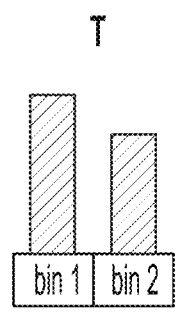
Figures 5, 6, 7, 8, 9, 10, 11, 11B:
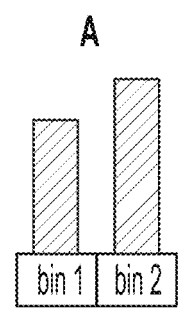
Figures 5, 6, 7, 8, 9, 10, 11, 11C:
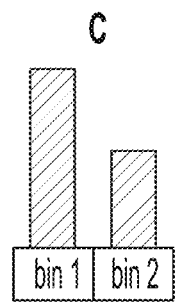
Figures 5, 6, 7, 8, 9, 10, 11, 11D:
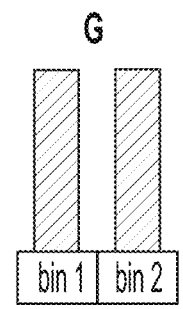
Figures 5, 6, 7, 8, 9, 10, 11, 12:
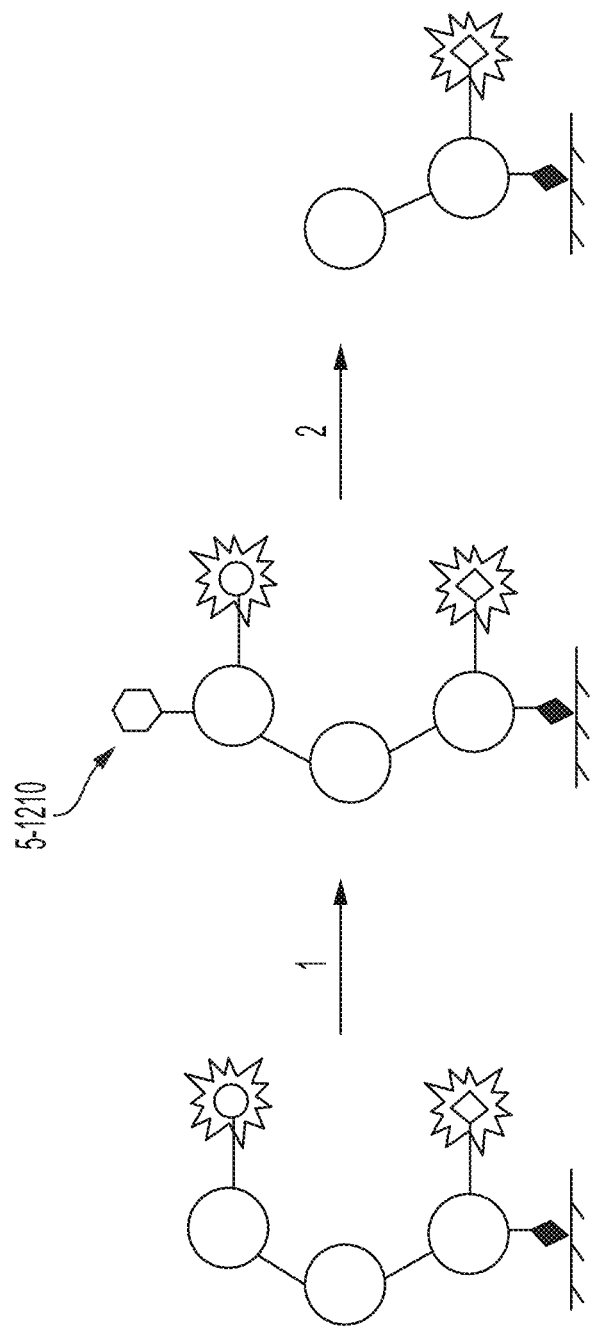
Figures 5, 6, 7, 8, 9, 10, 11, 12, 13:
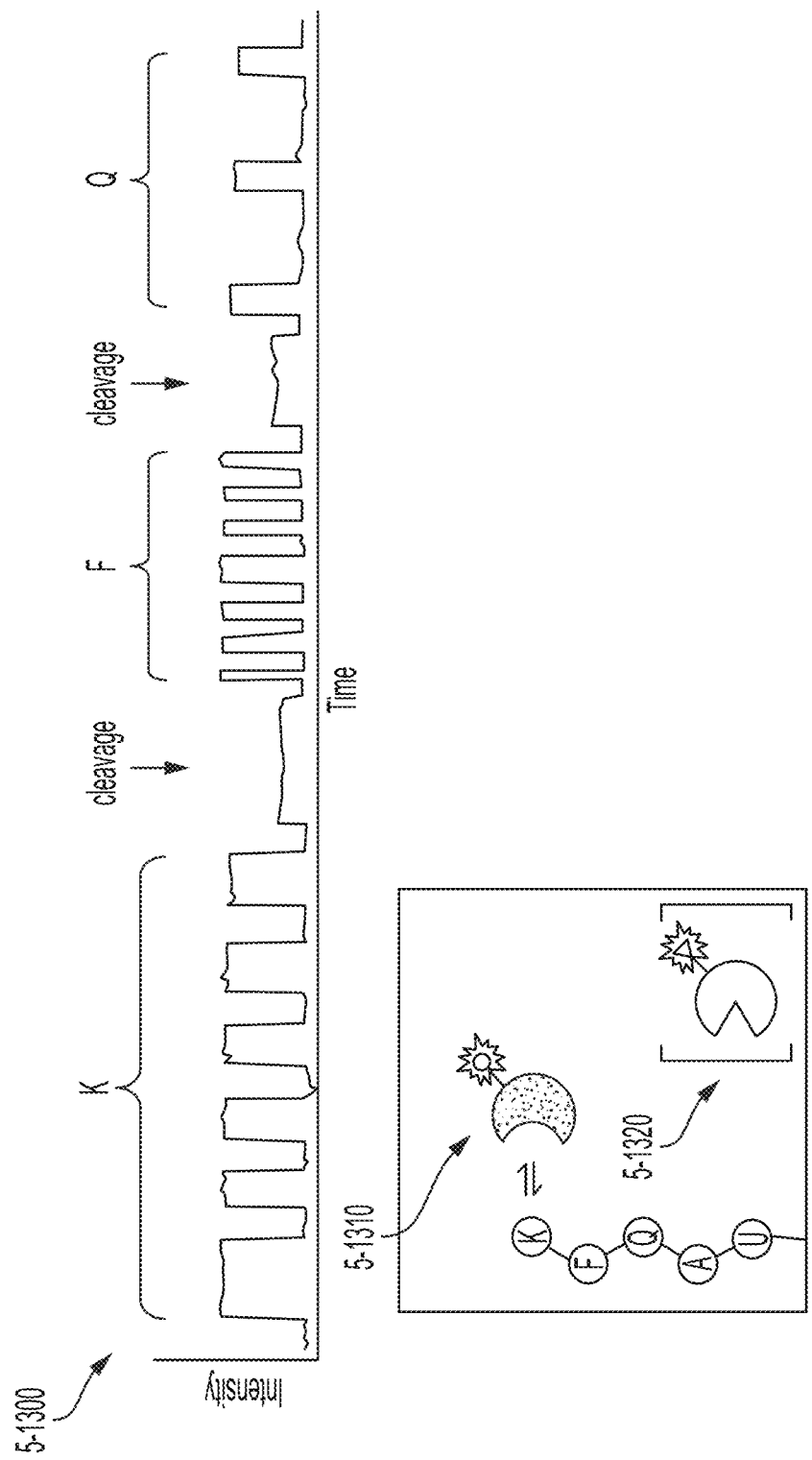
Figures 2B, 6:
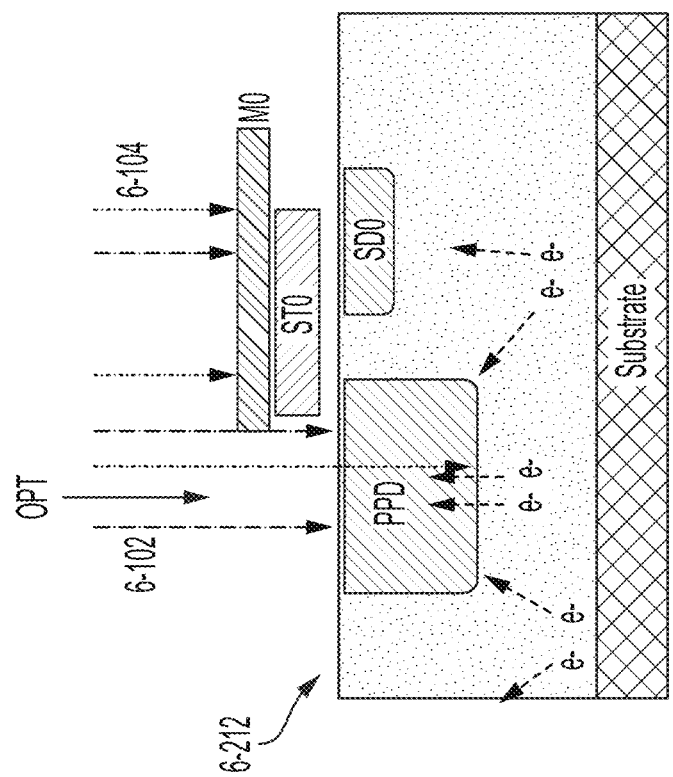
Figures 2A, 6:
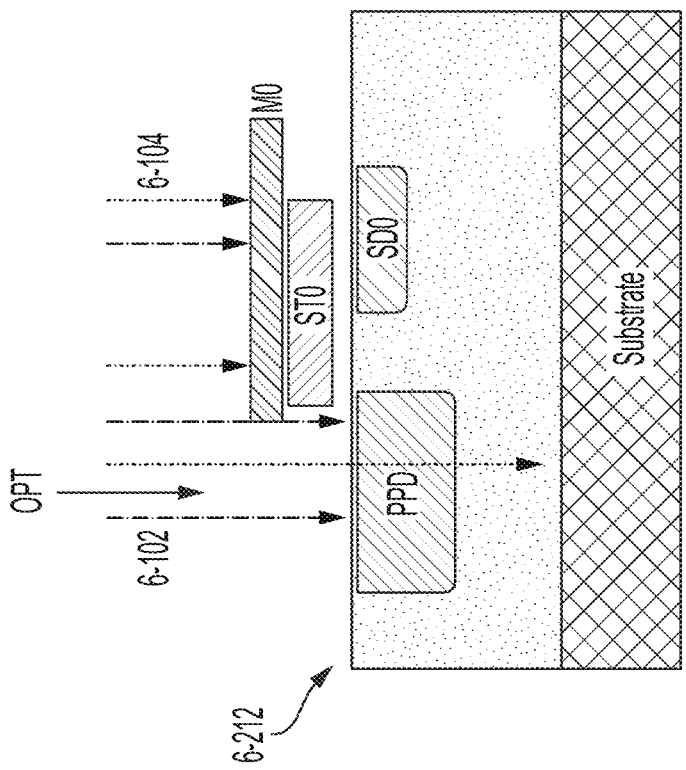
Figures 4, 6:
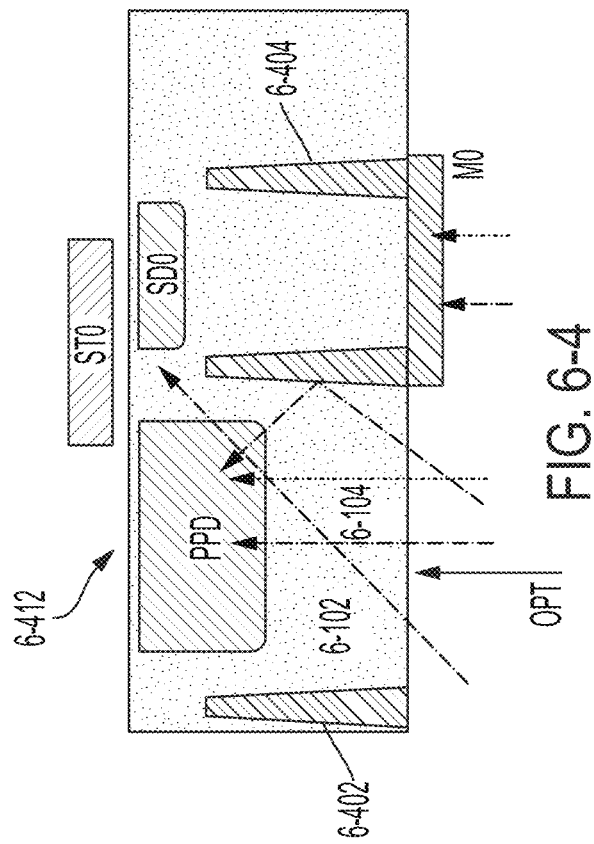
Figures 3, 6:
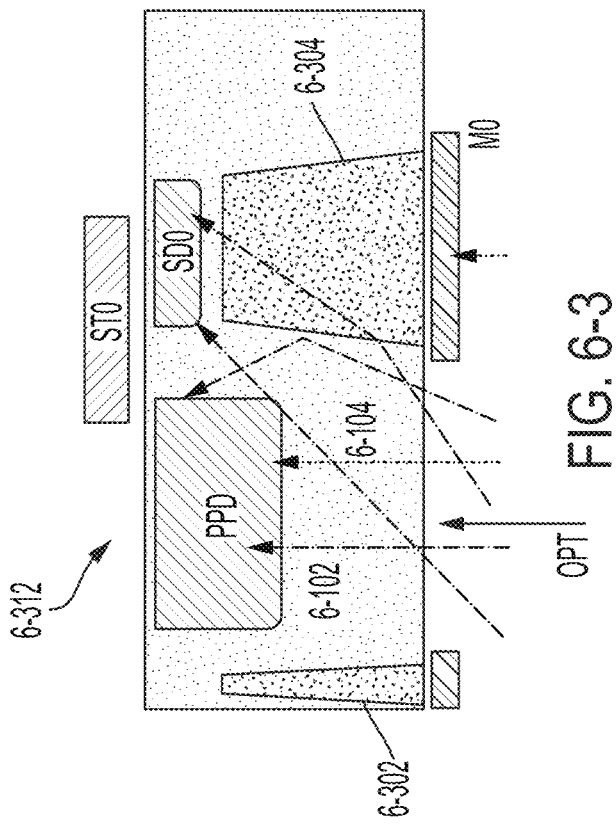
Figures 5, 6:
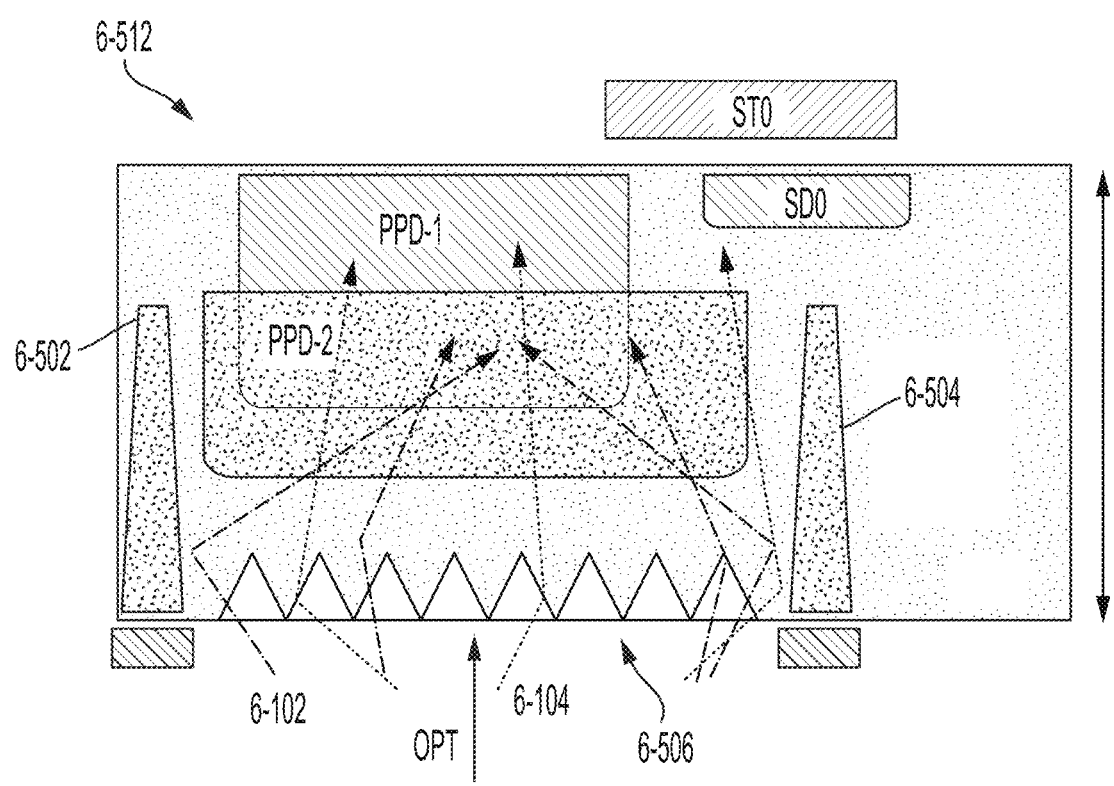

According to some embodiments, an advanced analytic instrument 5-100 that is configured to analyze samples based on fluorescent emission characteristics can detect differences in fluorescent lifetimes and/or intensities between different fluorescent molecules, and/or differences between lifetimes and/or intensities of the same fluorescent molecules in different environments. By way of explanation, FIG. 5-7 plots two different fluorescent emission probability curves (A and B), which can be representative of fluorescent emission from two different fluorescent molecules, for example. With reference to curve A (dashed line), after being excited by a short or ultrashort optical pulse, a probability $p_A(t)$ of a fluorescent emission from a first molecule may decay with time, as depicted. In some cases, the decrease in the probability of a photon being emitted over time can be represented by an exponential decay function $p\_A(t) = P\_Ao \, e^{(-t/\tau\_1)}$, where PAo is an initial emission probability and $\tau\_1$ is a temporal parameter associated with the first fluorescent molecule that characterizes the emission decay probability. $\tau\_1$ may be referred to as the "fluorescence lifetime," "emission lifetime," or "lifetime" of the first fluorescent molecule. In some cases, the value of $\tau\_1$ can be altered by a local environment of the fluorescent molecule. Other fluorescent molecules can have different emission characteristics than that shown in curve A. For example, another fluorescent molecule can have a decay profile that differs from a single exponential decay, and its lifetime can be characterized by a half-life value or some other metric.

A second fluorescent molecule may have a decay profile pB(t) that is exponential, but has a measurably different lifetime $\tau\_2$, as depicted for curve B in FIG. 5-7. In the example shown, the lifetime for the second fluorescent molecule of curve B is shorter than the lifetime for curve A, and the probability of emission pB(t) is higher sooner after excitation of the second molecule than for curve A. Different fluorescent molecules can have lifetimes or half-life values ranging from about 0.1 ns to about 20 ns, in some embodiments.

Differences in fluorescent emission lifetimes can be used to discern between the presence or absence of different fluorescent molecules and/or to discern between different environments or conditions to which a fluorescent molecule is subjected. In some cases, discerning fluorescent molecules based on lifetime (rather than emission wavelength, for example) can simplify aspects of an analytical instrument 5-100. As an example, wavelength-discriminating optics (such as wavelength filters, dedicated detectors for each wavelength, dedicated pulsed optical sources at different wavelengths, and/or diffractive optics) can be reduced in number or eliminated when discerning fluorescent molecules based on lifetime. In some cases, a single pulsed optical source operating at a single characteristic wavelength can be used to excite different fluorescent molecules that emit within a same wavelength region of the optical spectrum but have measurably different lifetimes. An analytic system that uses a single pulsed optical source, rather than multiple sources operating at different wavelengths, to excite and discern different fluorescent molecules emitting in a same wavelength region can be less complex to operate and maintain, more compact, and can be manufactured at lower cost.

Although analytic systems based on fluorescent lifetime analysis can have certain benefits, the amount of information obtained by an analytic system and/or detection accuracy can be increased by allowing for additional detection techniques. For example, some analytic systems 5-160 can additionally be configured to discern one or more properties of a sample based on fluorescent wavelength and/or fluorescent intensity.

Referring again to FIG. 5-7, according to some embodiments, different fluorescent lifetimes can be distinguished with a photodetector that is configured to time-bin fluorescent emission events following excitation of a fluorescent molecule. The time binning can occur during a single collection sequence for the photodetector. A collection sequence is an interval between readout periods during which charge carriers are accumulated in charge storage regions of the time-binning photodetector. The concept of determining fluorescent lifetime by time-binning of emission events is introduced graphically in FIG. 5-8. At time $t_e$ just prior to $t_1$, a fluorescent molecule or ensemble of fluorescent molecules of a same type (e.g., the type corresponding to curve B of FIG. 5-7) is (are) excited by a short or ultrashort optical pulse. For a large ensemble of molecules, the intensity of emission can have a time profile similar to curve B, as depicted in FIG. 5-8.

For a single molecule or a small number of molecules, however, the emission of fluorescent photons occurs according to the statistics of curve B in FIG. 5-7, for this example. A time-binning photodetector 5-322 can accumulate charge carriers generated from emission events into charge storage regions. Three charge storage regions are indicated in FIG. 5-8, though fewer charge storage regions or more charge storage regions may be used in embodiments. The charge storage regions may be temporally resolved with respect to the excitation time $t_e$ of the fluorescent molecule(s). For example, a first charge storage region (e.g., SD0) can accumulate charge carriers produced during an interval between times $t_1$ and $t_2$, occurring after the excitation event at time $t_e$. A second charge storage region (e.g., SD1) can accumulate carriers produced during an interval between times $t_2$ and $t_3$, and a third charge storage region (e.g., SD2) can accumulate carriers produced during an interval between times $t_3$ and $t_4$. When a large number of emission events are summed, charge carriers accumulated in the charge storage regions can approximate the decaying intensity curve shown in FIG. 5-8, and the binned signals can be used to distinguish between different fluorescent molecules or different environments in which a fluorescent molecule is located.

Examples of a time-binning photodetector 5-322 are described in U.S. patent application Ser. No. 14/821,656, filed Aug. 7, 2015, titled "Integrated Device for Temporal Binning of Received Photons" and in U.S. patent application Ser. No. 15/852,571, filed Dec. 22, 2017, titled "Integrated Photodetector with Direct Binning Pixel," which are both incorporated herein by reference in their entirety. For explanation purposes, a non-limiting embodiment of a time-binning photodetector is depicted in FIG. 5-9. A single time-binning photodetector 5-322 can comprise a photodetection region 5-902, a charge transfer channel 5-906, and a plurality of charge storage regions 5-908a, 5-908b all formed on a semiconductor substrate. Charge transfer channels 5-907 can connect between the photodetection region 5-902 and charge storage regions 5-908a, 5-908b. In the illustrated example, two charge storage regions are shown, but there may be more or fewer. There can be a readout channel 5-910 connected to the carrier-storage regions. The photodetection region 5-902, charge transfer channel 5-906, charge storage regions 5-908a, 5-908b, and readout channel 5-910 can be formed by doping the semiconductor locally and/or forming adjacent insulating regions to provide photodetection capability, confinement, and transport of carriers. A time-binning photodetector 5-322 can also include a plurality of transfer gates 5-920, 5-921, 5-922, 5-923, 5-924 formed on the substrate that are configured to generate electric fields in the device for transporting carriers through the device.

In operation, a portion of an excitation pulse 5-122 from a pulsed optical source 5-106 (e.g., a mode-locked laser) is delivered to a reaction chamber 5-330 over the time-binning photodetector 5-322. Initially, some excitation radiation photons 5-901 may arrive at the photodetection region 5-902 and produce carriers (shown as light-shaded circles). There can also be some fluorescent emission photons 5-903 that arrive with the excitation radiation photons 5-901 and produce corresponding charge carriers (shown as dark-shaded circles). Initially, the number of charge carriers produced by the excitation radiation can be too large compared to the number of charge carriers produced by the fluorescent emission. The initial charge carriers produced during a time interval $t_0$-$t_1$ can be rejected by gating them into a charge transfer channel 5-906 with a first transfer gate 5-920, for example.

At a later times mostly fluorescent emission photons 5-903 arrive at the photodetection region 5-902 and produce charge carriers (indicated a dark-shaded circles) that provide useful and detectable signal that is representative of fluorescent emission from the reaction chamber 5-330. According to some detection methods, a second transfer gate 5-921 and third transfer gate 5-923 can be gated at a later time to direct carriers produced at a later time (e.g., during a second time interval $t_1$-$t_2$) to a first charge storage region 5-908a. Subsequently, a fourth transfer gate 5-922 and fifth transfer gate 5-924 can be gated at a later time (e.g., during a third time interval $t_2$-$t_3$) to direct charge carriers to a second charge storage region 5-908b. Charge carrier accumulation can continue in this manner after excitation pulses for a large number of excitation pulses to accumulate an appreciable number of charge carriers and signal level in each charge storage region 5-908a, 5-908b. At a later time, the signal can be read out from the charge storage regions. In some implementations, the time intervals corresponding to each charge storage region are at the sub-nanosecond time scale, though longer time scales can be used in some embodiments (e.g., in embodiments where fluorophores have longer decay times).

The process of generating and time-binning charge carriers after an excitation event (e.g., excitation pulse from a pulsed optical source) can occur once after a single excitation pulse or be repeated multiple times after multiple excitation pulses during a single charge-accumulation cycle for the time-binning photodetector 5-322. After charge accumulation is complete, charge carriers can be read out of the charge storage regions via the readout channel 5-910. For example, an appropriate biasing sequence can be applied to transfer gates 5-923, 5-924 and at least to transfer gate 5-940 to remove carriers from the charge storage regions 5-908a, 5-908b. The charge accumulation and readout processes can occur in a massively parallel operation on the optoelectronic chip 5-140 resulting in frames of data.

Although the described example in connection with FIG. 5-9 includes multiple charge storage regions 5-908a, 5-908b, in some cases a single charge storage region may be used instead. For example, only charge storage region SD0 may be present in a time-binning photodetector 5-322. In such a case, a single charge storage region 5-908a can be operated in a variable time-gated manner to look at different time intervals after different excitation events. For example, after pulses in a first series of excitation pulses, transfer gates for the storage region 5-908a can be gated to collect carriers generated during a first time interval (e.g., during the second time interval $t_1$-$t_2$), and the accumulated signal can be read out after a first predetermined number of pulses. After pulses in a subsequent series of excitation pulses at the same reaction chamber, the same transfer gates for the charge storage region 5-908a can be gated to collect charge carriers generated during a different interval (e.g., during the third time interval $t_2$-$t_3$), and the accumulated signal can be read out after a second predetermined number of pulses. Charge carriers could be collected during later time intervals in a similar manner if needed. In this manner, signal levels corresponding to fluorescent emission during different time periods after arrival of an excitation pulse at a reaction chamber can be produced using a single charge storage region.

In some embodiments, charge carriers produced during the second and third time intervals may be collected and stored using charge storage regions. For example, charge carriers produced during the time interval $t_1$-$t_2$ may be collected in charge storage region SD0, and then charge carriers produced during the time interval $t_2$-$t_3$ may be collected in charge storage region SD1, after which the charge carriers collected during time interval $t_1$-$t_3$ may be read out from the respective charge storage regions to readout region FD. Alternatively or additionally, the charge carriers produced during time interval $t_2$-$t_3$ can be collected in charge storage region SD0 after the charge carriers collected during time interval $t_1$-$t_2$ have been read out from charge storage region SD0 to readout region FD.

Regardless of how charge accumulation is carried out for different time intervals after excitation, signals that are read out can provide a histogram of bins that are representative of the fluorescent emission decay characteristics, for example. An example process is illustrated in FIG. 5-10A and FIG. 5-10B, for which two charge storage regions are used to acquire fluorescent emission from the reaction chambers. The histogram's bins can indicate a number of photons detected during each time interval after excitation of the fluorophore(s) in a reaction chamber 5-330. In some embodiments, signals for the bins will be accumulated following a large number of excitation pulses, as depicted in FIG. 5-10A. The excitation pulses can occur at times $t_{e1}$, $t_{e2}$, $t_{e3}$, ... $t_{eN}$ which are separated by the pulse interval time T. In some cases, there can be between 105 and 107 excitation pulses 5-122 (or portions thereof) applied to a reaction chamber during an accumulation of signals in the charge storage regions for a single event being observed in the reaction chamber (e.g., a single nucleotide incorporation event in DNA analysis). In some embodiments, one charge storage region (bin 0 or SD0) can be configured to detect an amplitude of excitation energy delivered with each optical pulse, and may be used as a reference signal (e.g., to normalize data). In other cases, the excitation pulse amplitude may be stable, determined one or more times during signal acquisition, and not determined after each excitation pulse so that there is no bin0 signal acquisition after each excitation pulse. In such cases, carriers produced by an excitation pulse can be rejected and dumped from the photodetection region 5-902 as described above in connection with FIG. 5-9.

In some implementations, only a single photon may be emitted from a fluorophore following an excitation event, as depicted in FIG. 5-10A. After a first excitation event at time $t_{e1}$, the emitted photon at time $t_{f1}$ may occur within a first time interval (e.g., between times $t_1$ and $t_2$), so that the resulting charge carriers are accumulated in the first charge storage region (contributes to bin 1). In a subsequent excitation event at time tee, the emitted photon at time $t_{f2}$ may occur within a second time interval (e.g., between times $t_2$ and $t_3$), so that the resulting charge signal contributes to bin 2. After a next excitation event at time $t_{e3}$, a photon may emit at a time $t_{f3}$ occurring within the first time interval.

In some implementations, there may not be a fluorescent photon emitted and/or detected after each excitation pulse received at a reaction chamber 5-330. In some cases, there can be as few as one fluorescent photon that is detected at a reaction chamber for every 10,000 excitation pulses delivered to the reaction chamber. One advantage of implementing a mode-locked laser 5-113 as the pulsed excitation source 5-106 is that a mode-locked laser can produce short optical pulses having high intensity and quick turn-off times at high pulse-repetition rates (e.g., between 50 MHz and 250 MHz). With such high pulse-repetition rates, the number of excitation pulses within a 10 millisecond charge-accumulation interval can be 50,000 to 250,000, so that detectable signal can be accumulated.

After a large number of excitation events and charge carrier accumulations, the charge storage regions of the time-binning photodetector 5-322 can be read out to provide a multi-valued signal (e.g., a histogram of two or more values, an N-dimensional vector, etc.) for a reaction chamber. The signal values for each bin can depend upon the decay rate of the fluorophore. For example and referring again to FIG. 5-8, a fluorophore having a decay curve B will have a higher ratio of signal in bin 1 to bin 2 than a fluorophore having a decay curve A. The values from the bins can be analyzed and compared against calibration values, and/or each other, to determine the particular fluorophore present. For a sequencing application, identifying the fluorophore can determine the nucleotide or nucleotide analog that is being incorporated into a growing strand of DNA, for example. For other applications, identifying the fluorophore can determine an identity of a molecule or specimen of interest, which may be linked to the fluorophore.

To further aid in understanding the signal analysis, the accumulated, multi-bin values can be plotted as a histogram, as depicted in FIG. 5-10B for example, or can be recorded as a vector or location in N-dimensional space. Calibration runs can be performed separately to acquire calibration values for the multi-valued signals (e.g., calibration histograms) for four different fluorophores linked to the four nucleotides or nucleotide analogs. As an example, the calibration histograms may appear as depicted in FIG. 5-11A (fluorescent label associated with the T nucleotide), FIG. 5-11B (fluorescent label associated with the A nucleotide), FIG. 5-11C (fluorescent label associated with the C nucleotide), and FIG. 5-11D (fluorescent label associated with the G nucleotide). A comparison of the measured multi-valued signal (corresponding to the histogram of FIG. 5-10B) to the calibration multi-valued signals can determine the identity "T" (FIG. 5-11A) of the nucleotide or nucleotide analog being incorporated into the growing strand of DNA.

In some implementations, fluorescent intensity can be used additionally or alternatively to distinguish between different fluorophores. For example, some fluorophores may emit at significantly different intensities or have a significant difference in their probabilities of excitation (e.g., at least a difference of about 35%) even though their decay rates may be similar. By referencing binned signals (bins 5-3) to measured excitation energy and/or other acquired signals, it can be possible to distinguish different fluorophores based on intensity levels.

In some embodiments, different numbers of fluorophores of the same type can be linked to different nucleotides or nucleotide analogs, so that the nucleotides can be identified based on fluorophore intensity. For example, two fluorophores can be linked to a first nucleotide (e.g., "C") or nucleotide analog and four or more fluorophores can be linked to a second nucleotide (e.g., "T") or nucleotide analog. Because of the different numbers of fluorophores, there may be different excitation and fluorophore emission probabilities associated with the different nucleotides. For example, there may be more emission events for the "T" nucleotide or nucleotide analog during a signal accumulation interval, so that the apparent intensity of the bins is significantly higher than for the "C" nucleotide or nucleotide analog.

Distinguishing nucleotides or any other biological or chemical specimens based on fluorophore decay rates and/or fluorophore intensities enables a simplification of the optical excitation and detection systems in an analytical instrument 5-100. For example, optical excitation can be performed with a single-wavelength source (e.g., a source producing one characteristic wavelength rather than multiple sources or a source operating at multiple different characteristic wavelengths). Additionally, wavelength-discriminating optics and filters may not be needed in the detection system to distinguish between fluorophores of different wavelengths. Also, a single photodetector can be used for each reaction chamber to detect emission from different fluorophores.

The phrase "characteristic wavelength" or "wavelength" is used to refer to a central or predominant wavelength within a limited bandwidth of radiation (e.g., a central or peak wavelength within a 20 nm bandwidth output by a pulsed optical source). In some cases, "characteristic wavelength" or "wavelength" may be used to refer to a peak wavelength within a total bandwidth of radiation output by a source.

Fluorophores having emission wavelengths in a range between about 560 nm and about 900 nm can provide adequate amounts of fluorescence to be detected by a time-binning photodetector (which can be fabricated on a silicon wafer using CMOS processes). These fluorophores can be linked to biological molecules of interest, such as nucleotides or nucleotide analogs for genetic sequencing applications. Fluorescent emission in this wavelength range can be detected with higher responsivity in a silicon-based photodetector than fluorescence at longer wavelengths. Additionally, fluorophores and associated linkers in this wavelength range may not interfere with incorporation of the nucleotides or nucleotide analogs into growing strands of DNA. In some implementations, fluorophores having emission wavelengths in a range between about 560 nm and about 660 nm can be optically excited with a single-wavelength source. An example fluorophore in this range is Alexa Fluor 647, available from Thermo Fisher Scientific Inc. of Waltham, Mass. Excitation energy at shorter wavelengths (e.g., between about 500 nm and about 650 nm) may be used to excite fluorophores that emit at wavelengths between about 560 nm and about 900 nm. In some embodiments, the time-binning photodetectors can efficiently detect longer-wavelength emission from the reaction chambers, e.g., by incorporating other materials, such as Ge, into the photodetectors' active regions.

VIII. Protein Sequencing Applications

Some aspects of the present disclosure may be useful for protein sequencing. For example, some aspects of the present disclosure are useful for determining amino acid sequence information from polypeptides (e.g., for sequencing one or more polypeptides). In some embodiments, amino acid sequence information can be determined for single polypeptide molecules. In some embodiments, one or more amino acids of a polypeptide are labeled (e.g., directly or indirectly) and the relative positions of the labeled amino acids in the polypeptide are determined. In some embodiments, the relative positions of amino acids in a protein are determined using a series of amino acid labeling and cleavage steps.

In some embodiments, the identity of a terminal amino acid (e.g., an N-terminal or a C-terminal amino acid) is assessed, after which the terminal amino acid is removed and the identity of the next amino acid at the terminus is assessed, and this process is repeated until a plurality of successive amino acids in the polypeptide are assessed. In some embodiments, assessing the identity of an amino acid comprises determining the type of amino acid that is present. In some embodiments, determining the type of amino acid comprises determining the actual amino acid identity, for example by determining which of the naturally-occurring 20 amino acids is the terminal amino acid is (e.g., using a recognition molecule that is specific for an individual terminal amino acid). However, in some embodiments assessing the identity of a terminal amino acid type can comprise determining a subset of potential amino acids that can be present at the terminus of the polypeptide. In some embodiments, this can be accomplished by determining that an amino acid is not one or more specific amino acids (and therefore could be any of the other amino acids). In some embodiments, this can be accomplished by determining which of a specified subset of amino acids (e.g., based on size, charge, hydrophobicity, binding properties) could be at the terminus of the polypeptide (e.g., using a recognition molecule that binds to a specified subset of two or more terminal amino acids).

Amino acids of a polypeptide can be indirectly labeled, for example, using amino acid recognition molecules that selectively bind one or more types of amino acids on the polypeptide. Amino acids of a polypeptide can be directly labeled, for example, by selectively modifying one or more types of amino acid side chains on the polypeptide with uniquely identifiable labels. Methods of selective labeling of amino acid side chains and details relating to the preparation and analysis of labeled polypeptides are known in the art (see, e.g., Swaminathan, et al. PLoS Comput Biol. 2015, 11(2):e1004080). Accordingly, in some embodiments, the one or more types of amino acids are identified by detecting binding of one or more amino acid recognition molecules that selectively bind the one or more types of amino acids. In some embodiments, the one or more types of amino acids are identified by detecting labeled polypeptide.

In some embodiments, the relative position of labeled amino acids in a protein can be determined without removing amino acids from the protein but by translocating a labeled protein through a pore (e.g., a protein channel) and detecting a signal (e.g., a Förster resonance energy transfer (FRET) signal) from the labeled amino acid(s) during translocation through the pore in order to determine the relative position of the labeled amino acids in the protein molecule.

As used herein, sequencing a polypeptide refers to determining sequence information for a polypeptide. In some embodiments, this can involve determining the identity of each sequential amino acid for a portion (or all) of the polypeptide. However, in some embodiments, this can involve assessing the identity of a subset of amino acids within the polypeptide (e.g., and determining the relative position of one or more amino acid types without determining the identity of each amino acid in the polypeptide). However, in some embodiments amino acid content information can be obtained from a polypeptide without directly determining the relative position of different types of amino acids in the polypeptide. The amino acid content alone may be used to infer the identity of the polypeptide that is present (e.g., by comparing the amino acid content to a database of polypeptide information and determining which polypeptide(s) have the same amino acid content).

In some embodiments, sequence information for a plurality of polypeptide products obtained from a longer polypeptide or protein (e.g., via enzymatic and/or chemical cleavage) can be analyzed to reconstruct or infer the sequence of the longer polypeptide or protein. Accordingly, some embodiments provide compositions and methods for sequencing a polypeptide by sequencing a plurality of fragments of the polypeptide. In some embodiments, sequencing a polypeptide comprises combining sequence information for a plurality of polypeptide fragments to identify and/or determine a sequence for the polypeptide. In some embodiments, combining sequence information may be performed by computer hardware and software. The methods described herein may allow for a set of related polypeptides, such as an entire proteome of an organism, to be sequenced. In some embodiments, a plurality of single molecule sequencing reactions may be performed in parallel (e.g., on a single chip). For example, in some embodiments, a plurality of single molecule sequencing reactions are each performed in separate sample wells on a single chip.

In some embodiments, methods provided herein may be used for the sequencing and identification of an individual protein in a sample comprising a complex mixture of proteins. Some embodiments provide methods of uniquely identifying an individual protein in a complex mixture of proteins. In some embodiments, an individual protein is detected in a mixed sample by determining a partial amino acid sequence of the protein. In some embodiments, the partial amino acid sequence of the protein is within a contiguous stretch of approximately 5 to 50 amino acids.

Without wishing to be bound by any particular theory, it is believed that most human proteins can be identified using incomplete sequence information with reference to proteomic databases. For example, simple modeling of the human proteome has shown that approximately 98% of proteins can be uniquely identified by detecting just four types of amino acids within a stretch of 6 to 40 amino acids (see, e.g., Swaminathan, et al. PLoS Comput Biol. 2015, 11(2):e1004080; and Yao, et al. Phys. Biol. 2015, 12(5): 055003). Therefore, a complex mixture of proteins can be degraded (e.g., chemically degraded, enzymatically degraded) into short polypeptide fragments of approximately 6 to 40 amino acids, and sequencing of this polypeptide library would reveal the identity and abundance of each of the proteins present in the original complex mixture. Compositions and methods for selective amino acid labeling and identifying polypeptides by determining partial sequence information are described in in detail in U.S. patent application Ser. No. 15/510,962, filed Sep. 15, 2015, titled "SINGLE MOLECULE PEPTIDE SEQUENCING," which is incorporated by reference in its entirety.

Sequencing in accordance with some embodiments can involve immobilizing a polypeptide on a surface of a substrate or solid support, such as a chip or integrated device. In some embodiments, a polypeptide can be immobilized on a surface of a sample well (e.g., on a bottom surface of a sample well) on a substrate. In some embodiments, a first terminus of a polypeptide is immobilized to a surface, and the other terminus is subjected to a sequencing reaction as described herein. For example, in some embodiments, a polypeptide is immobilized to a surface through a C-terminal end, and terminal amino acid recognition and degradation proceeds from an N-terminal end of the polypeptide toward the C-terminal end. In some embodiments, the N-terminal amino acid of the polypeptide is immobilized (e.g., attached to the surface). In some embodiments, the C-terminal amino acid of the polypeptide is immobilized (e.g., attached to the surface). In some embodiments, one or more non-terminal amino acids are immobilized (e.g., attached to the surface). The immobilized amino acid(s) can be attached using any suitable covalent or non-covalent linkage, for example as described herein. In some embodiments, a plurality of polypeptides are attached to a plurality of sample wells (e.g., with one polypeptide attached to a surface, for example a bottom surface, of each sample well), for example in an array of sample wells on a substrate.

Some aspects of the present disclosure provide a method of sequencing a polypeptide by detecting luminescence of a labeled polypeptide which is subjected to repeated cycles of terminal amino acid modification and cleavage. For example, FIG. 5-12 shows a method of sequencing a labeled polypeptide by Edman degradation in accordance with some embodiments. In some embodiments, the method generally proceeds as described herein for other methods of sequencing by Edman degradation. For example, in some embodiments, steps (1) and (2) shown in FIG. 5-12 may be performed as described elsewhere herein for terminal amino acid modification and terminal amino acid cleavage, respectively, in an Edman degradation reaction.

As shown in the example depicted in FIG. 5-12, in some embodiments, the method comprises a step of (1) modifying the terminal amino acid of a labeled polypeptide. As described elsewhere herein, in some embodiments, modifying comprises contacting the terminal amino acid with an isothiocyanate (e.g., PITC) to form an isothiocyanate-modified terminal amino acid. In some embodiments, an isothiocyanate modification 5-1210 converts the terminal amino acid to a form that is more susceptible to removal by a cleaving reagent (e.g., a chemical or enzymatic cleaving reagent, as described herein). Accordingly, in some embodiments, the method comprises a step of (2) removing the modified terminal amino acid using chemical or enzymatic means detailed elsewhere herein for Edman degradation.

In some embodiments, the method comprises repeating steps (1) through (2) for a plurality of cycles, during which luminescence of the labeled polypeptide is detected, and cleavage events corresponding to the removal of a labeled amino acid from the terminus may be detected as a decrease in detected signal. In some embodiments, no change in signal following step (2) as shown in FIG. 5-12 identifies an amino acid of unknown type. Accordingly, in some embodiments, partial sequence information may be determined by evaluating a signal detected following step (2) during each sequential round by assigning an amino acid type by a determined identity based on a change in detected signal or identifying an amino acid type as unknown based on no change in a detected signal.

Some aspects of the present disclosure provide methods of polypeptide sequencing in real-time by evaluating binding interactions of terminal amino acids with labeled amino acid recognition molecules and a labeled cleaving reagent (e.g., a labeled exopeptidase). FIG. 5-13 shows an example of a method of sequencing in which discrete binding events give rise to signal pulses of a signal output 5-1300. The inset panel of FIG. 5-13 illustrates a general scheme of real-time sequencing by this approach. As shown, a labeled amino acid recognition molecule 5-1310 selectively binds to and dissociates from a terminal amino acid (shown here as lysine), which gives rise to a series of pulses in signal output 5-1300 which may be used to identify the terminal amino acid. In some embodiments, the series of pulses provide a pulsing pattern which may be diagnostic of the identity of the corresponding terminal amino acid.

Without wishing to be bound by theory, labeled amino acid recognition molecule 5-1310 selectively binds according to a binding affinity (KD) defined by an association rate of binding (kon) and a dissociation rate of binding (koff). The rate constants koff and kon are the critical determinants of pulse duration (e.g., the time corresponding to a detectable binding event) and interpulse duration (e.g., the time between detectable binding events), respectively. In some embodiments, these rates can be engineered to achieve pulse durations and pulse rates that give the best sequencing accuracy.

As shown in the inset panel, a sequencing reaction mixture further comprises a labeled cleaving reagent 5-1320 comprising a detectable label that is different than that of labeled amino acid recognition molecule 5-1310. In some embodiments, labeled cleaving reagent 5-1320 is present in the mixture at a concentration that is less than that of labeled amino acid recognition molecule 5-1310. In some embodiments, labeled cleaving reagent 5-1320 displays broad specificity such that it cleaves most or all types of terminal amino acids.

As illustrated by the progress of signal output 5-1300, in some embodiments, terminal amino acid cleavage by labeled cleaving reagent 5-1320 gives rise to a uniquely identifiable signal pulse, and these events occur with lower frequency than the binding pulses of a labeled amino acid recognition molecule 5-1310. In this way, amino acids of a polypeptide can be counted and/or identified in a real-time sequencing process. As further illustrated in signal output 5-1300, in some embodiments, a labeled amino acid recognition molecule 5-1310 is engineered to bind more than one type of amino acid with different binding properties corresponding to each type, which produces uniquely identifiable pulsing patterns. In some embodiments, a plurality of labeled amino acid recognition molecules may be used, each with a diagnostic pulsing pattern which may be used to identify a corresponding terminal amino acid.

IX. Conclusion

Having thus described several aspects and embodiments of the technology of the present disclosure, it is to be appreciated that various alterations, modifications, and improvements will readily occur to those of ordinary skill in the art. Such alterations, modifications, and improvements are intended to be within the spirit and scope of the technology described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

The terms "approximately," "substantially," and "about" may be used to mean within ±20% of a target value and/or aspect in some embodiments, within ±10% of a target value in some embodiments, within ±5% of a target value in some embodiments, and yet within ±2% of a target value in some embodiments. The terms "approximately," "substantially," and "about" may include the target value.

What is claimed is:

1. An integrated circuit, comprising:
    a photodetection region;
    a charge storage region electrically coupled to the photodetection region and configured to receive charge carriers from the photodetection region;
    a readout region electrically coupled to the charge storage region and configured to receive charge carriers from the charge storage region;
    a drain region electrically coupled to the photodetection region and configured to receive charge carriers from the photodetection region and transfer the received charge carriers to a direct current (DC) voltage for draining the charge carriers from the photodetection region; and
    an at least partially opaque and at least partially insulative layer disposed above or below at least a portion of the photodetection region, the at least partially opaque and at least partially insulative layer having a triangular-shaped opening configured to receive dopants therethrough,
    wherein the photodetection region is configured to induce an intrinsic electric field in a first direction from the photodetection region to the drain region and from the photodetection region to the charge storage region.

2. The integrated circuit of claim 1, wherein the photodetection region comprises a dopant configuration that induces the intrinsic electric field.

3. The integrated circuit of claim 2, wherein the dopant configuration is configured to generate a potential gradient from the photodetection region to the drain region.

4. The integrated circuit of claim 3, wherein the dopant configuration is triangular-shaped.

5. The integrated circuit of claim 1, wherein dopant configuration is wider, in a second direction perpendicular to the first direction, at a first end than at a second end.

6. The integrated circuit of claim 5, wherein: the photodetection region is configured to receive incident light in a third direction perpendicular to each of the first direction and the second direction.

7. The integrated circuit of claim 5, wherein the dopant configuration is at least 75% wider, in the second direction, at the first end than at the second end.

8. The integrated circuit of claim 1, further comprising:
    a first transfer gate configured to receive a first control signal and, in response to the first control signal, charge carriers from the photodetection region to the drain region; and
    a second transfer gate configured to receive a second control signal and, in response to the second control signal, transfer charge carriers from the photodetection region to the charge storage region.

9. The integrated circuit of claim 1, wherein the drain region is configured to receive the DC voltage for discarding the charge carriers from the photodetection region.

10. The integrated circuit of claim 9, wherein the drain region is configured to discard, using the DC voltage, at least some of the charge carriers received from the photodetection region, the at least some of the charge carriers comprising excitation charge carriers generated in the photodetection region in response to excitation light received in the photodetection region.

11. The integrated circuit of claim 10, further comprising:
    a charge transfer channel, wherein the drain region is coupled to the photodetection region by the charge transfer channel; and
    a transfer gate electrically coupled to the charge transfer channel and configured to receive a control signal and, using the control signal, bias the charge transfer channel to transfer the at least some of the charge carriers from the photodetection region to the drain region for discarding.

12. A system, comprising:
    the integrated circuit of claim 1, further comprising a pixel that comprises the photodetection region, the charge storage region, the readout region, and the drain region; and
    a control circuit electrically coupled to and configured to operate the pixel to, in response to each of a plurality of pulses of excitation light that illuminate a sample:
    transfer, from the photodetection region to the drain region, charge carriers generated in the photodetection region in response to the photodetection region receiving the excitation light;
    aggregate, in the charge storage region, from each pulse of the excitation light, charge carriers generated in the photodetection region in response to the photodetection region receiving fluorescent light emitted by the sample; and
    transfer, from the charge storage region to the readout region, following the plurality of pulses of excitation light, the aggregated charge carriers.

13. The system of claim 12, further comprising a DC voltage source configured to provide the DC voltage for the drain region.

14. The integrated circuit of claim 1, further comprising:
    one or more reaction chambers configured to support a sample; and
    one or more waveguides configured to deliver excitation light to the sample to illuminate the sample,
    wherein the one or more waveguides are positioned, at least in part, between the one or more reaction chambers and the photodetection region.

15. The integrated circuit of claim 1, further comprising at least one drain layer positioned, in a second direction in which the photodetection region is configured to receive incident photons, after the photodetection region, wherein the at least one drain layer is configured to receive charge carriers via the photodetection region and provide the charge carriers to the DC voltage.

16. The integrated circuit of claim 1, further comprising:
    a transfer gate configured to control a transfer of charge carriers from the photodetection region to the charge storage region; and at least one semiconductor layer configured to attract and/or block at least some of the charge carriers, generated in the photodetection region, from leaving the photodetection region, wherein the photodetection region is positioned, in a second direction, after the transfer gate, and the at least one semiconductor layer is positioned, in the second direction, after the photodetection region.

17. The integrated circuit of claim 1, further comprising:
a collection layer positioned, in a second direction in which the photodetection region is configured to receive incident photons, after the photodetection region; and
a protection layer positioned, in the second direction, between the photodetection region and the collection layer,
wherein the photodetection region and the collection layer have a same conductivity type and the photodetection region and the protection layer have opposite conductivity types.

18. A method of manufacturing an integrated circuit, the method comprising:
forming a photodetection region of the integrated circuit; and
forming a charge storage region and/or a drain region of the integrated circuit, wherein the photodetection region is formed to induce an intrinsic electric field in a first direction from the photodetection region to the charge storage region and/or the drain region at least in part by:
depositing a mask on at least a portion of the photodetection region; and
removing at least a portion of the mask to create an opening having a first end and a second end,
wherein the first end is spaced from the second end in the first direction, and
wherein the opening is wider at the first end than at the second end.

19. The method of claim 18, further comprising doping the photodetection region through the opening.

20. The method of claim 16, wherein the opening has a triangular shape.

21. The method of claim 15, wherein the charge storage region and the drain region are formed on a same side of the photodetection region.

22. The method of claim 18, further comprising:
forming a transfer gate to control a transfer of charge carriers from the photodetection region to the charge storage region; and
forming at least one semiconductor layer to attract and/or block at least some of the charge carriers, generated in the photodetection region, from leaving the photodetection region,
wherein the photodetection region is positioned, in a second direction, after the transfer gate, and the at least one semiconductor layer is positioned, in the second direction, after the photodetection region.

23. The method of claim 18, further comprising:
forming a collection layer positioned, in a second direction in which the photodetection region is configured to receive incident photons, after the photodetection region; and
forming a protection layer positioned, in the second direction, between the photodetection region and the collection layer,
wherein the photodetection region and the collection layer are formed with a same conductivity type and the photodetection region and the protection layer are formed with opposite conductivity types.

24. An integrated circuit, comprising:
a first pixel comprising:
a first photodetection region;
a first charge storage region electrically coupled to the first photodetection region and configured to receive charge carriers from the first photodetection region;
a first readout region electrically coupled to the first charge storage region and configured to receive charge carriers from the first charge storage region; and
a first drain region electrically coupled to the first photodetection region and configured to receive charge carriers from the first photodetection region and transfer the received charge carriers to a direct current (DC) voltage for draining the charge carriers from the first photodetection region,
wherein the first photodetection region is configured to induce an intrinsic electric field in a first direction from the first photodetection region to the first drain region and from the first photodetection region to the first charge storage region; and
a second pixel comprising:
a second photodetection region;
a second charge storage region electrically coupled to the second photodetection region and configured to receive charge carriers from the second photodetection region;
a second readout region electrically coupled to the second charge storage region and configured to receive charge carriers from the second charge storage region; and
a second drain region electrically coupled to the second photodetection region and configured to receive charge carriers from the second photodetection region and transfer the received charge carriers to the DC voltage,
wherein:
the second photodetection region is configured to induce an intrinsic electric field in a second direction from the second photodetection region to the second drain region and from the second photodetection region to the second charge storage region;
the second direction is substantially opposite the first direction; and
the first and second pixels are positioned one after another in one of the first and second directions.

25. The integrated circuit of claim 24, wherein:
the first drain region and/or the first charge storage region of the first pixel is positioned after the first photodetection region in the first direction; and
the second drain region and/or the second charge storage region is positioned after the second photodetection region in the second direction.

26. The integrated circuit of claim 24, further comprising at least one drain layer positioned, in a third direction in which the first photodetection region is configured to receive incident photons, after the first photodetection region, wherein the at least one drain layer is configured to receive charge carriers via the first photodetection region and provide the charge carriers to the DC voltage.

27. The integrated circuit of claim 24, wherein the first pixel further comprises:
- a first transfer gate configured to control a transfer of charge carriers from the first photodetection region to the first charge storage region; and
- at least one semiconductor layer configured to attract and/or block at least some of the charge carriers, generated in the first photodetection region, from leaving the first photodetection region,
- wherein the first photodetection region is positioned, in a third direction, after the first transfer gate, and the at least one semiconductor layer is positioned, in the third direction, after the first photodetection region.

28. The integrated circuit of claim 24, further comprising:
- a first collection layer positioned, in a third direction in which the first photodetection region is configured to receive incident photons, after the first photodetection region; and
- a first protection layer positioned, in the third direction, between the first photodetection region and the first collection layer,
- wherein the first photodetection region and the first collection layer have a same conductivity type and the first photodetection region and the first protection layer have opposite conductivity types.

* * * * *